(12) United States Patent
Dewalch et al.

(10) Patent No.: US 10,822,835 B2
(45) Date of Patent: Nov. 3, 2020

(54) ELECTRONIC LOCKING APPARATUS AND METHOD

(71) Applicant: Dewalch Technologies, Inc., Houston, TX (US)

(72) Inventors: Norman Binz Dewalch, Houston, TX (US); Aditya Kumar Palthi, Houston, TX (US); Tyler Dean Todd, II, Houston, TX (US)

(73) Assignee: DeWalch Technologies, Inc., Houston, TX (US)

( * ) Notice: Subject to any disclaimer, the term of this patent is extended or adjusted under 35 U.S.C. 154(b) by 0 days.

(21) Appl. No.: 13/835,838

(22) Filed: Mar. 15, 2013

(65) Prior Publication Data

US 2014/0260456 A1 Sep. 18, 2014

(51) Int. Cl.
| | |
|---|---|
| *E05B 47/00* | (2006.01) |
| *E05B 65/00* | (2006.01) |
| *E05B 67/36* | (2006.01) |
| *G01R 22/06* | (2006.01) |

(52) U.S. Cl.
CPC ...... *E05B 47/0009* (2013.01); *E05B 65/0089* (2013.01); *E05B 67/365* (2013.01); *G01R 22/066* (2013.01); *Y10T 70/7136* (2015.04)

(58) Field of Classification Search
CPC ............. E05B 51/0005; E05B 47/0011; E05B 47/0009; E05B 47/0012; E05B 47/0004; E05B 65/0089; E05B 67/36; E05B 67/365; Y10T 70/7062; Y10T 70/443; Y10T 70/7136; G07C 9/00896; G07C 9/00944; G07C 9/00; G07C 2009/00761; G01R 11/24; G01R 22/06

USPC ..... 70/34, 164, 386, 276, 277, 278.2, 278.3, 70/278.7, 279.1, 280–282, 283.1
See application file for complete search history.

(56) References Cited

U.S. PATENT DOCUMENTS

| | | | |
|---|---|---|---|
| 3,753,316 A | | 8/1973 | Savarieau et al. |
| 4,637,234 A | * | 1/1987 | Mielonen .......................... 70/34 |
| 4,712,398 A | | 12/1987 | Clarkson et al. |
| 4,742,703 A | | 5/1988 | DeWalch et al. |

(Continued)

FOREIGN PATENT DOCUMENTS

| | | |
|---|---|---|
| DE | 102009005322 | 7/2010 |
| EP | 1059387 | 12/2000 |

(Continued)

OTHER PUBLICATIONS

E-mail/Letter from Applicant dated Sep. 10, 2015 requesting Foreign Counsel tile a Canadian National Phase patent application corresponding to PCT International Phase Application No. PCT/US2013/03221 filed Mar. 15, 2013 (4 pages).

(Continued)

*Primary Examiner* — Lloyd A Gall
(74) *Attorney, Agent, or Firm* — DeWalch Technologies, Inc.

(57) ABSTRACT

An electronic locking mechanism has a body portion with movable retaining members that are controlled utilizing an electrically controlled actuator. The actuator operates the retaining member to move radially outwardly of the body portion circumference in a locked position and allows the retaining member to move radially inwardly of the circumference in an unlocked position. An electronic key can be utilized to operate the electronic locking mechanism.

21 Claims, 58 Drawing Sheets

(56) References Cited

U.S. PATENT DOCUMENTS

| | | | | |
|---|---|---|---|---|
| 4,807,454 | A * | 2/1989 | Sengupta et al. | 70/277 |
| 5,351,042 | A | 9/1994 | Aston | |
| 5,542,273 | A * | 8/1996 | Bednarz | 70/34 |
| 5,611,223 | A * | 3/1997 | Spitzer | 70/58 |
| 5,791,176 | A * | 8/1998 | Montesinos Alonso | 70/277 |
| 5,977,858 | A | 11/1999 | Morgen et al. | |
| 6,000,609 | A | 12/1999 | Gokcebay et al. | |
| 6,008,992 | A | 12/1999 | Kwakami | |
| 6,073,469 | A | 6/2000 | Julien | |
| 6,125,673 | A * | 10/2000 | Luker | 70/276 |
| 6,310,411 | B1 * | 10/2001 | Viallet | 307/125 |
| 6,442,983 | B1 * | 9/2002 | Thomas et al. | 70/38 A |
| 6,474,122 | B2 | 11/2002 | Davis | |
| 6,564,600 | B1 | 5/2003 | Davis | |
| 6,574,958 | B1 | 6/2003 | MacGregor | |
| 6,604,394 | B2 | 8/2003 | Davis | |
| 6,615,623 | B1 | 9/2003 | Ormerod et al. | |
| 6,615,625 | B2 | 9/2003 | Davis | |
| 6,750,568 | B2 * | 6/2004 | Ohara | 307/143 |
| 6,895,792 | B2 * | 5/2005 | Davis | 70/278.3 |
| 7,000,441 | B2 * | 2/2006 | Sutton et al. | 70/276 |
| 7,125,058 | B2 * | 10/2006 | Hawthorne | 294/82.28 |
| 7,380,843 | B2 * | 6/2008 | Alacqua et al. | 292/163 |
| 7,406,846 | B2 | 8/2008 | Chu | |
| 7,690,231 | B1 | 4/2010 | Field et al. | |
| 8,234,894 | B2 * | 8/2012 | Taniguchi et al. | 70/186 |
| 8,256,254 | B2 * | 9/2012 | Bellamy | 70/278.7 |
| 8,276,414 | B2 * | 10/2012 | Luo | 70/278.7 |
| 2004/0035687 | A1 | 2/2004 | Von Behrens et al. | |
| 2005/0252260 | A1 * | 11/2005 | Chu | 70/262 |
| 2007/0044523 | A1 | 3/2007 | Davis | |
| 2008/0066507 | A1 | 3/2008 | Trempala et al. | |
| 2009/0013736 | A1 * | 1/2009 | Voosen | 70/277 |
| 2009/0255303 | A1 * | 10/2009 | Stobbe et al. | 70/276 |
| 2010/0236306 | A1 * | 9/2010 | Trempala et al. | 70/263 |
| 2011/0277520 | A1 * | 11/2011 | Nunuparov | 70/276 |
| 2012/0011902 | A1 * | 1/2012 | Meekma | 70/25 |
| 2012/0167369 | A1 | 7/2012 | Holcomb et al. | |
| 2012/0210757 | A1 * | 8/2012 | Gentile | 70/276 |
| 2012/0291501 | A1 * | 11/2012 | Gentile et al. | 70/276 |
| 2014/0130316 | A1 | 5/2014 | Rudduck et al. | |

FOREIGN PATENT DOCUMENTS

| | | |
|---|---|---|
| WO | WO1999016990 | 4/1999 |
| WO | WO2011119776 | 9/2011 |

OTHER PUBLICATIONS

E-mail/Letter from Foreign Counsel dated Sep. 15, 2015 confirming that the Canadian National Phase patent application corresponding to PCT International Phase Application No. PCT/US2013/03221 filed Mar. 15, 2013, was filed Sep. 15, 2015 (6 pages).
E-mail/Letter from Applicant dated Sep. 10, 2015 requesting Foreign Counsel file a Mexican National Phase patent application corresponding to PCT International Phase Application No. PCT/US2013/03221 filed Mar. 15, 2013 (3 pages).
E-mail/Letter from Foreign Counsel dated Sep. 15, 2015 confirming that the Mexican National Phase patent application corresponding to PCT International Phase Application No. PCT/US2013/03221 filed Mar. 15, 2013, was filed Sep. 15, 2015 (9 pages).
Ad/Brochure/etc.—DYNALLOY, Inc., Technical Characteristics of FLEXINOL® Actuator Wires (12 pages).*—*(No admission is being made regarding applicability, relevancy, materiality or otherwise and as per IDS Statement Submitted herewith).
Ad/Brochure/etc.—AsiaLink / Access Star, Material Sheet (1 page).*—*(No admission is being made regarding applicability, relevancy, materiality or otherwise and as per IDS Statement Submitted herewith).
Image File Wrapper from Pair for related application No. 13/835,563 filed Nov. 28, 2017 (2 pages).

In above-referenced case, Office Action dated Feb. 27, 2014 including Notice of Cited References in connection with U.S. Appl. No. 13/835,563 (16 pages).
Office Action Response dated Aug. 27, 2014 in connection with U.S. Appl. No. 13/835,563 (251 pages).
Notice of Non-Compliant Amendment dated Dec. 9, 2014 in connection with U.S. Appl. No. 13/835,563 (4 pages).
Response to Notice of Non-Compliant Amendment dated Jun. 9, 2015 in connection with U.S Appl. No. 13/835,563 (55 pages).
Final Office Action dated Sep 30, 2015 including Notice of Cited References in connection with U.S. Appl. No. 13/835,563 (59 pages).
RCE with Final Office Action Response dated Mar. 30, 2016 in connection with U.S. Appl, No. 13/835,563 (22 pages).
Office Action dated Aug. 5, 2016 in connection with U.S. Appl. No. 13/835,563 (16 pages),.
Office Action Response dated Feb. 6, 2017 in connection with U.S. Appl. No. 13/835,563 (26 pages).
Final Office Action dated May 11, 2017 including Notice of Cited References in connection with U.S. Appl. No. 13/835,563 (22 pages).
RCE-Final Office Action Response dated Feb. 26, 2018 in connection with U.S. Appl. No. 13/835,563 (36 pages).
Office Action dated Jun. 22, 2018 including Notice of Cited References in connection with U.S. Appl. No. 13/835,563 (16 pages).
Applicant's Amendment dated Dec. 24, 2018 in connection with U.S. Appl. No. 13/835,563 (27 pages).
Final Rejection dated Apr. 26, 2019 in connection with U.S. Appl. No. 13/835,563 (12 pages).
Related U.S. Appl. No. 13/835,348 filed Mar. 15, 2013(3 pages).
Office Action dated Feb. 27, 2014 including Notice of Cited References in connection with U.S. Appl. No. 13/835,348(19 pages).
Office Action Response dated Aug. 27, 2014 in connection with U.S. Appl. No. 13/835,348(247 pages).
Notice of Non-Compliant Amendment dated Dec. 9, 2014 in connection with U.S. Appl. No. 13/835,348 (4 pages).
Response to Notice of Non-Compliant Amendment dated Jun. 9, 2015 in connection with U.S Appl. No. 13/835,348(55 pages).
Final Office Action dated Sep. 30, 2015 including Notice of Cited References in connection with U.S. Appl. No. 13/835,348 (59 pages).
RCE with Final Office Action Response dated Mar. 30, 2016 in connection with U.S. Appl. No. 13/835,348 (22 pages).
Office Action dated Aug. 5, 2016 in connection with U.S. Appl. No. 13/835,348 (16 pages).
Office Action Response dated Feb. 6, 2017 in connection with U.S. Appl. No. 13/835,348 (26 pages).
Final Offfice Action dated May 9, 2017 including Notice of Cited References in connection with U.S. Appl. No. 13/835,348 (18 pages).
RCE-Final Office Action Response dated Feb. 26, 2018 in connection with U.S. Appl. No. 13/835,348 (36 pages).
Office Action dated Office Action dated Jun. 22, 2018 including Notice of Cited References in connection with U.S. Appl. No. 13/835,348 (16 pages).
Applicants Response to Office Action with Amendment and Extension dated Dec. 24, 2018 in connection with U.S. Appl. No. 13/835,348 (27pages).
Final Rejection dated Apr. 26, 2019 in connection with U.S. Appl. No. 13/835,348 (12 pages).
Ad/Brochure/etc.—Dynalloy, Inc.—Flexible Solutions—Flexinol® Actuator Ribbon (©2012) (1 page).*—*(No admission is being made regarding applicability, relevancy, materiality or otherwise and as per IDS Statement Submitted herewith).
Ad/Brochure/etc.—Google Search—Vending Machine Lock (visited Mar. 10, 2013) (16 pages) and (visited Nov. 30, 2017 only with respect to Mar. 10, 2013 items shown and due to Mar. 10, 2013 pp. being truncated) (5 pages).*—*(No admission is being made regarding applicability, relevancy, materiality or otherwise and as per Ids Statement Submitted herewith).
Ad/Brochure/etc.—Nanotechnology, Inc.—Finger Print Doorlock (visited Mar. 8, 2013) (1 page).*—*(No admission is being made

(56) References Cited

OTHER PUBLICATIONS regarding applicability, relevancy, materiality or otherwise and as per Ids Statement Submitted herewith).
Ad/Brochure/etc.—Videx—CyberLock—A Complete Access Control System in Every Core Lock (©2011) (16 pages).*—* (No admission is being made regarding applicability, relevancy, materiality or otherwise and as per IDS Statement Submitted herewith).

* cited by examiner

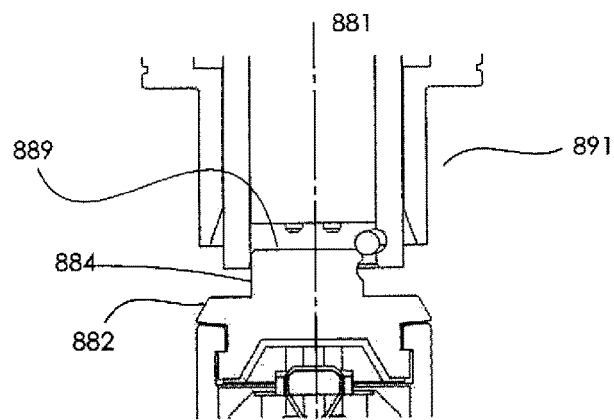
FIG. 36c1
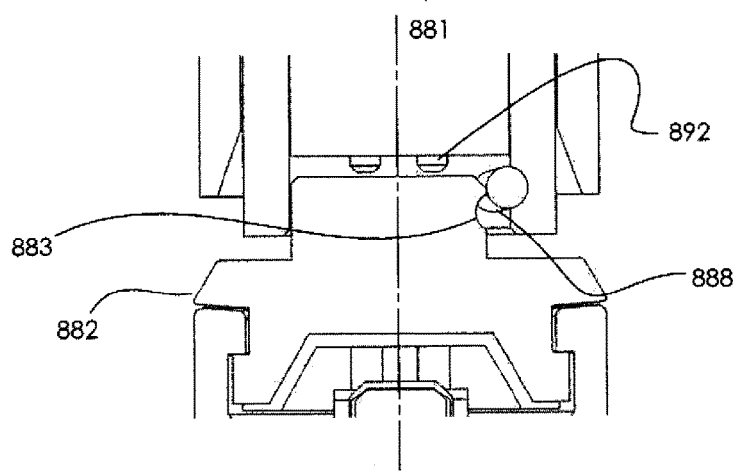
FIG. 36c2
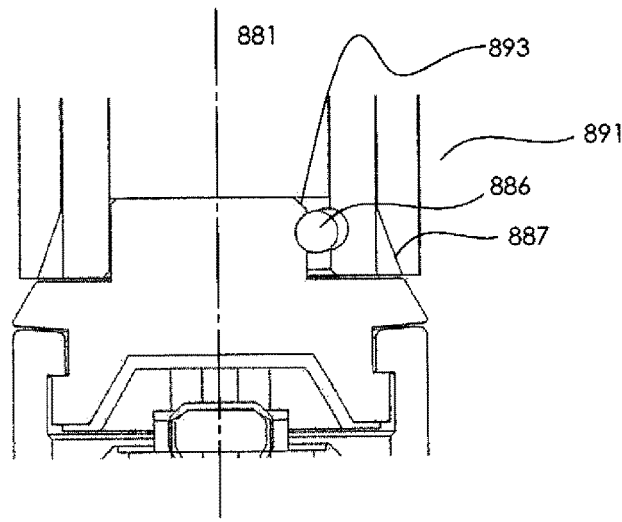
FIG. 36c3

ELECTRONIC LOCKING APPARATUS AND METHOD

BACKGROUND OF THE INVENTION

(1) Field of the Invention

The present invention relates generally to electronic locking mechanisms and in a more specific embodiment to a barrel lock with an electronic locking mechanism.

(2) Description of the Prior Art

Electrical service providers generally deliver electricity to their customers via power lines buried underground or distributed along poles or towers overhead. The provider's power lines are usually distributed from a power generation station to numerous sets of customer lines, so that customers can then use the power to satisfy their various electrical needs. To measure delivered power so that customers can be billed in proportion to their usage, service providers typically terminate their power lines at a customer's home or business facility through a metered socket box, various designs for which are well known.

Barrel locks have been used for many years to secure utility metering devices and service. Utilities have an ongoing requirement to secure their meters and service to prevent theft, vandalism and protect the public from coming into contact with dangerous voltages or situations. The barrel lock was originally developed to secure gas valves at a customer's point of service. U.S. Pat. No. 3,560,130 shows an example of a barrel lock used for such purpose. As electricity costs have risen, so has the need to secure electricity meters and other utility equipment. Locking hardware has been developed to secure other utility assets such as electricity meters and enclosures. Since utilities have many installations over a large service area there is a need to limit the variety of locks in the field since the proper key must be used for each type of lock in the field. Utilities have thus preferred to standardize on as few lock types as necessary. The since the barrel lock was one of the original types of locks in use in the field, there have been numerous devices developed that use the barrel lock to secure a wide variety of applications other than just gas valves. The barrel lock has had many improvements made that offer better security and reliability but have still maintained the basic external geometry to ensure compatibility with the large base of installed hardware.

U.S. Pat. No. 4,742,703, which is incorporated herein by reference, shows one such example of an improved barrel lock, having an improved locking mechanism yet still maintaining a compatible external geometry for broad compatibility with the hardware in use by utilities. U.S. Pat. No. 5,542,722, which is incorporated herein by reference, shows an example of a locking ring used with a barrel lock to secure an electricity meter. U.S. Pat. No. 5,870,911 shows an example of an enclosure lock for use with a barrel lock to secure an electricity meter enclosure. U.S. Pat. No. 5,960,653, which is incorporated herein by reference, shows an example of an adjustable closure lock for use with a barrel lock to secure the lid of a meter enclosure box. The forgoing examples are just a few examples of hardware developed to use a barrel lock. There are many other examples of hardware specifically designed to use barrel locks and are well known by those skilled in the art.

In existing mechanical locks and keys, the physical dimensions of various mechanical parts, the ability of the keys to open the locks is typically determined at the time of manufacture. Most such locks involve a plurality of tumblers, typically in the form of rotating discs, sliding rods, or tilting levers. The corresponding keys have related physical protuberances. When the key is presented to the lock, by pressing, inserting, rotating, and the like, the key pushes against the lock's tumblers and physically move them through angular or linear displacements. If the collection of such displacements matches the requirements of the lock, then the movement of the tumblers results in alignment of all tumblers in such a way that the lock is released to be unlocked. Such alignment may, for example, be the alignment of the ends of rod-like tumblers to a common plane or rotation of disc-like tumblers so that a hole or slot in each is aligned at a common angular position.

In the electric meter industry, control of keys utilized for unlocking barrel locks that secure the meter boxes and/or the meters within the meter boxes presents a number of problems. Access to the meter boxes provides access to electricity without the meter being able to register the amount of electricity being utilized. Keys can be lost or stolen or sold, requiring replacement or rekeying of the barrel lock and a temporary loss of control over the meter. If a key fits many locks, then it becomes expensive to rekey or replace the locks.

Mechanical locks are subject to being manipulated or "picked" by unauthorized users with the necessary tools and skills. The tools are typically inexpensive and the skills for manipulating locks are widely known and available to the public.

Because of the finite precision of mechanical devices and the necessity of tolerating manufacturing variation as well as dimensional changes from wear, mechanical locks can only be made with a limited number of codes, depending on the design, typically on the order of tens of thousands and almost never exceeding one million. If a system of locks requires more locks than this number, then it is inevitable that some keys will fit more than one lock.

In a system of locks and keys it can be desirable to assign the locks to groups. In present mechanical systems, it is more difficult to make a lock which can respond to more than a small number of different keys. Making a lock respond to more keys makes it easier for an unauthorized person to defeat the lock. The keys and locks in themselves do not provide any record of operation. Therefore, accountability for use of the keys is limited to records produced by the service technicians, which may be incomplete and do not account for many problems that can occur.

The prior art does not show the features of the present invention that provides greater control over keys and barrel locks without necessarily requiring replacement of barrel locks in the event keys are lost and greatly reduces the likelihood of loss of control of the meter when a key is lost or stolen. Accordingly, those of skill in the art will appreciate the present invention which addresses the above discussed problems.

SUMMARY OF THE INVENTION

Accordingly, it is an object of the present invention to provide an improved barrel lock.

Another possible object of the present invention is to provide a barrel lock with an electronically controlled actuator.

Accordingly, the present invention provides a barrel lock may comprise a body portion has a longitudinal axis. The body portion comprises a generally cylindrical head portion and a generally cylindrical shank portion. The shank portion has a smaller diameter than the head portion.

A movable retaining member is radially extensible and retractable relative to the longitudinal axis.

An electrically controlled actuator has an opened position and a locked position. The actuator maintains at least partial radial extension of the retaining member when in the locked position and allows radial retraction of the retaining member when in the opened position.

A control circuit is in electrical communication with the actuator, the control circuit capable of receiving a signal from a key and providing an electrical signal to the actuator when the proper signal is received by the control circuit from the key wherein the head portion comprises the control circuit.

The invention is used in combination with locking hardware and may comprise an aperture for receiving the shank portion and wherein the locking hardware is locked when the actuator is in the locked position.

The electrically controlled actuator can comprise a shape memory alloy, a solenoid, a piezoelectric actuator, a motor, a screw, a spur gear speed reducer, a planetary gear speed reducer. In one embodiment, the screw is driven by an electric motor in communication with the control circuit.

The head portion can define an axial direction and a radial direction. The head portion may comprise an interface for a key may comprise a recess formed generally in the radial direction of the key interface for gripping of the lock by a key.

In one embodiment, the electrically controlled actuator is changed between the locked position to the opened position by rotating relative to the retaining member. In another embodiment, the electrically controlled actuator is changed between the locked position to the opened position by moving linearly relative to the retaining member. The invention may further comprise a retaining member extender in the shank operable for moving the retaining member between the opened position and the closed position. The retaining members may or may not be biased by a spring.

BRIEF DESCRIPTION OF THE DRAWINGS

The drawings constitute a part of this specification and include exemplary embodiments to the invention, which may be embodied in various forms. It is to be understood that in some instances various aspects of the invention may be shown exaggerated or enlarged to facilitate an understanding of the invention.

FIG. 36c1 is an elevational view, in cross section, of a moveable bar interface of key and lock at start of engagement process in accord with one possible embodiment of the invention.

FIG. 36c2 is an elevational view, in cross section, of a moveable bar interface of key and lock at middle of engagement process in accord with one possible embodiment of the invention.

FIG. 36c3 is an elevational view, in cross section, of a moveable bar interface of key and lock at end of engagement process in accord with one possible embodiment of the invention.

DETAILED DESCRIPTION OF THE INVENTION

Detailed descriptions of the preferred embodiment are provided herein. It is to be understood, however, that the present invention may be embodied in various forms. Therefore, specific details disclosed herein are not to be interpreted as limiting, but rather as a basis for the claims and as a representative basis for teaching one skilled in the art to employ the present invention in virtually any appropriately detailed system, structure or manner.

Figure 1:
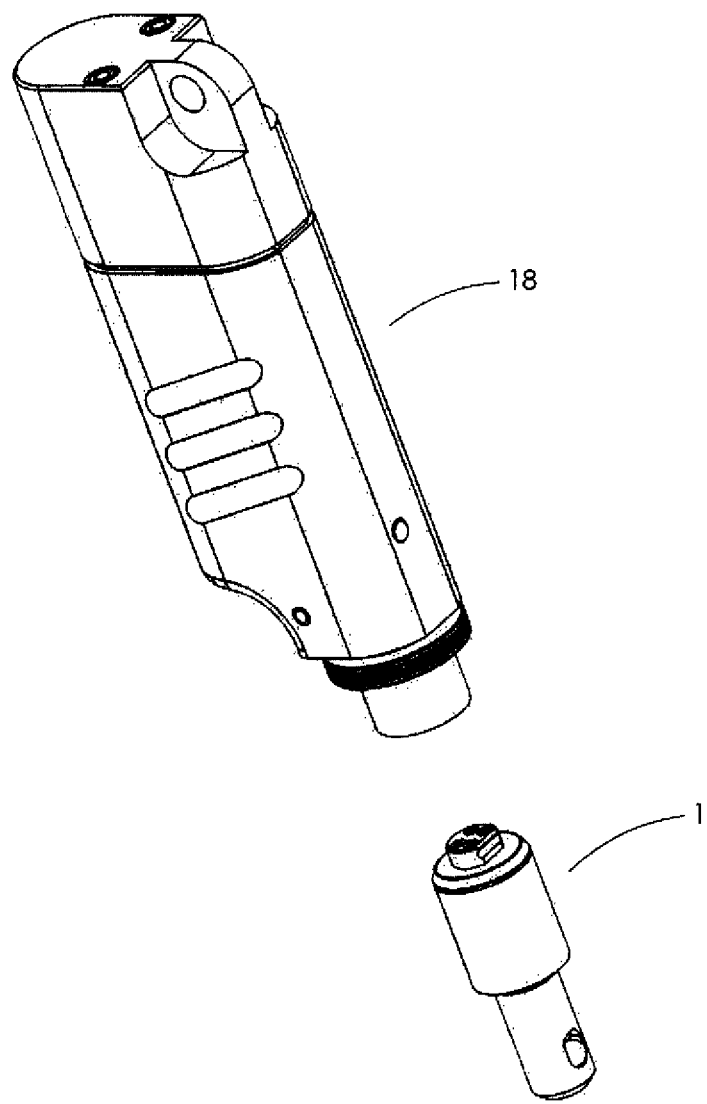
FIG. 1 is a perspective view of an electronic key and corresponding electronic barrel lock in accord with one possible embodiment of the present invention.
Figure 2:
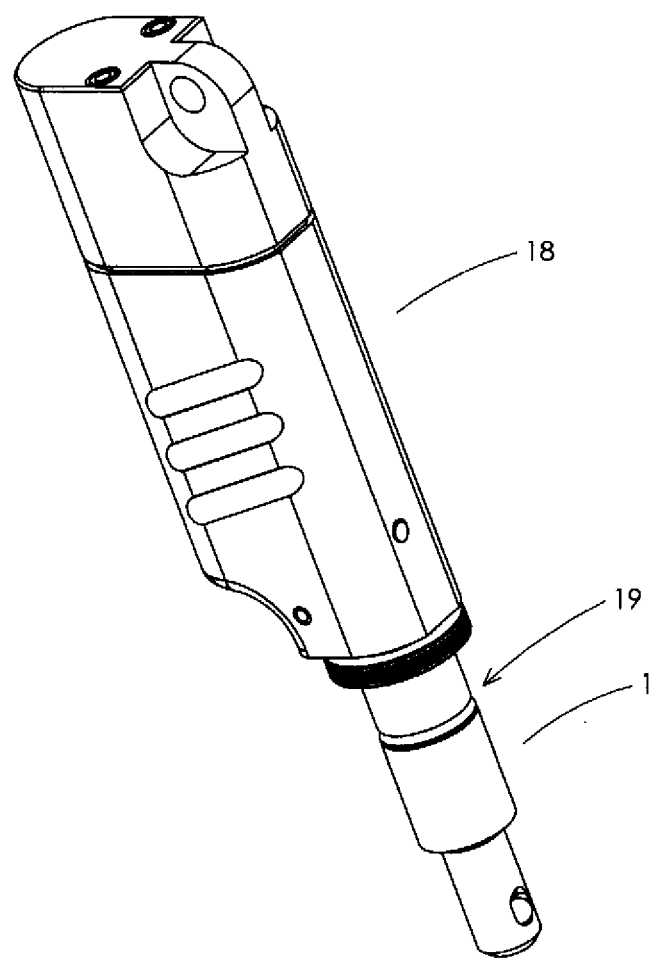
FIG. 2 is a perspective view of an electronic key engaged with corresponding electronic barrel lock for operation in accord with one possible embodiment of the present invention.
Figure 3A:
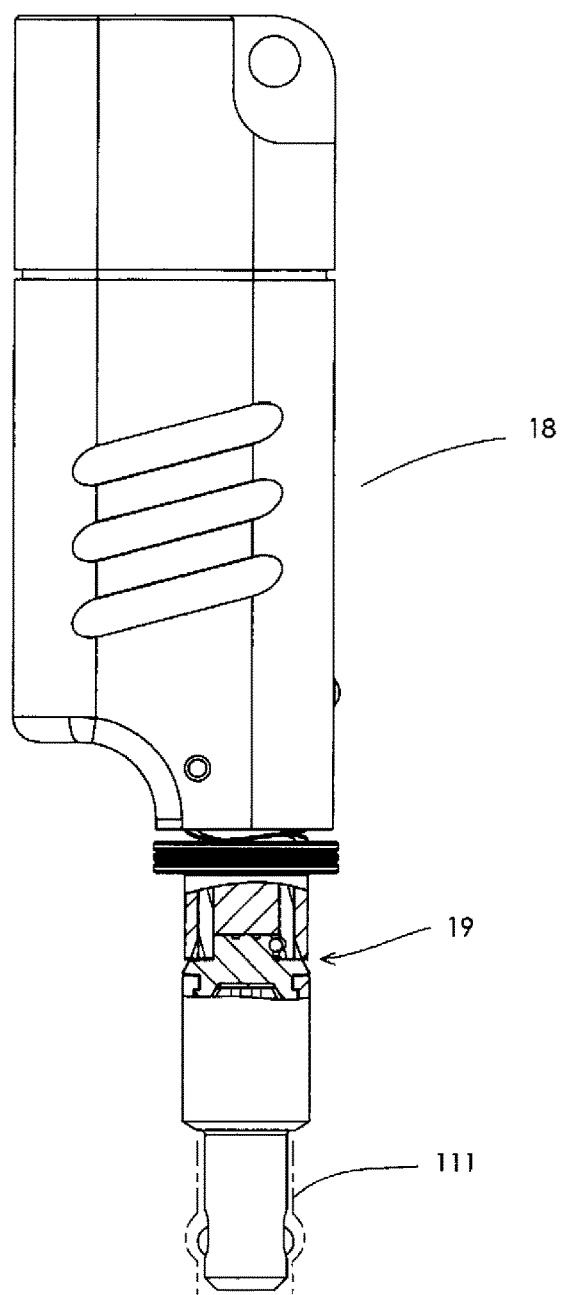
FIG. 3a is an elevational view, partially in section, of an electronic key engaged with corresponding electronic barrel lock for operation in accord with one possible embodiment of the present invention.
Figure 3B:
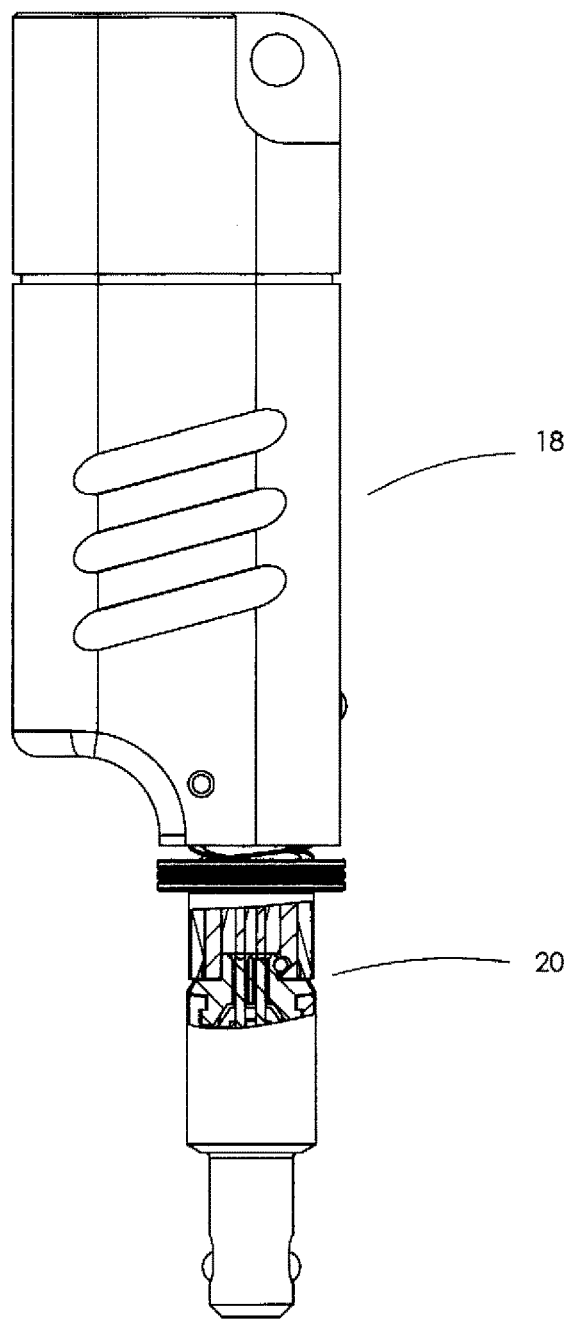
FIG. 3b is an elevational view, partially in section, of an electronic key with contact pins engaged with corresponding electronic barrel lock contact pins for operation in accord with one possible embodiment of the present invention.
Figure 4:
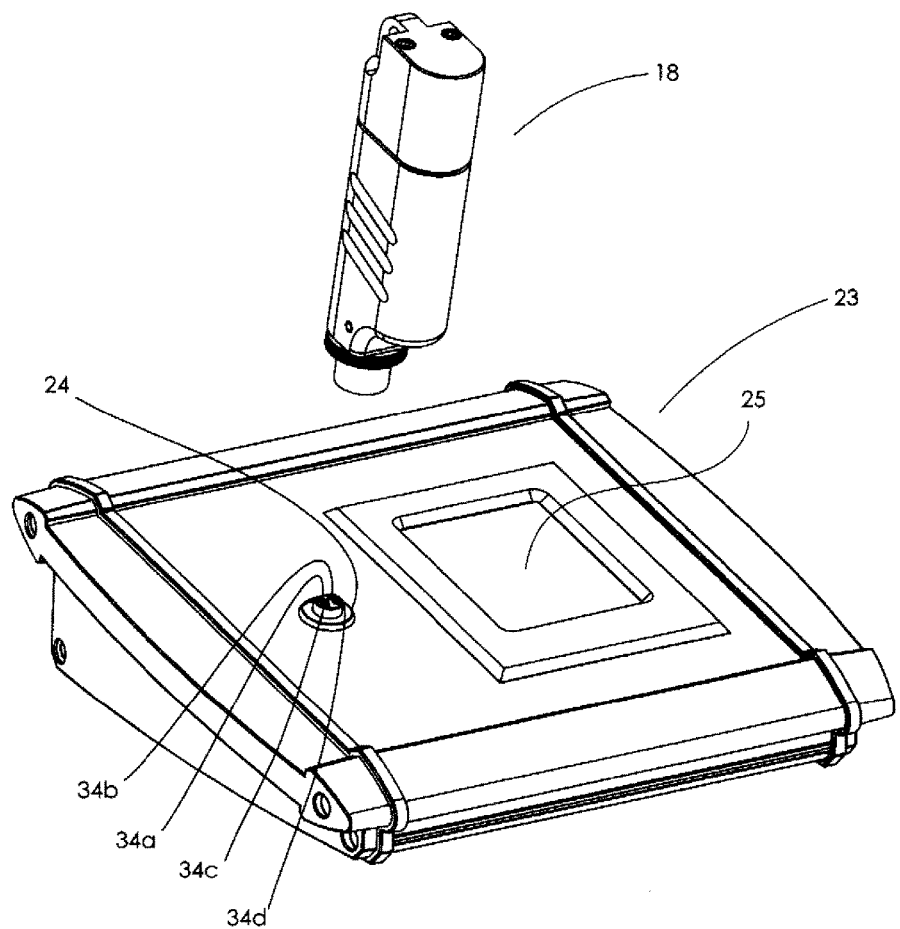
FIG. 4 is a perspective view of an electronic key for use with a corresponding authorizer in accord with one possible embodiment of the present invention.
Figure 5:
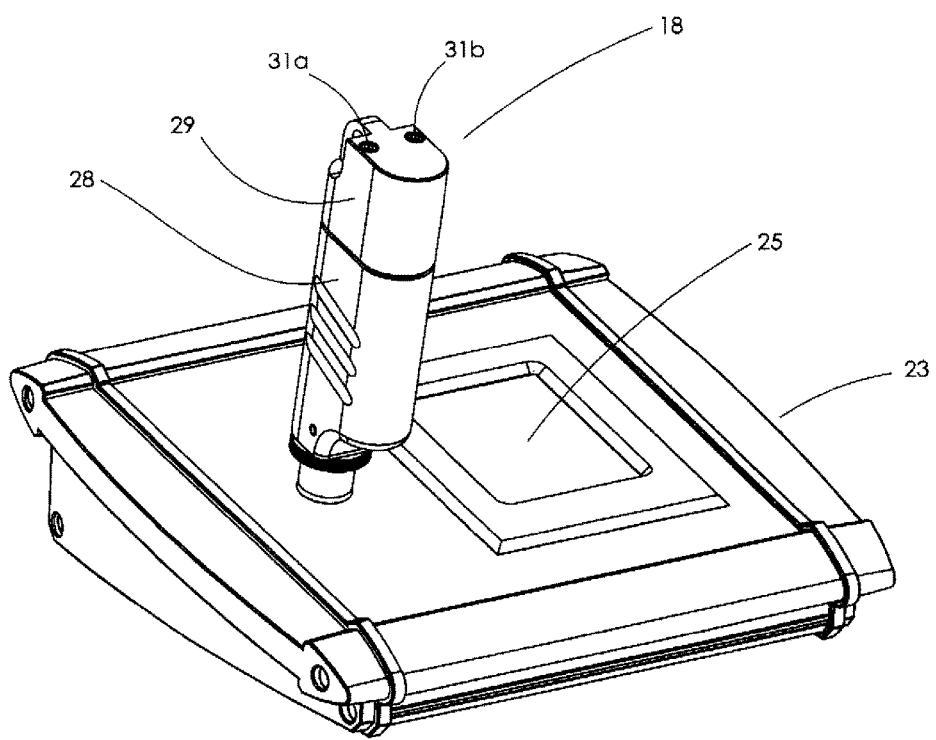
FIG. 5 is a perspective view of an electronic key engaged for use with a corresponding authorizer in accord with one possible embodiment of the present invention.

Turning now descriptively to the drawings, in which similar reference characters denote similar elements throughout the several views, the attached figures illustrate an apparatus for an electronic barrel lock, a key and an authorizer as well as a method of operation of the same. FIG. 1 shows an example embodiment barrel lock 1 and a key 18. FIG. 2, FIG. 3*a*, and FIG. 3*b* show an example embodiment barrel lock 1 and key 18 engaged generally at 19 and being ready for opening. Item 111 represents an aperture in locking hardware, which physically mates to the lock in a manner that allows the hardware be locked. Locking hardware is discussed in more detail herein and various electrical box and flange locking hardware examples are given or referenced herein. FIG. 4 shows an example embodiment key 18 and authorizer 23. The key is engaged with the authorizing port 24 as shown in FIG. 5. Display 25 presents relevant information to the user during the authorization process.

Figure 6:
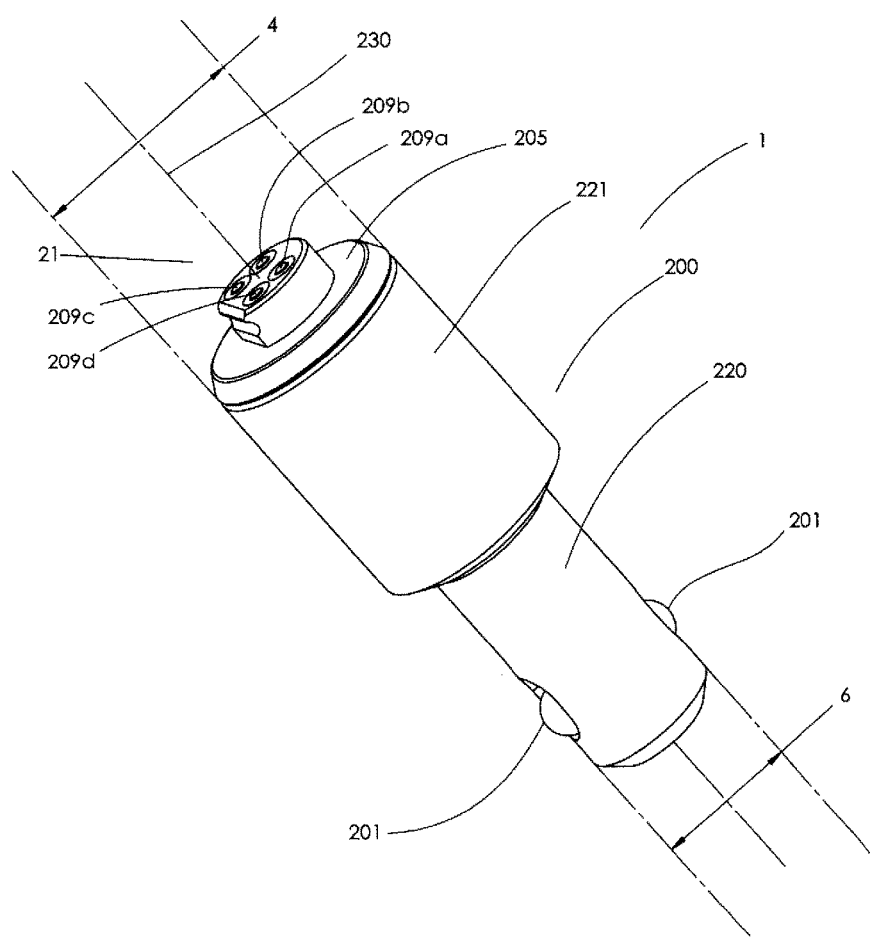
FIG. 6 is a perspective view of an electronic barrel lock in accord with one possible embodiment of the present invention.
Figure 7:
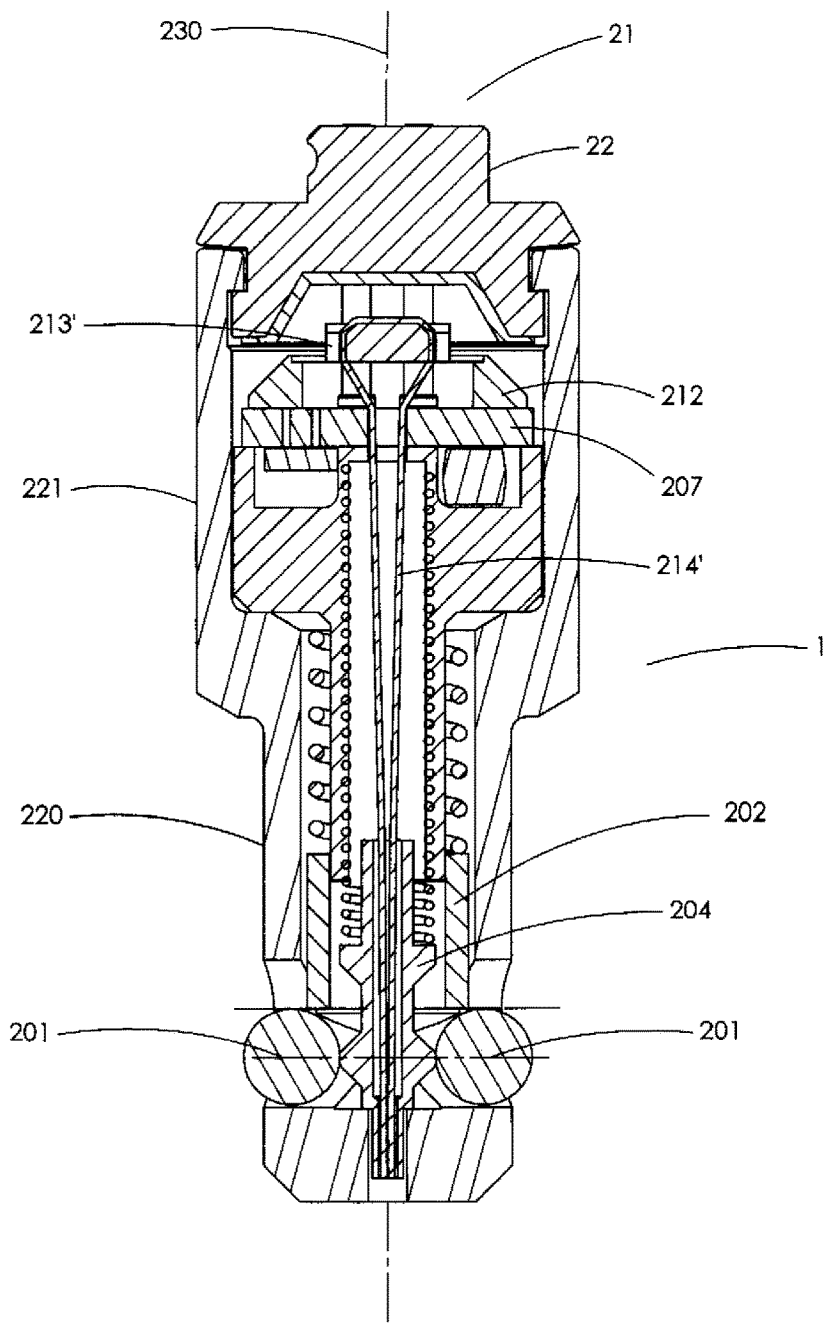
FIG. 7 is an elevational view, in cross-section, of a lock embodiment with a shape memory alloy (SMA) actuator in the locked configuration in accord with one possible embodiment of the present invention.
Figure 8:
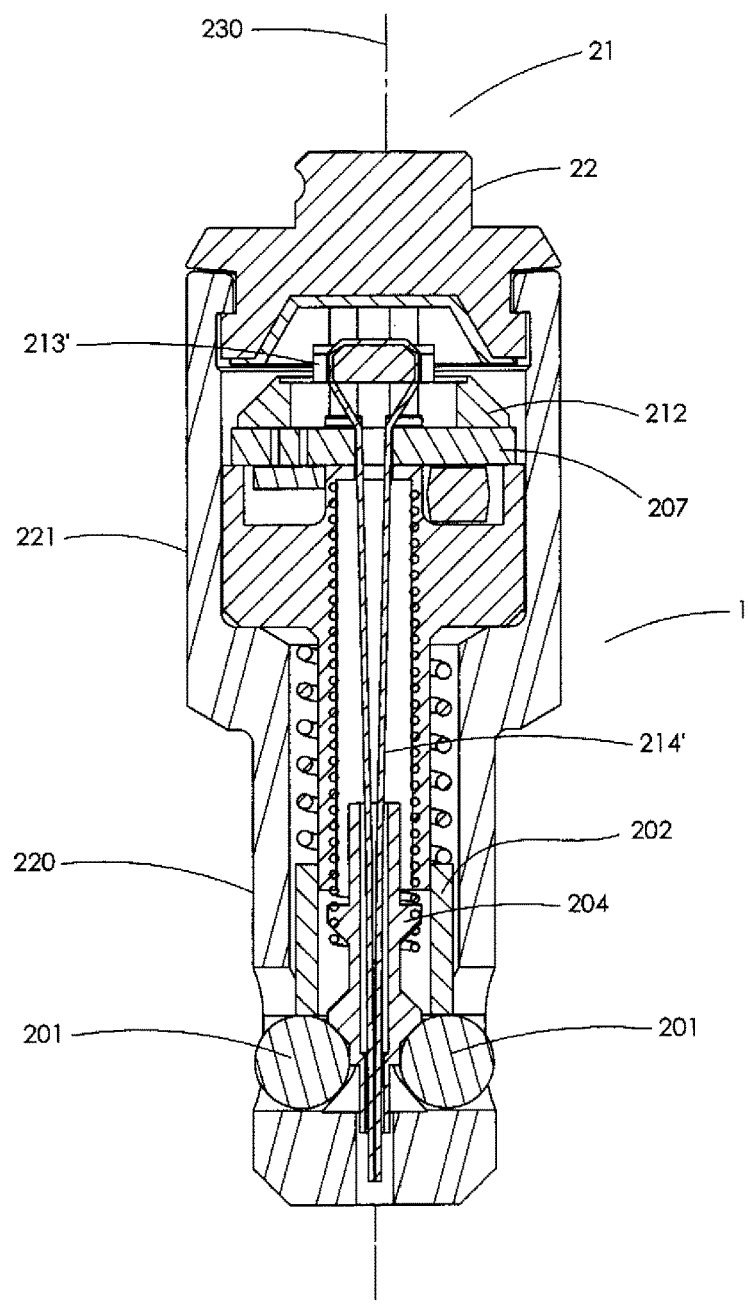
FIG. 8 is an elevational view, in cross-section, of a lock embodiment with a shape memory alloy (SMA) actuator in the unlocked configuration in accord with one possible embodiment of the present invention.

FIG. 6 shows an example embodiment barrel lock generally at 1. The barrel lock comprises a longitudinal axis 230, a head portion 221 having a radial extent, in the current embodiment, defined by the outside diameter 4 of the head portion and a shank portion 220 having a radial extent, in one possible embodiment, defined by the outside diameter 6 of the shank portion. The radial extent 6 of the shank portion 220 is smaller than the radial extent 4 of the head portion 221. The barrel lock also comprises movable retaining members 201. The longitudinal axis 230 is defined by the axis that in this embodiment is the axis of a cylinder for head portion 221 and a corresponding cylinder for shank portion 220. The retaining members 201, which may be balls or other elements some of which are discussed herein, are radially extensible and retractable relative to the longitudinal axis 230. FIG. 7 shows a section view of the non-limiting example embodiment lock shown in FIG. 6, showing retaining members 201 in an extended position relative to the longitudinal axis 230. FIG. 8 shows a section view of the example embodiment lock shown in FIG. 6 showing retaining members 201 in a retracted position relative to longitudinal axis 230. The retaining members serve to retain the barrel lock in the locking hardware when the lock is locked.

Generally, when a barrel lock is unlocked the retaining members are retracted allowing the barrel lock to be removed from the locking hardware. Once the barrel lock is removed from the locking hardware, only then can access be gained to the particular device that it is protecting. This characteristic is one aspect which distinguishes barrel locks over mechanical cylinder locks such as the mechanical cylinder lock shown in U.S. Pat. No. 6,895,792. Mechanical cylinder locks are installed into the device which they protect and remain in place when opened as well as when they are locked. Furthermore mechanical cylinder locks do not have to be removed to allow access to the device which they protect.

The smaller radial extent of the shank portion of the barrel lock was originally designed to fit holes provided in gas valves installed in the field an example of which is shown in U.S. Pat. No. 3,560,130. The larger diameter head portion in some applications is used to aid in further retaining the lock in some installations. In order to maintain compatibility with hardware in the field, it is imperative that the radial extents of the shank portion be maintained at a compatible radial extent with the hardware in use in the field which has been designed to accept barrel locks. A typical radial extent of the shank of an example barrel lock is 0.400 inches in diameter. Other barrel locks could of course have other radial extent dimensions as well as alternate cross-sectional shapes and still not depart from the scope of the present invention. In the present disclosure, the term "locking hardware" can be used to refer to any device which is secured by a barrel lock. Accordingly, "locking hardware" can include meter box covers and rings that contain the meter in a meter box or other hardware, which is secured by barrel locks.

As discussed above, a barrel lock is commonly characterized as having a generally cylindrical case with a head portion, a smaller diameter shank portion, and a shoulder portion interposed between the head and shank portions. The shank portion includes retaining means, usually a pair of retractable steel balls, to prevent extraction of the lock from the meter ring or other locking hardware when the lock is locked. While a cylinder lock is retained in the locking hardware regardless of whether it is locked or unlocked, barrel locks must be removed from the locking hardware when they are unlocked.

Figure 9:
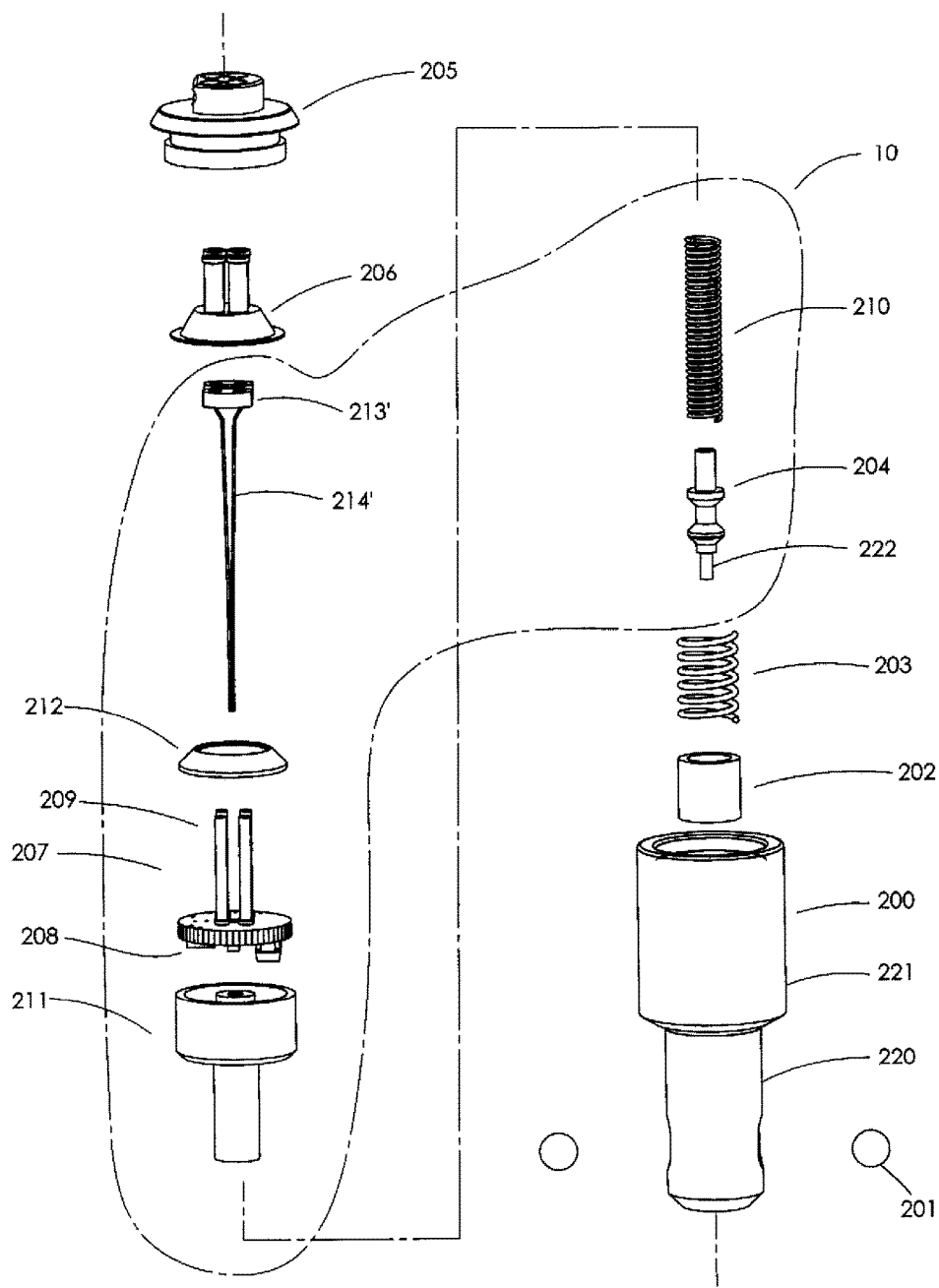
FIG. 9 is an exploded view of a lock embodiment with a shape memory alloy (SMA) actuator in the unlocked configuration in accord with one possible embodiment of the present invention.

Referring again to FIG. 1, 6, 7, 9 a non-limiting example embodiment barrel lock is shown generally at 1. The barrel lock comprises a longitudinal axis 230, a head portion 221, and a shank portion 220. The shank portion has retaining members 201, in this embodiment each a ball. The retaining members are radially extensible and retractable relative to the longitudinal axis 230. Referring to FIG. 9, electrically controlled actuator 10 comprises in one embodiment, shape memory alloy actuator. The electrically controlled actuator 10 can be of many variants of which several are presented here. This embodiment shape memory alloy actuator comprises a shape memory alloy wire 214', circuit board 213', fusible link 212, actuator body 211, spring 210 and retaining member driver 204.

The actuator has an opened position as shown in FIG. 8 and a locked position as shown in FIG. 7. FIG. 7 shows the actuator in the locked position and maintaining radial extension of the retaining members 201. FIG. 8 shows the actuator in the opened position allowing radial retraction of retaining members 201. The radial direction is generally perpendicular to the longitudinal axis 230. When the retaining members are configured so that when they are extended radially, they project beyond the radial extents of the shank 220 and prevent the barrel lock from being removed from the hardware in which it is installed.

Figure 13:
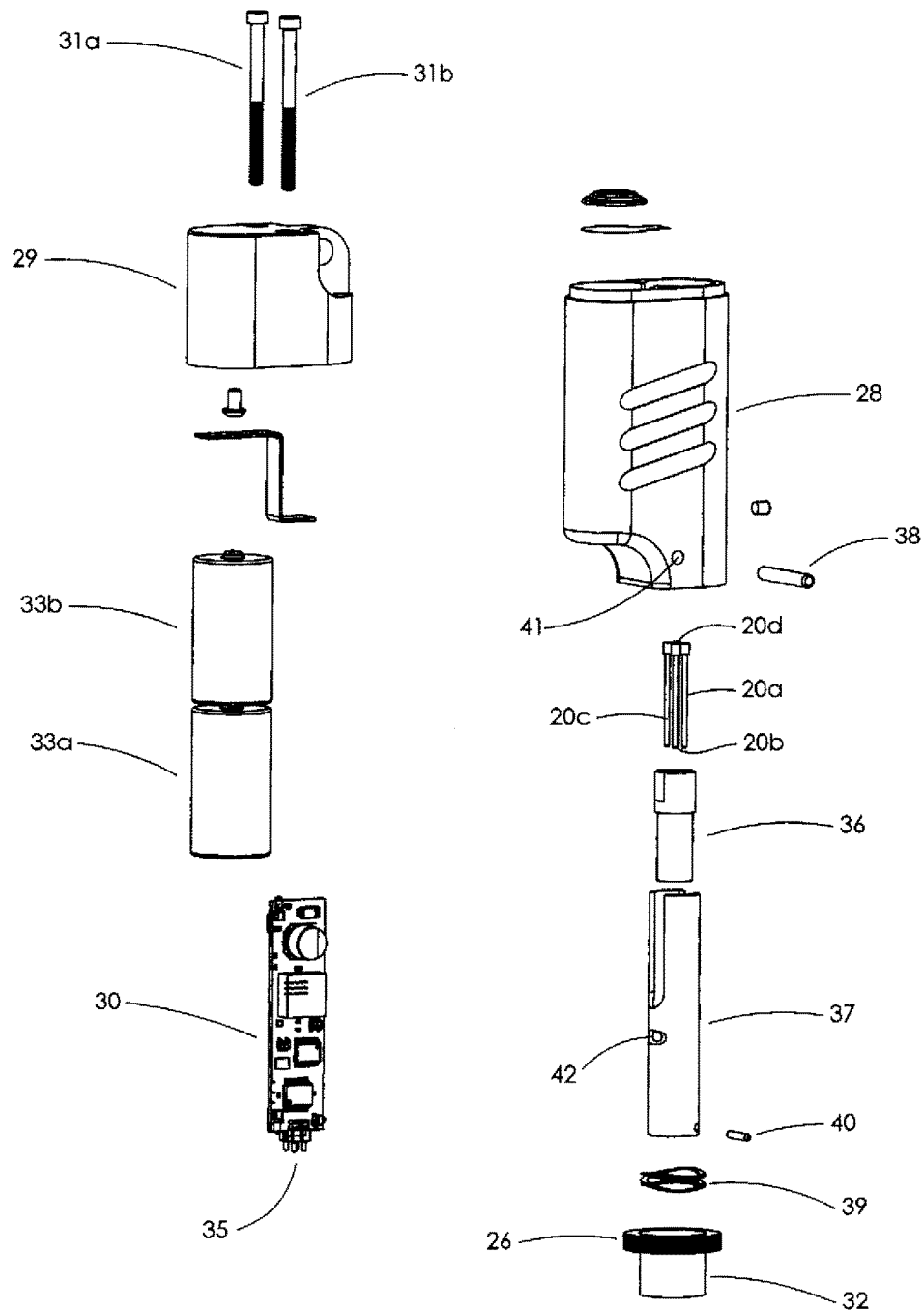
FIG. 13 is an exploded view of an electronic key in accord with one possible embodiment of the present invention.
Figure 14A:
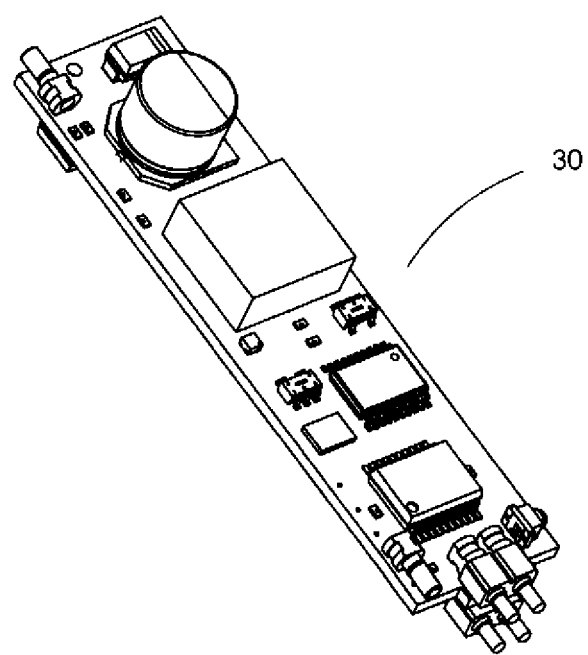
FIG. 14a is one side of a circuit board for an electronic key in accord with one possible embodiment of the present invention.
Figure 14B:
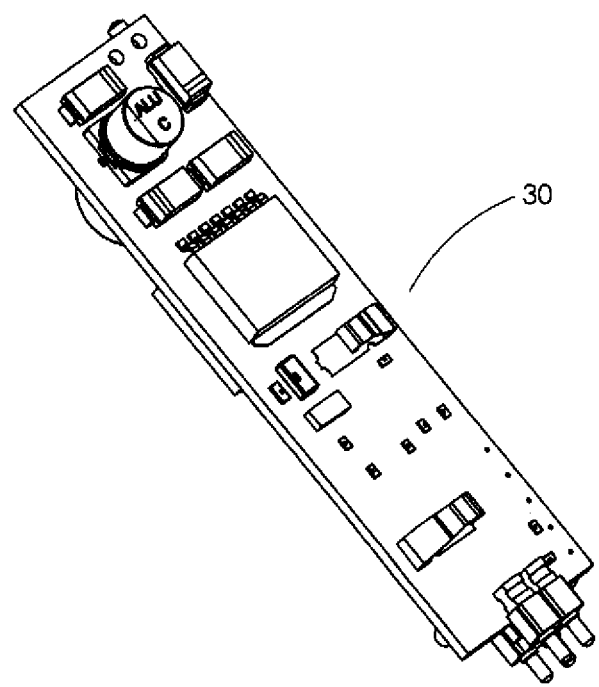
FIG. 14b is an opposite side of a circuit board for an electronic key in accord with one possible embodiment of the present invention.

Referring to FIGS. 6, 7, and 9 the actuator is located generally at the center of the head 221 and extends into the shank 220 to allow the retaining member driver 204 to contact retaining members 201. The actuator is in electrical communication with the control circuit 207 through circuit board 213' and fusible link 212. The details and function of this example embodiment actuator will be explained later in this document. The control circuit 207 is capable of receiving a signal from key 18, as shown in FIG. 3*a*, and of providing an electrical signal to the actuator 10, when the proper signal is received by the control circuit from the key through pins 20*a*, 20*b*, 20*c* and 20*d*, as shown in FIG. 13. The head portion 221 comprises the control circuit 207. This configuration provides space for the physical extents of the control circuit and allows ready access to the key interface of the barrel lock shown generally at 21. The key interface 21 of the present invention has a generally cylindrical boss 22 which is configured to be captured by the key as shown generally at 19 in FIG. 3A. In some embodiments, it is advantageous for the key to capture the lock to aid in removal of the lock from the locking hardware when it is unlocked.

Figure 10:
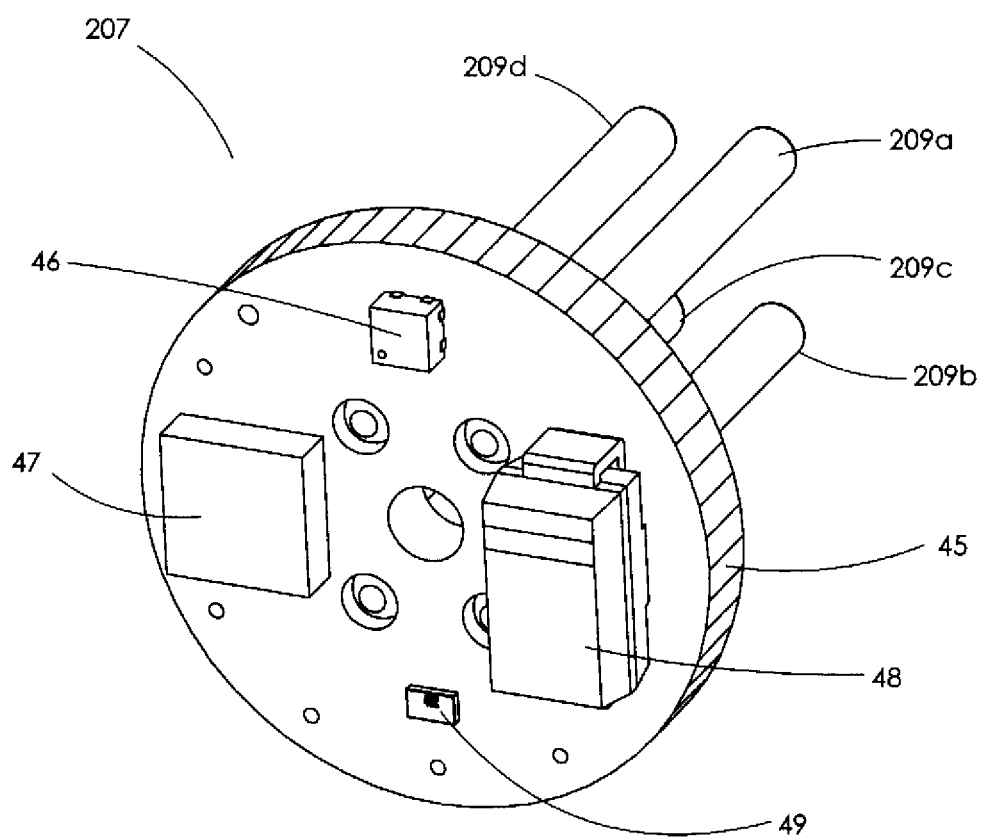
FIG. 10 a perspective view of a control circuit is shown in accord with one possible embodiment of the present invention.

Referring now to FIG. 6 and FIG. 10 an example embodiment control circuit 207 is shown in isometric view. One possible embodiment for a control circuit of the present embodiment comprises circuit board 45, diode 49, microcontroller 47, load switch 48, capacitor 46 and contact pins 209*a*, 209*b*, 209*c*, and 209*d*. The control circuit 207 in the present embodiment is mounted in the head portion 221 of the barrel lock 1 as shown in FIG. 7. The plane of the circuit board 45 is mounted in a generally perpendicular orientation to the longitudinal axis 230 close to the key interface 21, discussed hereinafter. In further embodiments the control circuit could be mounted at the end of the head portion farthest from the key interface. In other embodiments the control circuit could be mounted in the head portion in an orientation generally parallel to the longitudinal axis. In still further embodiments the control circuit could be mounted in the head portion in an orientation having a generally oblique angle to the longitudinal axis.

Referring to FIG. 6 and FIGS. 9, 209a, 209b, 209c, and 209d pass from the control circuit 207 to electrically connect power and signal lines to the key. In the present embodiment, four pins are shown for this purpose. In alternate embodiments two pins are used. In other embodiments three or more pins are used. Referring again to FIG. 7 the control circuit 207 makes electrical contact with the electrically controlled actuator through fusible link 212. Electrical contact in this embodiment is made between the control circuit 207 and fusible link 212[ ] as discussed hereinafter. In other embodiments the control circuit 207 may be potted or coated with a protective coating as is well understood by those skilled in the art. Some of the functions provided by the potting or protective coating include protection from the weather, protection from tampering and protection from shock.

Figure 42:
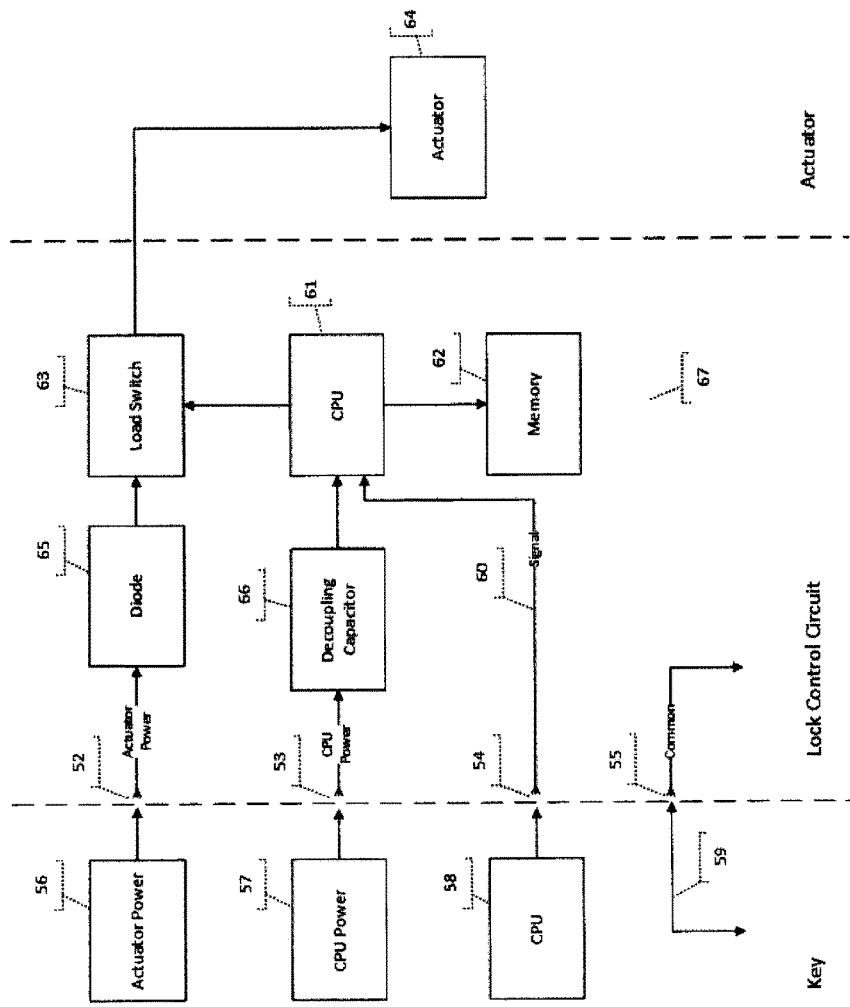
FIG. 42 is a circuit diagram showing electronic key and lock interconnections with an electronic lock control circuit in accord with one possible embodiment of the present invention.

Referring now to FIG. 42, a block diagram of the circuit components of an exemplary embodiment key and lock is shown. This embodiment comprises four connections to the key, namely 52, 53, 54 and 55 (which in a non-limiting example embodiment may correlate to reference numerals 20a-20d as shown in FIG. 13). Connection 52 passes power from the actuator power system 56 in the key to be used to power the actuator 64. The power for the actuator passes through diode 65 which serves to deter un-authorized opening by applying reverse biased power to connection 52. Load switch 63 switches power supplied at connection 52 when switched by CPU 61. CPU 61 receives power from the CPU power circuit 57 in the key. Power from the key passes through contact 53 and is de-coupled by decoupling capacitor 66 before arriving at CPU 61. The CPU in the key 58 communicates through contact 54 with CPU 61 in the lock. Some examples of communications between the CPU in the lock and the CPU in the key include transfer of log data stored in memory 62 from the lock to the key and the unlock code sent from the key to the lock. Contact 55 provides a common or ground connection to complete the electrical circuits of the components described above. Thus, when the lock control circuit 67 receives the proper signal from key CPU 58 through contact 54 it provides an electrical signal through load switch 63 to actuator 64 to open the lock. Examples of the types of data stored in memory 62 include serial numbers of keys attempting to open the lock, the date of the attempts and whether the attempts were successful or not.

Referencing an embodiment shown in FIGS. 3a, 3b, 7 and 9, the end cap 205 performs multiple functions for the lock. First, it seals and protects the lock from weather and resists tampering as it is comprised of stainless or hardened tool steel making it difficult to drill or cut. Second, the end cap 205 is gripped by the key 18 to enable lock extraction from apertures of locking hardware. The key 18 engages with a radial groove in a male or female arrangement. Gripping may also be enabled with friction or magnetic attraction. Further details with exemplary embodiments are presented herein. Third, contact pins 209a, 209b, 209c, 209d pass through end cap 205 and are insulated from electrical shorting to the conductive end cap 205 by lock contact pin insulator 206. Lock contact pin insulator 206 is made of a plastic suitable for low voltage insulation and in this embodiment it 206 is polypropylene injection molded into the end cap 205. The lock contact pins 209a, 209b, 209c, 209d are made of conductive material such as brass that may be gold plated and pass through insulator 206 to externally present flush with face of end cap 205 at region of lock engagement 19.

Figure 15A:
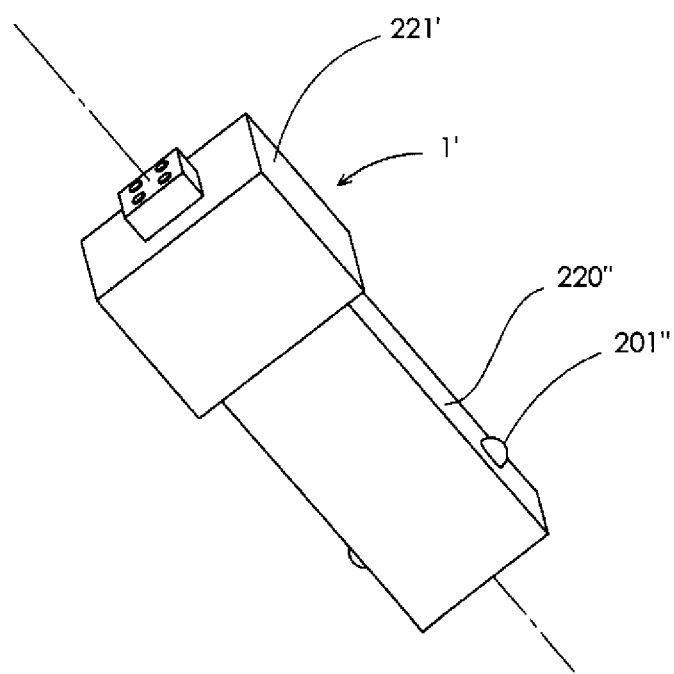
FIG. 15a is another embodiment of an electronic lock with a non-cylindrical body in accord with one possible embodiment of the present invention.
Figure 15B:
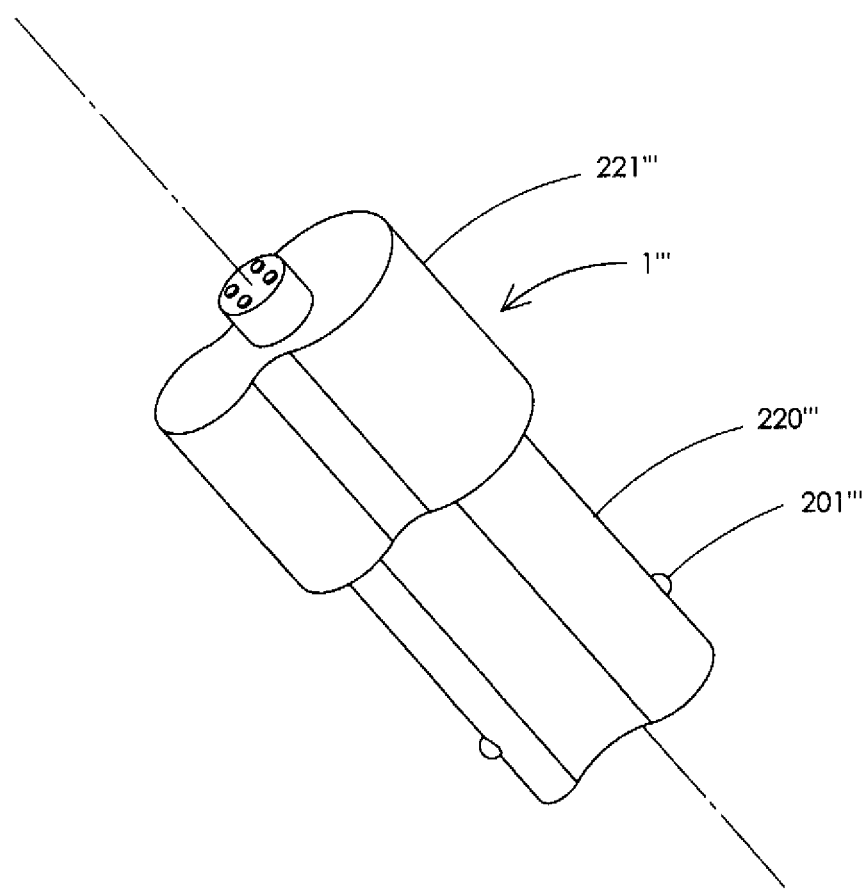
FIG. 15b is another embodiment of an electronic lock with a non-cylindrical body in accord with one possible embodiment of the present invention.

Referring to FIGS. 6, 7 and 9, the lock body 200 is comprised of shank portion 220 and head portion 221. In this embodiment, the lock body 200 is cylindrical through which the longitudinal axis 230 passes through the cylinder center. Alternate embodiments 1″ and 2‴ as shown in FIGS. 15a and 15b, respectively, comprised of shank portion 220″ and head portion 221″, and comprised of shank portion 220‴ and head portion 221‴, respectively, may be non-cylindrical, in which case the axis would be defined by the central axis of the smallest or best fit cylinder that can be fit around the outermost extents of the shank.

Figure 16:
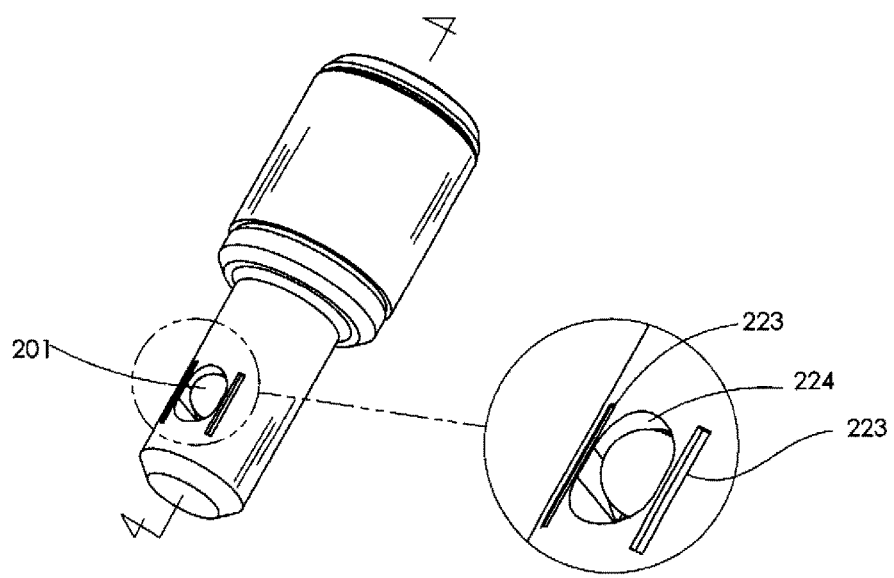
FIG. 16 is a perspective view with an enlarged portion showing stakes in a shank in accord with one possible embodiment of the present invention.
Figure 17A:
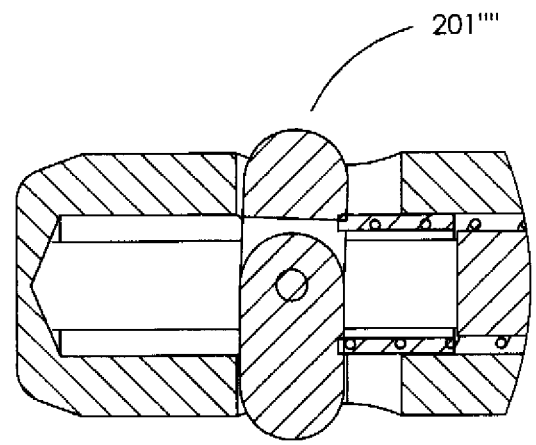
FIG. 17a is an elevational view, in section, showing an alternate embodiment of retaining members in accord with one possible embodiment of the present invention.
Figure 17B:
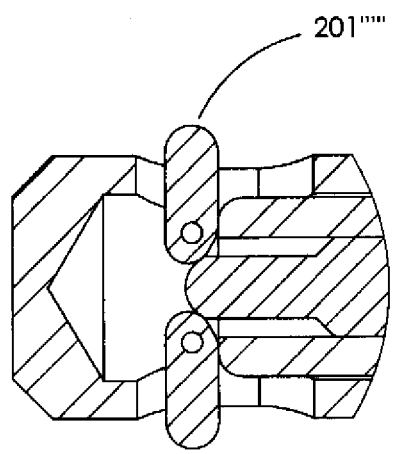
FIG. 17b is an elevational view, in section, showing another alternate embodiment of retaining members in accord with one possible embodiment of the present invention.

Referring to FIGS. 6 and 16, retaining members 201 extend from and retract into radial extent of lock shank 220 to respectively lock and unlock the barrel lock 1. In the exemplary embodiment, the retaining members 201 are stainless steel ball bearings that pass through retaining member slots 224 and are retained within the shank portion 220 by retaining protuberances 223. As shown in FIGS. 17a and 17b, alternate embodiments 201″″ and 201‴‴, respectively, can include a pin or lever to perform retaining member function to retain the barrel lock in the locking hardware when the lock is locked. The current and alternate embodiments of retaining member 201 are more fully described for manual locks in US Patent Publication 2012/0167369, which is incorporated herein by reference.

Figure 18:
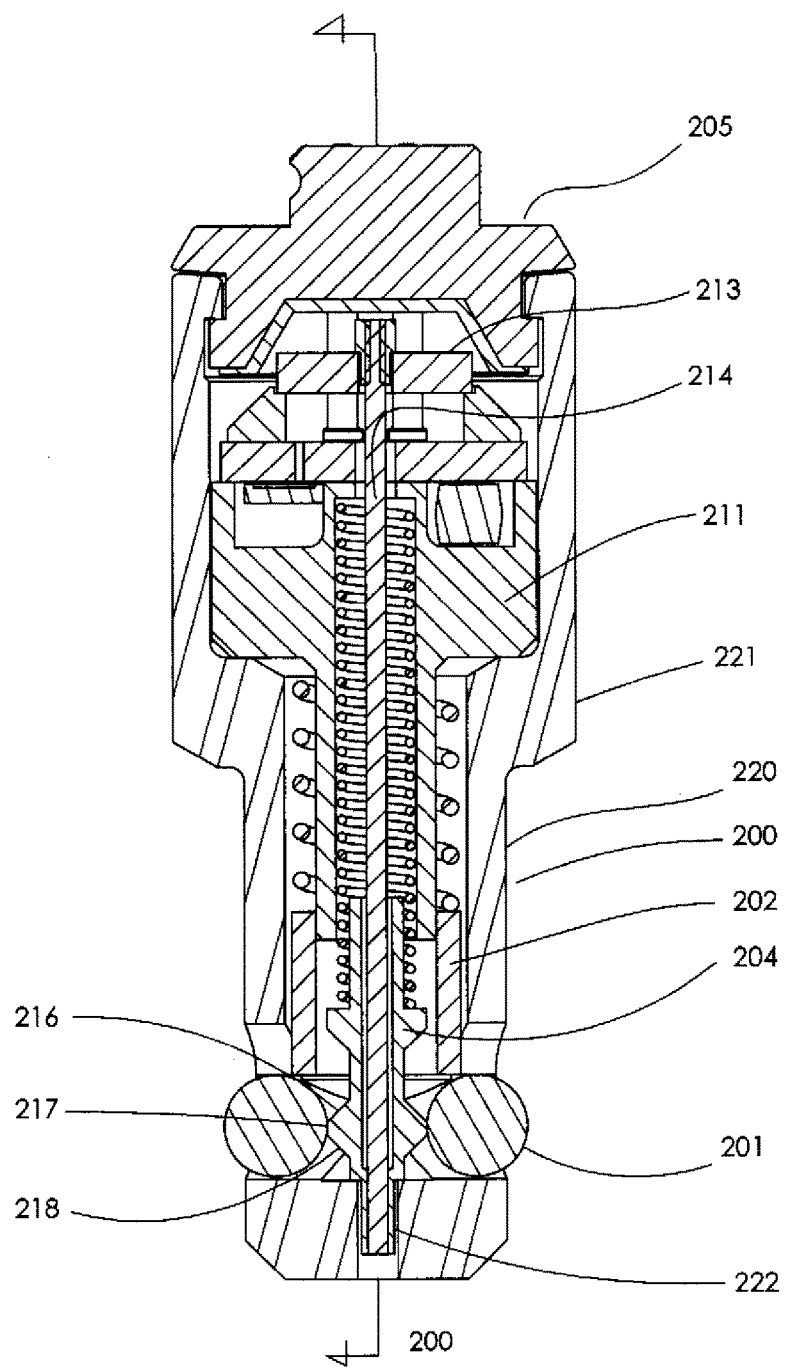
FIG. 18 is an elevational view, in cross-section, of a lock embodiment with an SMA actuator in the locked configuration, in accord with one possible embodiment of the present invention.
Figure 19:
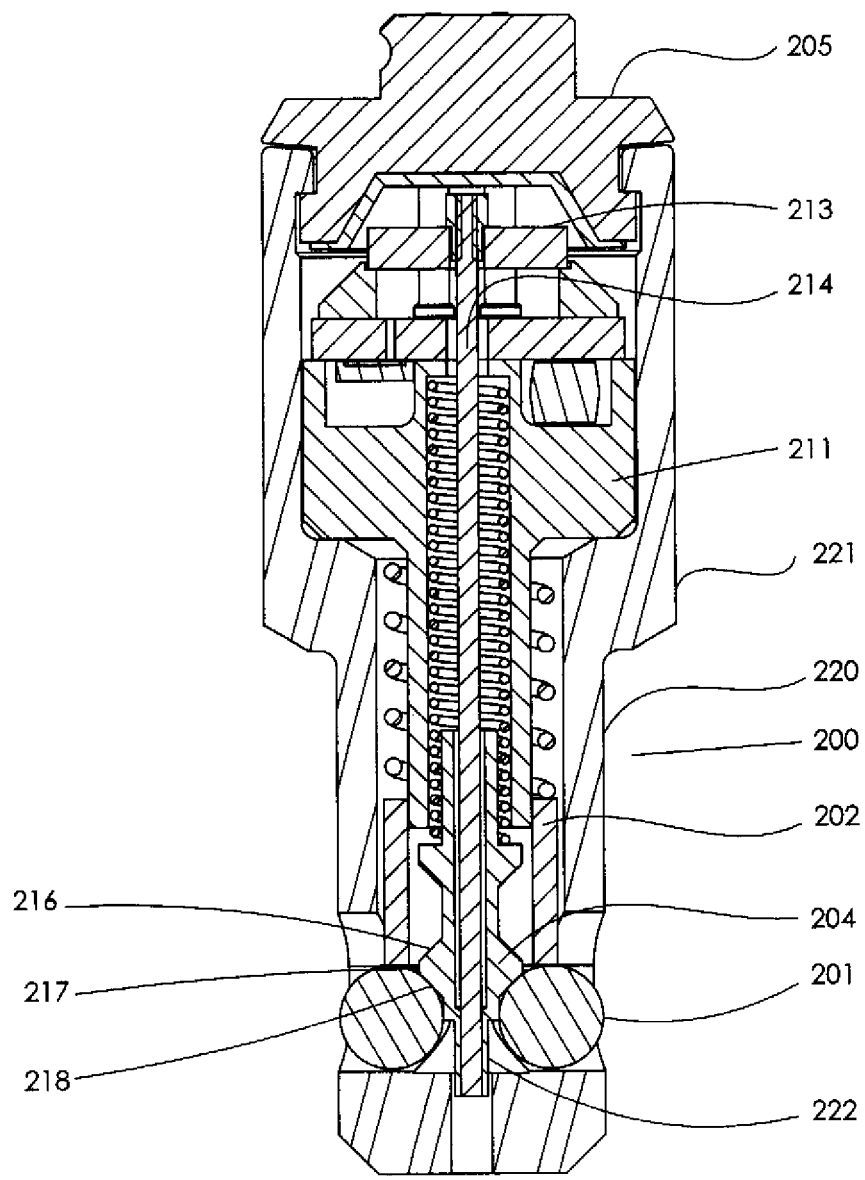
FIG. 19 is a cross-section perspective of a lock embodiment with an SMA actuator in the un-locked configuration in accord with one possible embodiment of the present invention.
Figure 20:
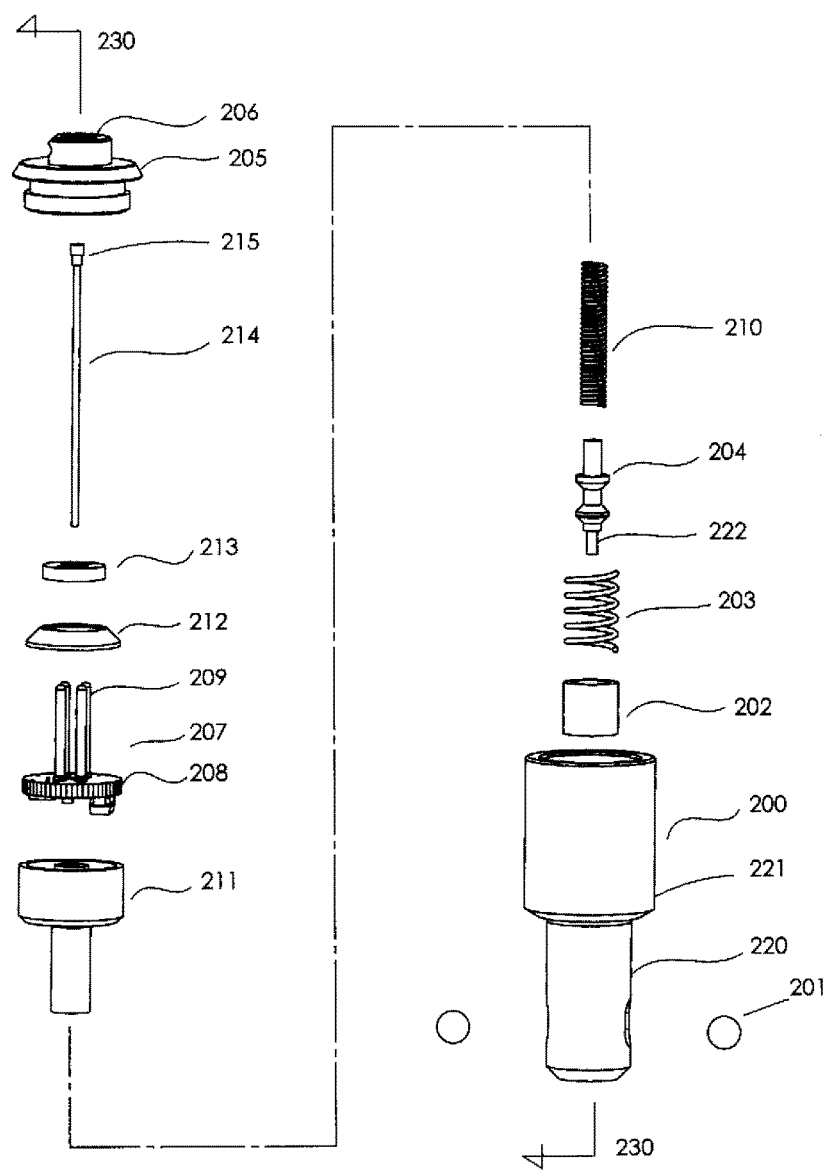
FIG. 20 is an exploded view perspective of a lock embodiment with an SMA actuator in accord with one possible embodiment of the present invention.

FIGS. 18, 19 and 20 depicts a non-limiting embodiment of a barrel lock with a shape memory alloy (SMA) actuator. From lock body 200, retaining members 201 selectively radially extend beyond shank 220 or retract into shank 220 depending on whether the barrel lock is in the locked or unlocked position, respectfully. Retaining members 201, in this non-limiting example, showing balls 201, are biased to the locked position by bushing 202 that itself is biased by bushing extender 203 that bears against bushing 202 and insulating spacer 211. Retaining member linear driver 204 is biased by SMA biasing member 210, which may comprise a spring, in the extended and locked position as depicted in FIG. 18 where retaining members 201 cannot recede toward longitudinal axis 230 of shank 220 because retaining member linear driver inhibition surface 217 prevents movement. One benefit of this design is that SMA biasing member 210 assists the actuator in returning to the locked position once power is removed. This ensures that the lock will return to the locked condition without relying on the key to relock it. This is desirable because there may be situations that arise where a user disengages the lock and key before properly locking the lock.

The barrel lock can be unlocked by driving an electric current through the shape memory alloy actuator 214. In this non-limiting example, actuator 214 comprises a single 0.012 inch diameter nickel-titanium alloy wire, one possible example of which is described in U.S. Pat. No. 6,574,958. The SMA wire used in this embodiment is called Flexinol made by Dynalloy, Inc. for which technical characteristics are published online at www.dynally.com. The amount of electric current applied affects the response time of the actuator. In this embodiment, sufficient voltage of approximately 3.6 volts produces a current of approximately 2 amperes sustained for slightly less than one second. The current in response to internal resistance of the wire produces heat that causes the wire alloy to transition from martensite phase to austenite phase and, consequently, contract to shorten in length by typically 4.5%. If desired, this amount can be increased to about 7% with a reverse biasing member that stretches the wire in the martenite phase. SMA biasing member 210 provides the reverse biasing. In this non-limiting embodiment, the SMA biasing member 210 is a stainless steel compression spring assembled with approximately a two pound preload of continuous extension forces. The spring bears on insulating spacer 211 and retaining member linear driver 204.

When the SMA actuator 214 contracts, it pulls both on the first and the second ends of a component stack inside the lock body shown in FIGS. 18-20 and also shown FIG. 7, another embodiment utilizing an SMA actuator, for which this description also applies as to general functionality. The first end of the SMA actuator 214 is attached to SMA actuator top crimp 215, which is simply a stainless steel disk through which the SMA actuator 214 passes, which is crimped closed to grip. The SMA actuator top crimp 215 bears on conductive platform 213, which may be composed of any conductive material.

In this particular embodiment, conductive platform 213 is a standard FR4 printed circuit board with conductive traces routing from surface mating with anti-tamper fusible alloy 212 to surface mating with SMA actuator top crimp 215. The anti-tamper fusible alloy 212 bears on lock printed circuit board assembly 208, which bears on insulating spacer 211, which bears on lock body 200. The insulating spacer 211 can be made of a molded or machined plastic. In this embodiment, insulating spacer 211 is an ultra-high-molecular-weight polyethylene. The second end of SMA actuator 214 passes through the central hole of the retaining member linear driver 204 and is attached at retaining member linear driver crimp end 222 by crimping (see FIG. 20).

This component stack is held in axial position within the lock body by the tight fit of the insulating spacer 211 within the head 221. Thus, only the second end with the retaining member linear driver 204 is free to move when the SMA actuator 214 contracts. Contraction of SMA actuator 214 inside shank 220 causes retaining member linear driver inhibition surface 217 (See FIGS. 18 and 19) to translate out of contact with retaining members 201 and brings the retaining member linear driver extraction ramp 218 into alignment with travel path of retaining members 201. The narrow or small diameter profile of retaining member linear driver 204 exposed to retaining members 201 as shown in FIG. 19 allows the balls to contract into shank 220, resulting in placing the barrel lock in the unlocked position.

The user of the key will pull on the unlocked lock to remove the lock from the locking hardware. Any additional travel of the retaining member linear driver 204 along the longitudinal axis 230 necessary to allow retaining members 201 to radially travel toward the longitudinal axis 230 is accomplished by the retaining members 201 forcefully bearing upon retaining member linear driver extraction ramp 218 and, thereby, urge the retaining member linear driver 204 further along the longitudinal axis 230. Force upon retaining member linear driver extraction ramp 218 results from user of key pulling the lock out of an aperture and the extraction force delivered by user is transferred from the resisting aperture to the retaining members 201 which bears upon retaining member linear driver extraction ramp 218. FIG. 18 shows lock embodiment in the un-locked configuration.

As stated above, the SMA actuator 214 responds to an electrical current. The current path flows from lock printed circuit board assembly 208 (See FIG. 20), through the anti-tamper fusible alloy 212, the conductive platform 213, SMA actuator top crimp 215, SMA actuator 214, the retaining member linear driver 204, to lock body 200, which is grounded often naturally but also to the key. Elsewhere in this text is a description of how the lock control circuit 207 including lock printed circuit board assembly 208 and lock contact pins 209 behaves and are electrically energized.

Referencing FIG. 9, in this embodiment lock contact pin insulator 206 electrically isolates lock control circuit 207 from end cap 205. Lock contact pin insulator 206 can be molded into end cap 205 to provide environmental protection and prevent shorting of SMA actuator 214 to end cap 205.

Anti-tamper fusible alloy 212 is a metal alloy that transitions from solid to liquid over a narrow and specific temperature. Because the SMA actuator 214 actuates in response to heat, one obvious means of tampering and defeating the lock is to apply heat. The fusible alloy selected transitions to liquid at a temperature just below actuation temperature, 90° C. The current embodiment uses an alloy containing Indium, Lead and Tin. There is extensive public information on fusible alloy and common compositions for specific melt temperatures. When the anti-tamper fusible alloy 212 melts, this eliminates support at the first end of the SMA actuator 214 where it is attached to SMA actuator top crimp 215. Accordingly, when SMA actuator 214 contracts after anti-tamper fusible alloy 212 melts, the retaining member linear driver 204 does not move. Consequently, the lock becomes inoperable but remains in the lock configuration due to the bias of SMA biasing member 210. Conductive platform 213 conducts heat applied during tampering. By minimizing thermal conductivity, the effectiveness of fusible alloy protection is improved.

An alternate embodiment of the SMA lock where the SMA actuator 214' and conductive platform 213' are different is presented in FIGS. 7, 8, and 9. In this embodiment, SMA actuator 214' wire is a loop that straddles conductive platform 213' and, consequently, obviates the SMA actuator top crimp 215. Both ends of the end of the SMA actuator 214' passes through the central hole of the retaining member linear driver 204 and are attached at retaining member linear driver crimp end 222 by crimping (see FIGS. 18-20). This loop configuration enables use of a smaller diameter wire of 0.010" diameter, which has a higher resistance of 0.5 Ohms per inch versus 0.33 for the single wire with a diameter of 0.012" A higher resistance requires a lower amperes of current to attain transition temperature, which benefits the circuit and key battery. However, the straight wire solution depicted in FIG. 18-20 is typically easier to assemble. Additional alternate embodiments could include multiple loops or multiple single strands of SMA actuator wire.

Figure 21:
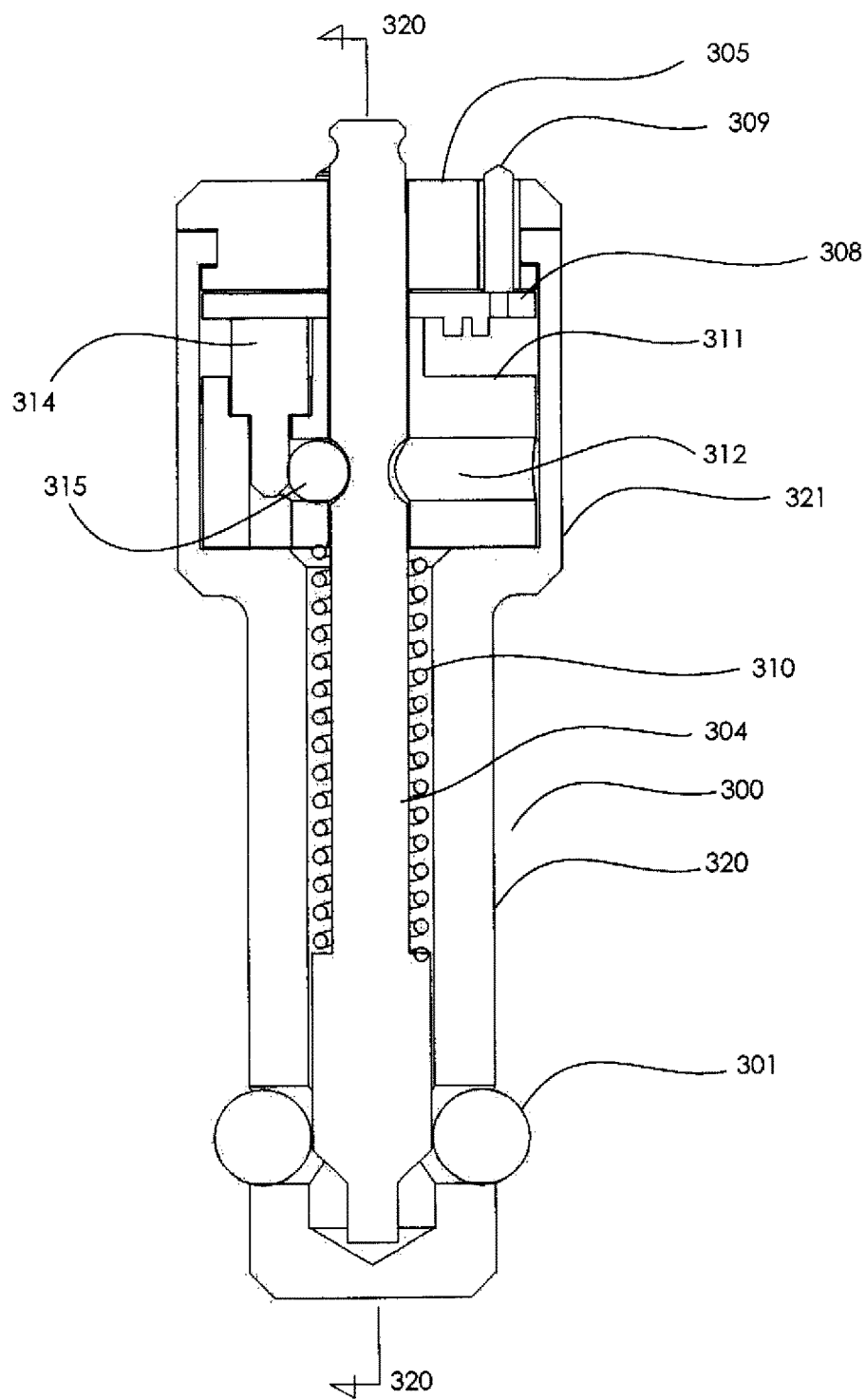
FIG. 21 is an elevational view, in cross-section, a lock with a solenoid actuator in the locked configuration in accord with one possible embodiment of the invention.
Figure 22:
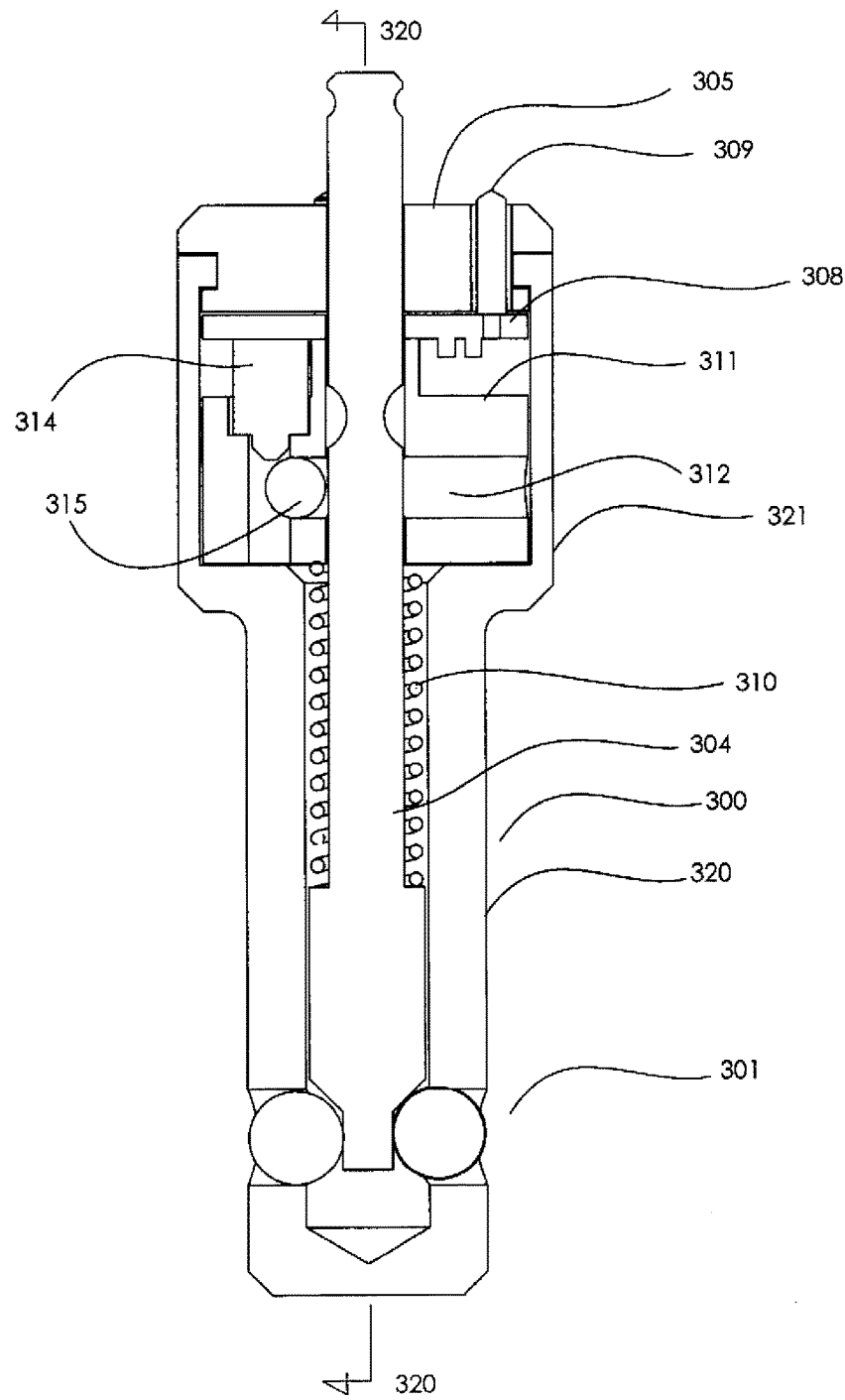
FIG. 22 is an elevational view, in cross-section, of a lock embodiment with a solenoid actuator in the un-locked configuration in accord with one possible embodiment of the invention.
Figure 23:
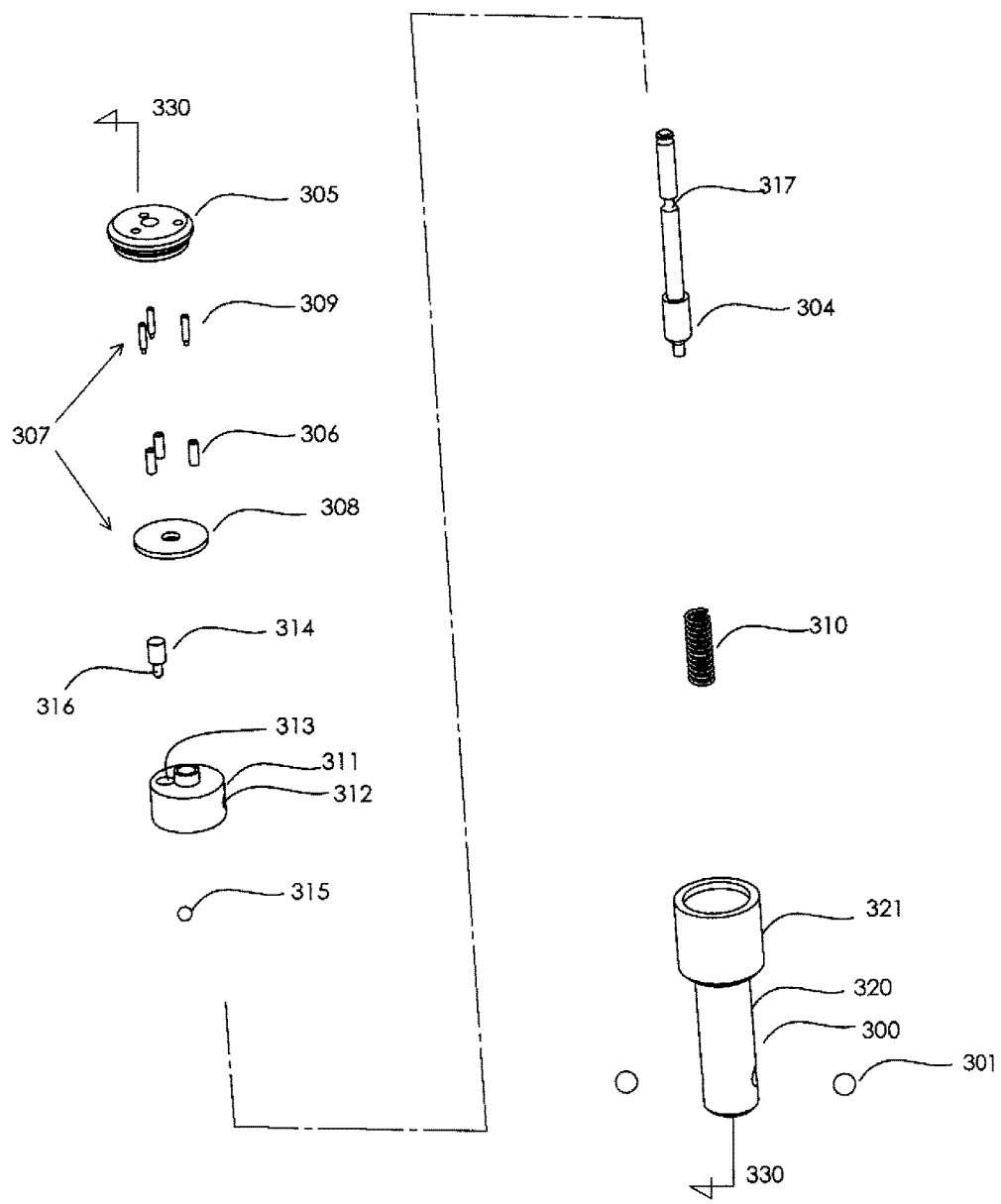
FIG. 23 is an exploded view of a lock embodiment with a solenoid actuator in accord with one possible embodiment of the invention.

FIGS. 21, 22 and 23 depict an embodiment of a barrel lock with a solenoid actuator. From the lock body 300, retaining members 301 selectably radially extend beyond shank 320 or retract into shank 320 depending on whether the lock is in the locked or unlocked position. In the locked position, as shown in FIG. 21, the larger diameter portion of retaining member linear driver 304 impedes radially inwardly movement of retaining members 301. To unlock this embodiment, the retaining member linear driver 304 is pulled by user along longitudinal axis 330 until retaining members 301 are no longer inhibited from retracting radially toward longitudinal axis 330 until fully recessed inside shank as shown in FIG. 22. The retaining member linear driver 304 translates along the longitudinal axis 330 until retaining member linear driver biasing member 310 is at full travel. In this embodiment, retaining member linear driver biasing member 310 is a stainless steel compression spring that can travel about 30% of overall length. When the retaining member linear driver 304 is released, retaining member linear driver biasing member 310 forcefully returns to the locked position as shown in FIG. 21.

Before the lock can be manually unlocked by manually pulling the retaining member linear driver 304, intermediary retaining member 315 must exit from retaining member linear driver intermediate retainer 317. Intermediary retaining member 315 can translate along intermediate track 312 within structural member 311 and is further restricted by retaining member linear driver 304 and solenoid plunger 316. Solenoid 314 is held in position within structural member 311 inside head 321 by solenoid retainer 313, which is simply an appropriately sized and positioned cavity. Structural member 311 can be made of steel, aluminum, plastic or other inert structural material. In this embodiment it is made of ferritic stainless steel for corrosion protection and resists tampering efforts with use of magnets outside of lock body 300. Solenoid 314 is integrated into the lock control circuit 307 by wire or soldered directly to lock printed circuit board assembly 308 (see FIG. 23). The lock control circuit 307 is energized by and communicates with a key described elsewhere via lock contact pins 309 that are electrically isolated from lock body 300 and end cap 305 by lock contact pin insulator 306, which may be molded into end cap 305 or be either molded or machined sleeves.

When solenoid 314 is energized by lock control circuit 307, solenoid plunger 316 retracts into solenoid 314 and allows movement of the retaining member linear driver 304. In the locked configuration, the solenoid 314 is not energized by lock control circuit 307, causing solenoid plunger 316 to extend from solenoid 314 into track 312 which pushes intermediary retaining member into retaining member linear driver intermediate retainer 317 and, thus, inhibits movement of the retaining member linear driver 304.

Figure 24:
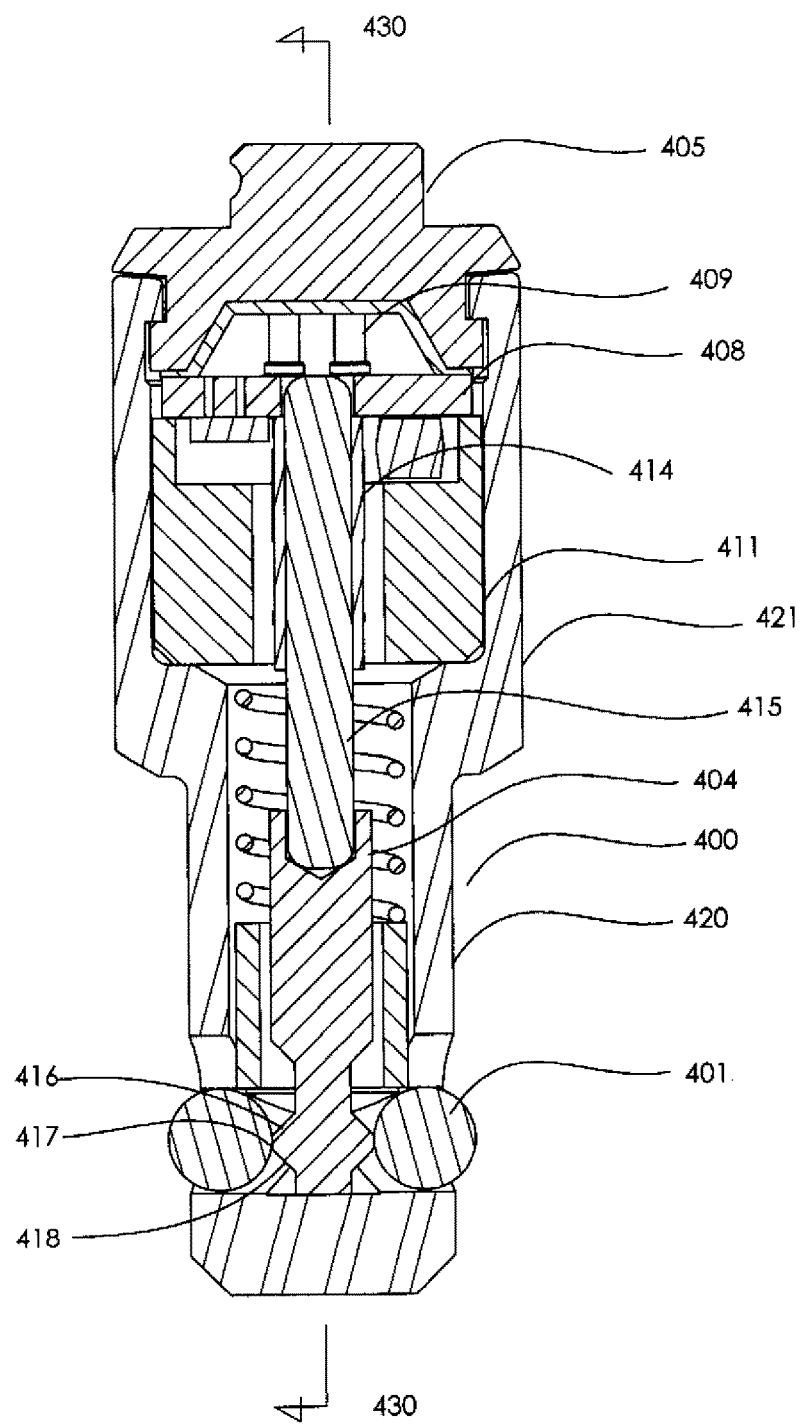
FIG. 24 is a cross-section perspective of a lock embodiment with a piezoelectric actuator in the locked configuration in accord with one possible embodiment of the invention.
Figure 25:
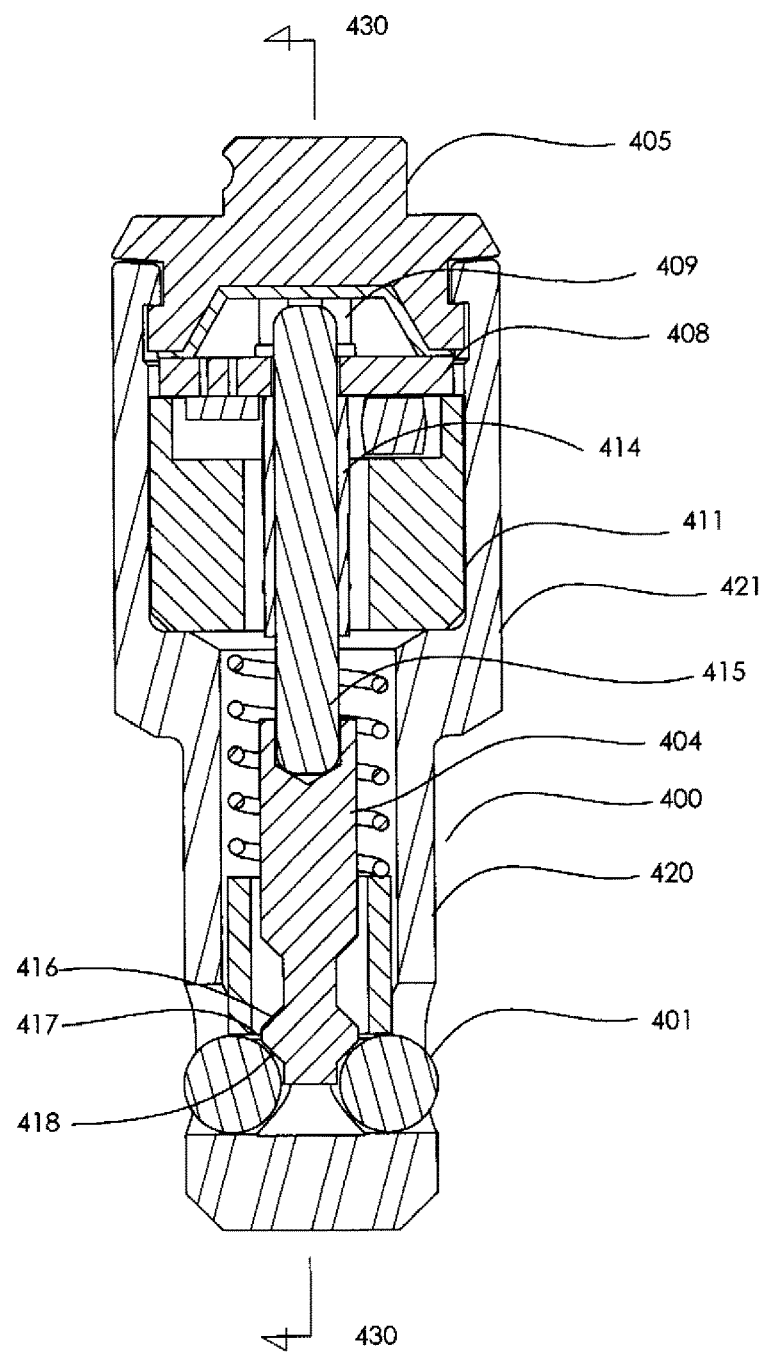
FIG. 25 is a cross-section perspective of a lock embodiment with a piezoelectric actuator in the un-locked configuration in accord with one possible embodiment of the invention.
Figure 26:
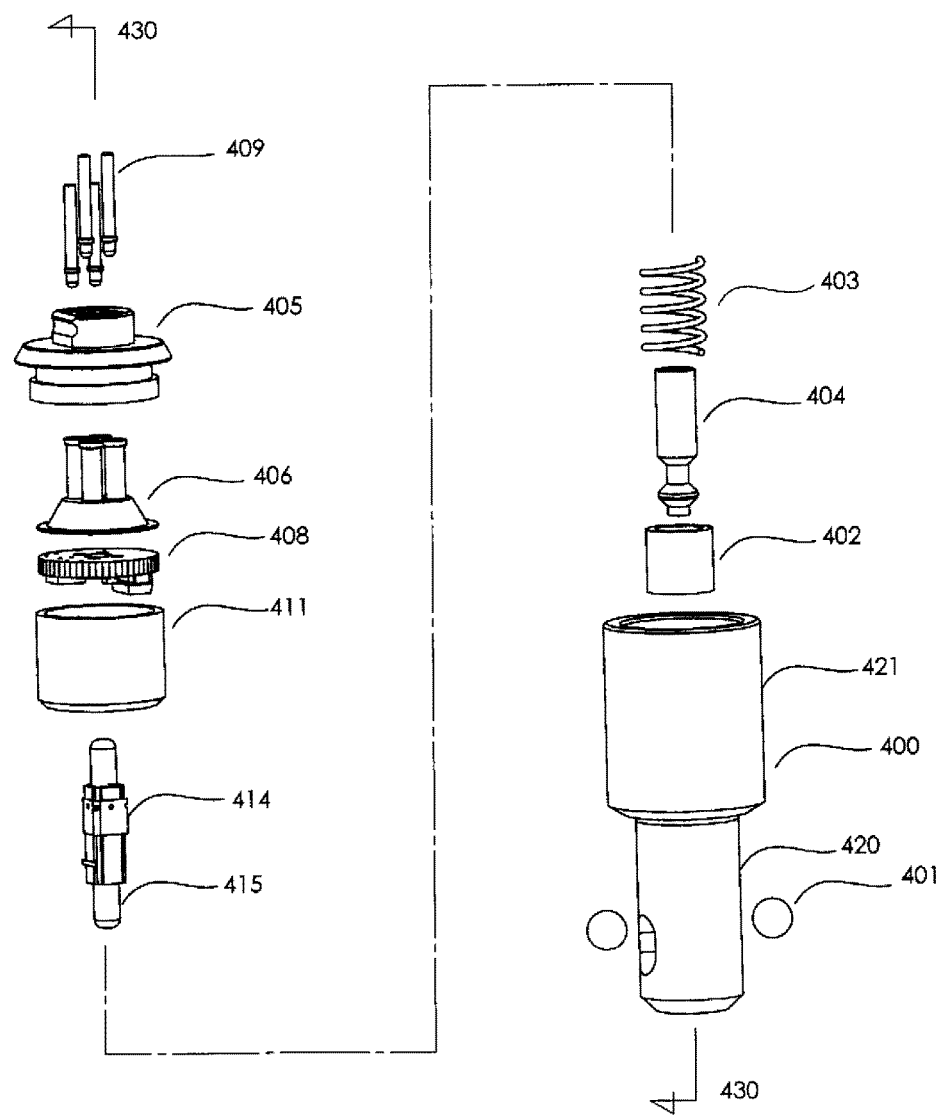
FIG. 26 is an exploded view perspective of a lock embodiment with a piezoelectric actuator in accord with one possible embodiment of the invention.

FIGS. 24, 25 and 26 depicts a non-limiting embodiment of a barrel lock with a piezoelectric actuator. From the lock body 400, retaining members 401 selectably radially extend beyond shank 420 or retract into shank 420 depending on whether the lock is in the locked position (FIG. 24) or unlocked position (FIG. 25). In the locked position retaining member linear driver inhibition surface 417 impedes radial movement of retaining members 401. To unlock this embodiment, the retaining member linear driver 404 attached to piezoelectric threaded shaft 415 is translated about 0.075 inches toward end cap 405 by a piezoelectric linear actuator 414 until retaining members 401 are no longer inhibited from retracting radially toward longitudinal axis 430 until fully recessed inside shank 420 as shown in FIG. 25. Various types of piezoelectric actuator designs that produce linear positioning are available that may be utilized in the barrel lock shown herein. Additionally piezoelectric actuators are available that provide rotational positioning that could be incorporated to provide locking and unlocking actuation with use of a retaining member rotary driver described elsewhere herein such as 504 shown in FIG. 31.

In this non-limiting embodiment, to unlock the electronic barrel lock, piezoelectric linear actuator 414 must translate the retaining member linear driver 404 into the unlocked position of FIG. 25. To relock the electronic barrel lock, piezoelectric linear actuator 414 must reposition the retaining member linear driver 404 into the locked position of FIG. 24 without the assistance of a biasing mechanism to automatically relock the lock. Accordingly, logic in the electronic key can preferably be implemented to prevent leaving the retaining member linear driver 404 in the unlocked position. The retaining member linear driver reposition ramp 418 assists the piezoelectric linear actuator 414 to smoothly push retaining members 401 radially outward from longitudinal axis 430 while relocking. A user may inappropriately place the lock in a situation that impedes radial movement of retaining members 401, such as improperly positioning the lock in the locking hardware, in which case the locking procedure would fault. In this case, the key can be programmed to record the fault event and recover by again trying to place the lock in the locked position.

The piezoelectric linear actuator 414 is attached electrically by means of a flat flex harness and physically by means of actuator enclosure riveted to lock printed circuit board assembly 408 that is held in longitudinal position by structural spacer 411 inside head 421 that surrounds and centers assembly about longitudinal axis 430. The lock control circuit on circuit board 408 is energized by and communicates with a key described elsewhere via lock contact pins 409 that are electrically isolated from lock body 400 and end cap 405 by lock contact pin insulator 406, which in this embodiment is molded into end cap 405. Structural member 411 can be made of steel, aluminum, plastic or other inert structural material. Geometry of structural member 411 may also be merged with geometry of lock body 400, if desired, to thereby eliminate the structural member 411 component.

This embodiment includes components bushing 402 and bushing extender 403 that in cooperation with retaining member linear driver insertion ramp 416 and retaining member linear driver inhibition surface 417 enables keyless insertion of lock into aperture. Keyless insertion technology is described more thoroughly elsewhere in text.

Figure 27:
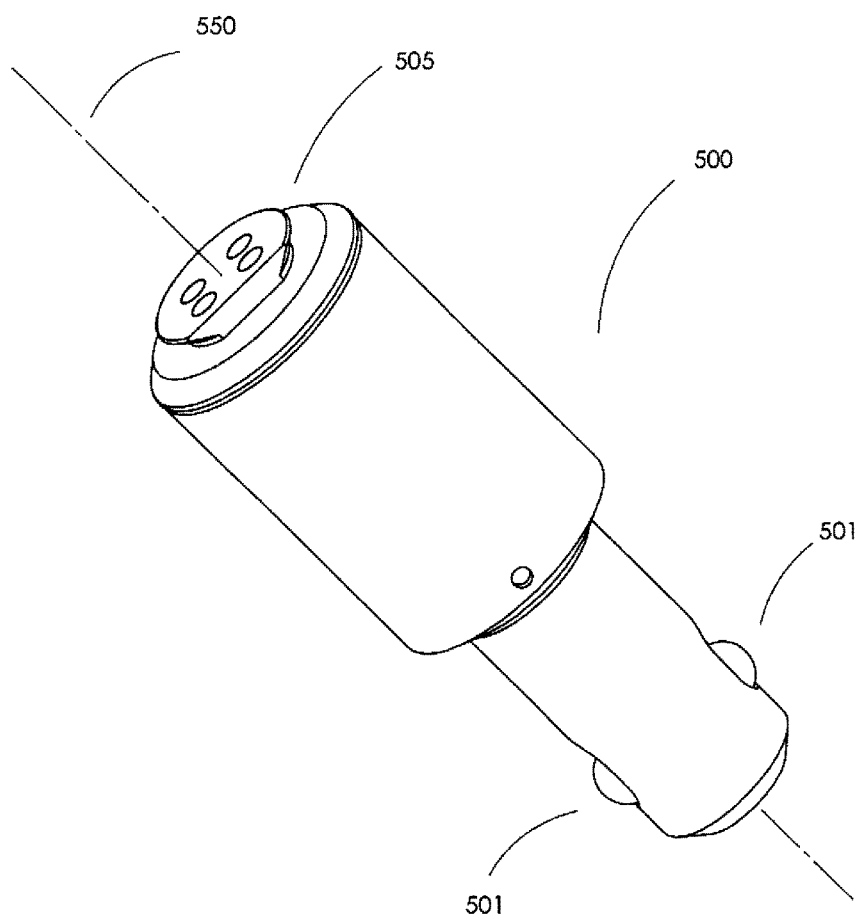
FIG. 27 is a perspective view of an embodiment of a barrel lock with a gear embodiment in accord with one possible embodiment of the invention.
Figure 31:
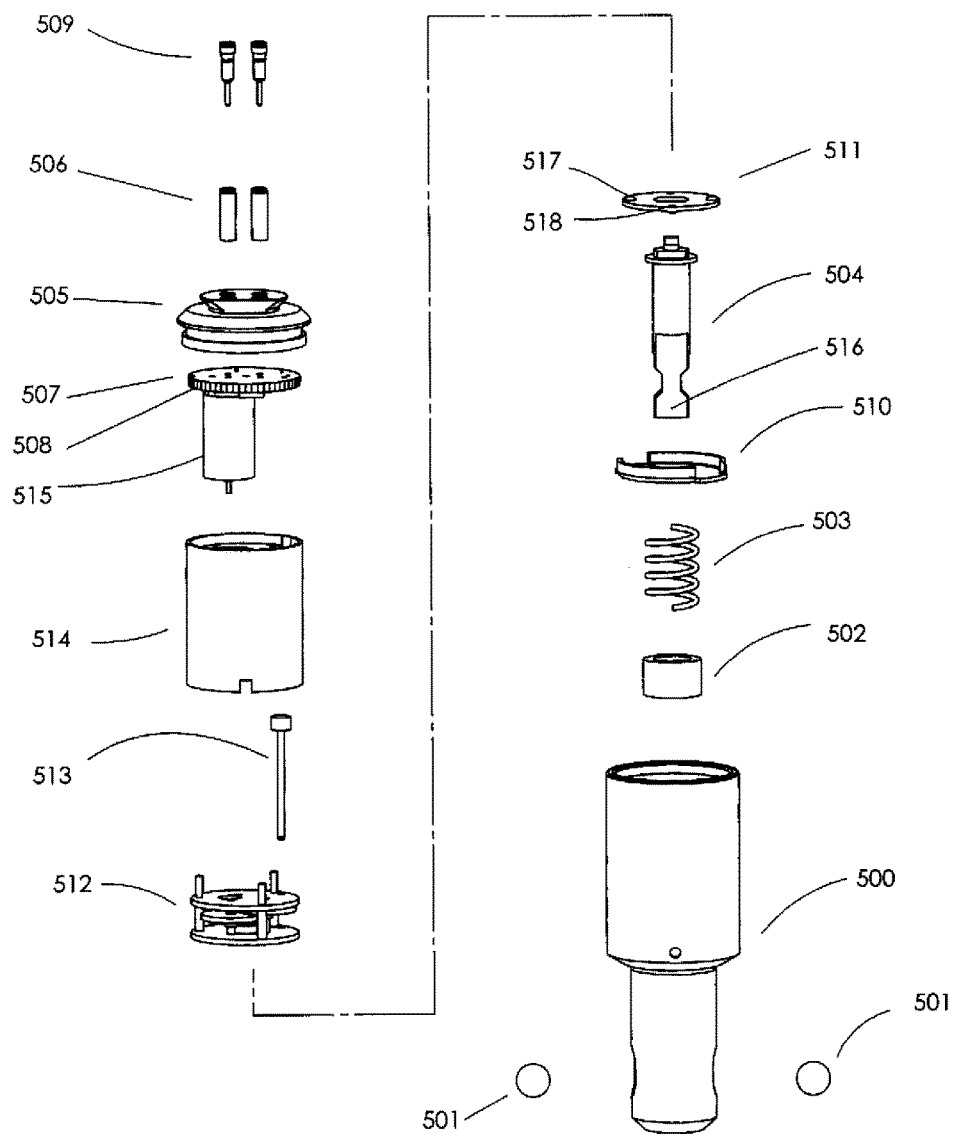
FIG. 31 is an exploded view of a lock with a gear drive in accord with one possible embodiment of the invention.

As shown in FIGS. 27 and 31, yet another non-limiting embodiment of an electronic barrel lock according to the present invention comprises of body 500, retaining members 501, bushing 502, bushing extender 503, retaining member rotary driver 504, end cap 505, lock contact pin insulators 506, lock control circuit 507, lock printed circuit board assembly 508, lock contact pins 509, actuator sub assembly enclosing plate 510, lock position transmitting plate 511, gear drive 512, lock position transmitting pin 513, actuator housing 514 and motor 515.

In this embodiment, the actuator comprises motor 515, which drives retaining member rotary driver 504 through a gear drive 512. As an alternative embodiment the motor 515 can be connected directly to retaining member rotary driver to form a direct drive.

Figure 28:
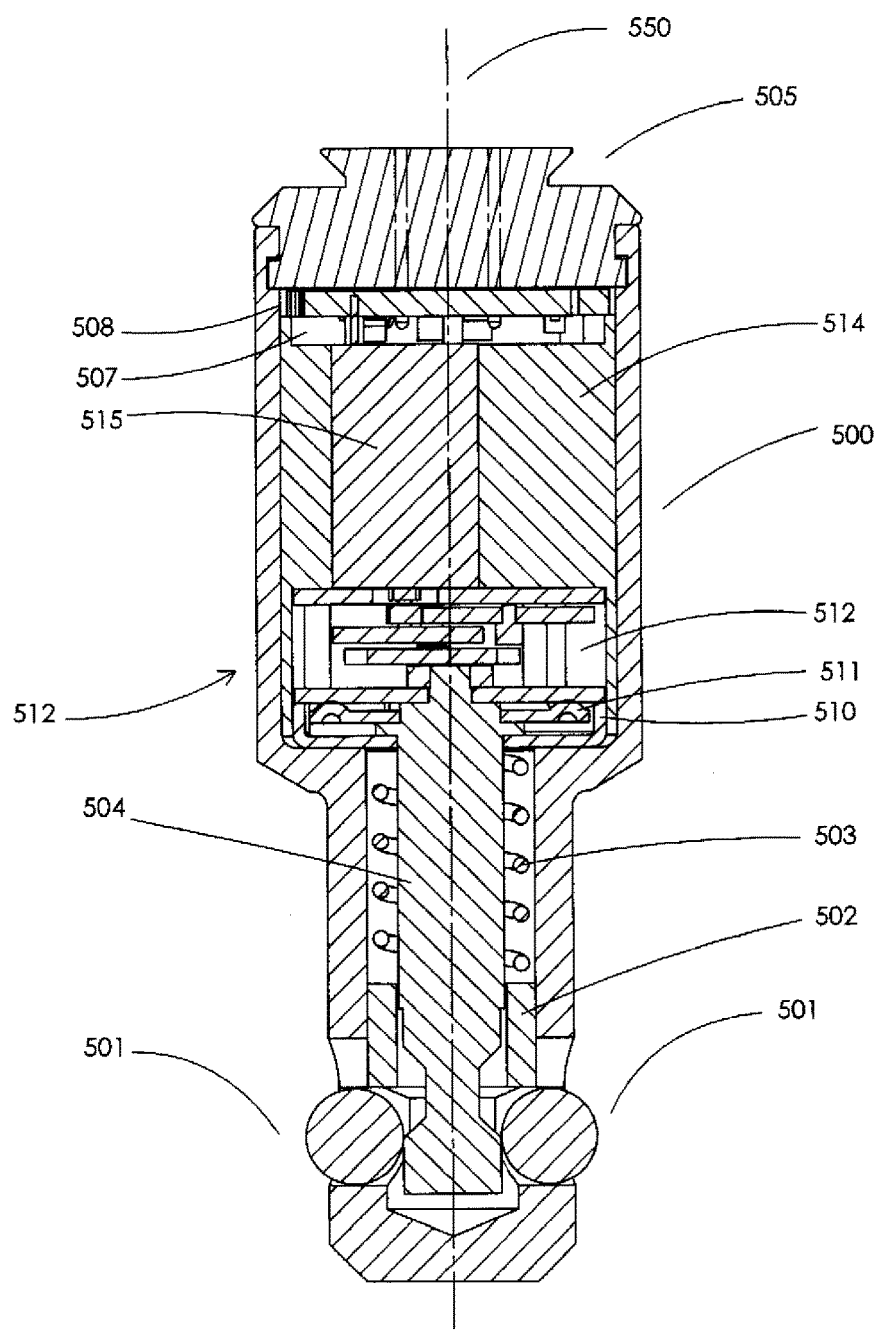
FIG. 28 is an elevational view, in cross section, of a lock with gear drive in a locked position in accord with one possible embodiment of the invention.

The retaining member rotary driver 504 moves rotationally with respect to the longitudinal axis 550 to drive the retaining members 501 into either locked or unlocked position. In the locked position, flat 516 on retaining member rotary driver 504 is normal to the retaining members 501 as shown in FIGS. 28 and 31. In the unlocked position, flat 516 on the retaining member rotary driver 504 is tangential to the retaining member 501 as shown in the FIG. 29.

In this embodiment, retaining member rotary driver 504 is driven by the motor 515 indirectly through a spur gear box. As an alternate embodiment, the retaining member rotary driver 504 can be driven by the motor 515 using a planetary gear box. As shown in FIG. 31 and described above, and in view of the figures and explanations herein, a spur gear box or planetary gear box would be well known to one skilled in the art to which it pertains and one skilled in the art would understand that gear drive 512 could be a spur gear box or alternatively, a planetary gear box as noted.

Figure 29:
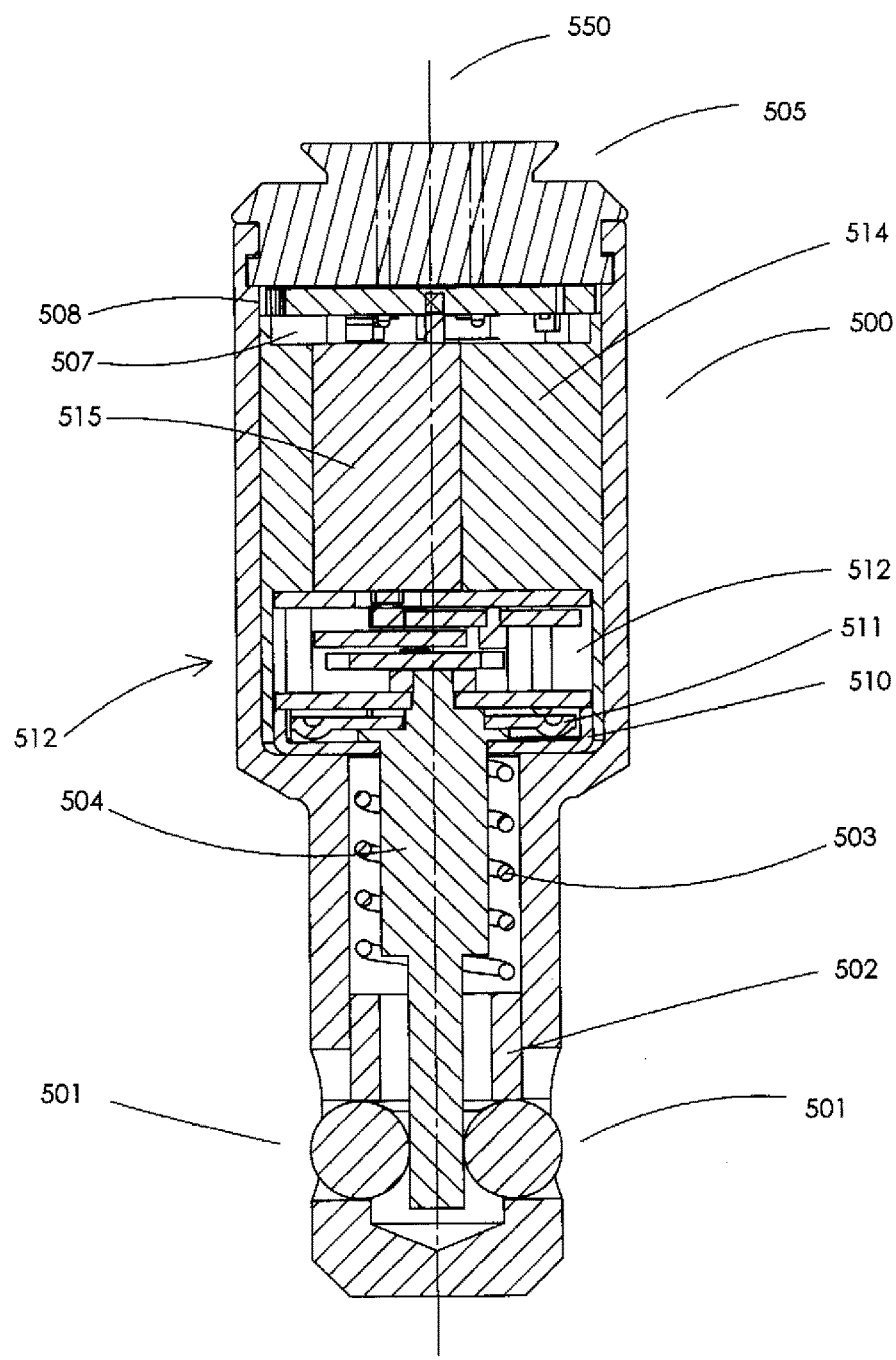
FIG. 29 is an elevational view, in cross section, of a lock with gear drive in an unlocked position in accord with one possible embodiment of the invention.
Figure 30:
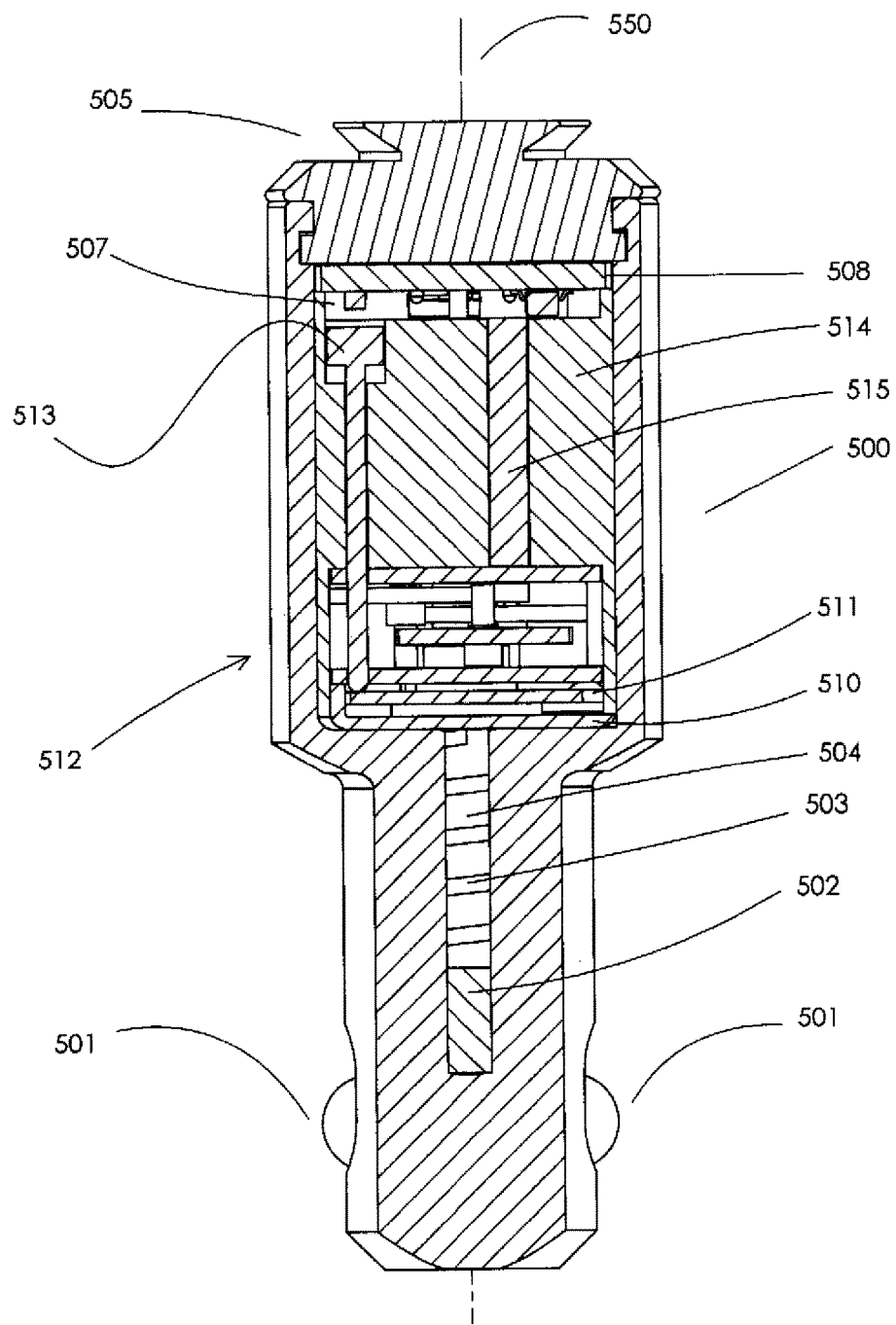
FIG. 30 is an elevational view, in cross section, of a lock with gear drive illustrating an embodiment of a rotational limit sensor in accord with one possible embodiment of the invention.

The position of the retaining member rotary driver 504 is controlled by a feedback provided by the rotation limit sensor which indicates whether the lock is in either locked or unlocked position. This ensures that the lock is either fully locked or fully open as shown in FIG. 28 and FIG. 29 respectively. In one embodiment, the rotation limit sensor comprises of the lock position transmitting plate 511 and lock position transmitting pin 513 working in collaboration with the control circuit. The lock position transmitting plate 511 has crests 517 and troughs 518 as shown in FIG. 31, which can be configured to correspond to either locked or unlocked position of the retaining member rotary driver. The lock position transmitting plate 511 is coupled to the retaining member rotary driver 504 to turn together. The lock position transmitting pin 513 rides on the surface of the lock position transmitting plate 511 and transmits the position of the retaining member rotary driver 504 when it passes thru a trough 518 or crest 517. The lock position transmitting pin 513 can transmit the signal to the control circuit by making an electrical contact with the circuit board or by sensing the capacitance change between the pin and the circuit board as shown in FIG. 30.

Alternatively, inductive sensing with circuit board or opto-electric sensing can be used to achieve the same. Similar position sensing arrangements can be used for retaining member linear driver 604 described next and depicted in FIGS. 32-34.

Figure 34:
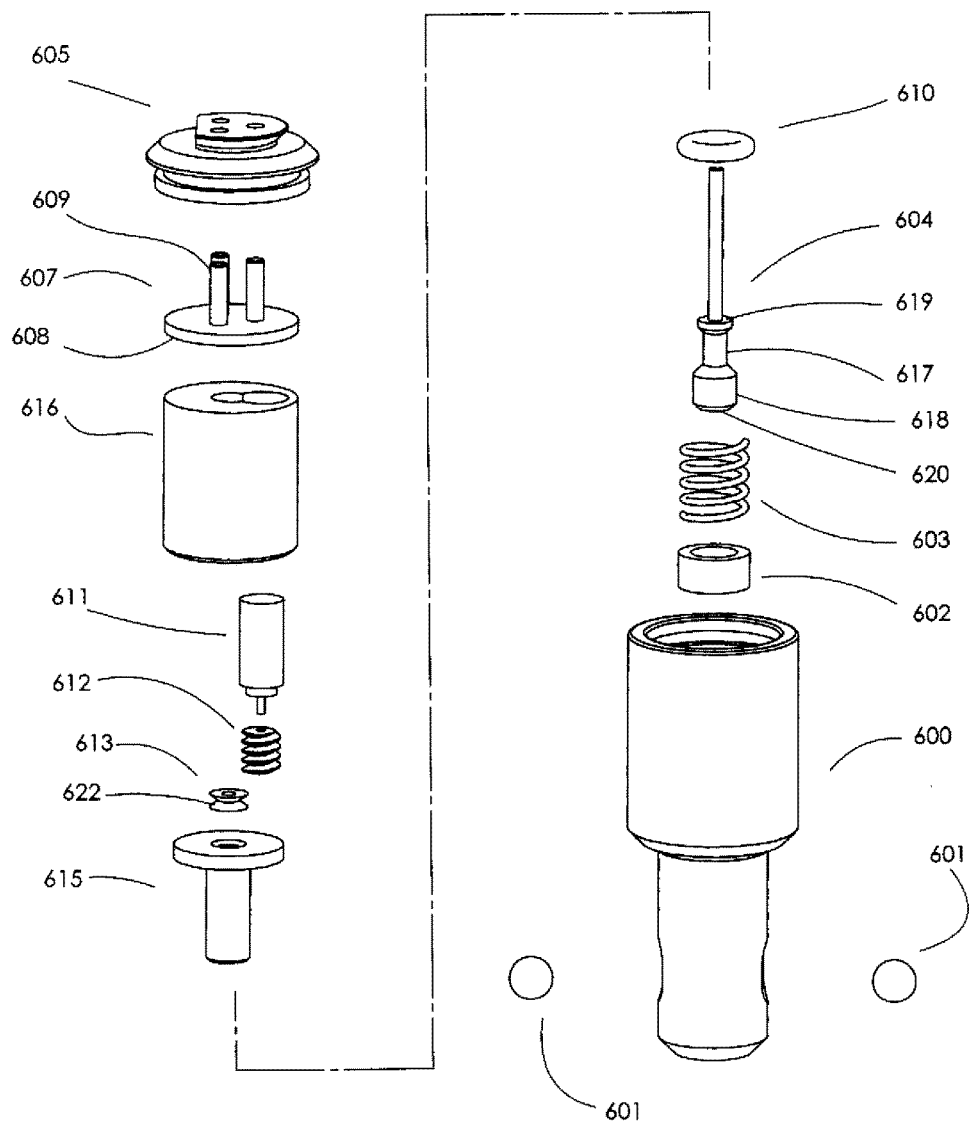
FIG. 34 is an exploded view of an electronic barrel lock with screw drive in accord with one possible embodiment of the invention.

As shown in the FIG. 34, another non-limiting embodiment of the present invention comprises body 600, retaining members 601, bushing 602, bushing extender 603, retaining member linear driver 604, end cap 605, lock control circuit 607, lock printed circuit board assembly 608, radially insulated lock contact pins 609, O-ring 610, motor 611, driver screw 612, driven member 613, and alignment member 615.

Figure 32:
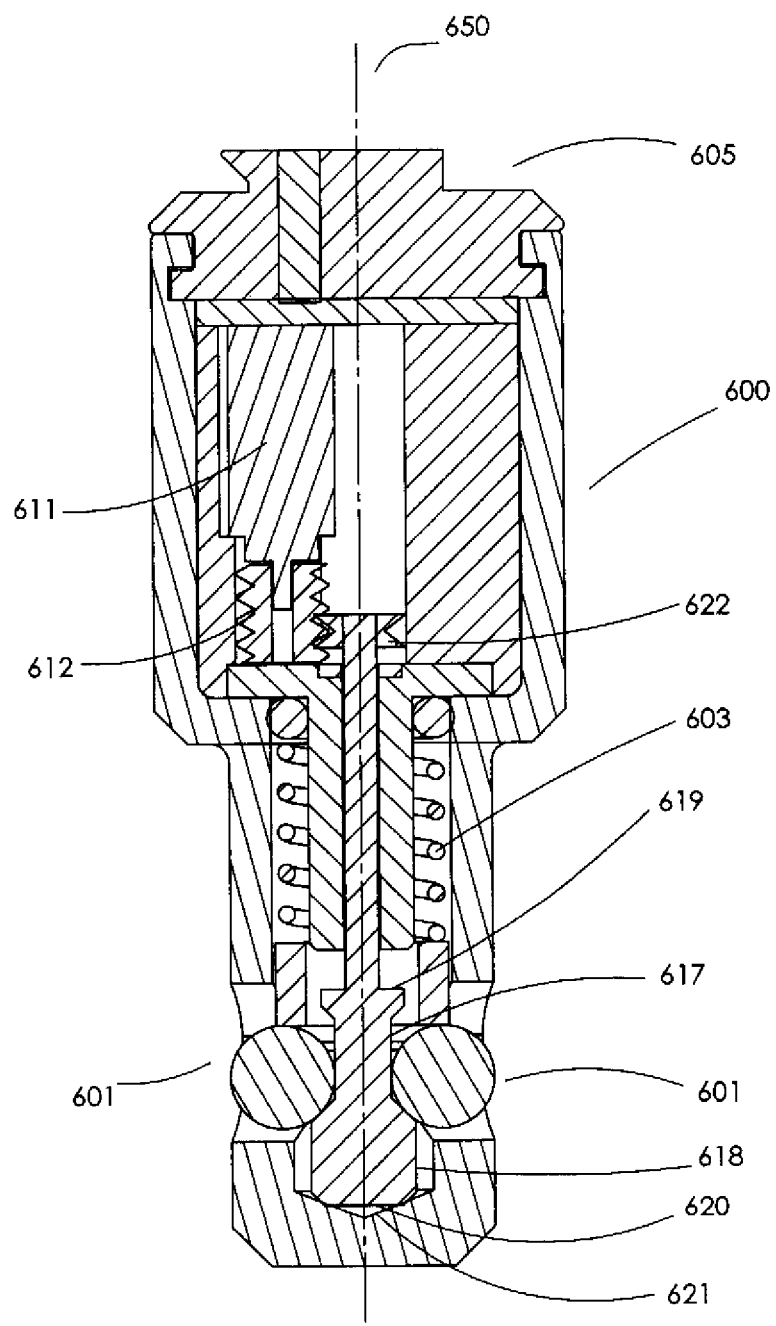
FIG. 32 is an elevational view, in cross section, showing a barrel lock with screw drive in a locked position drive in accord with one possible embodiment of the invention.
Figure 33:
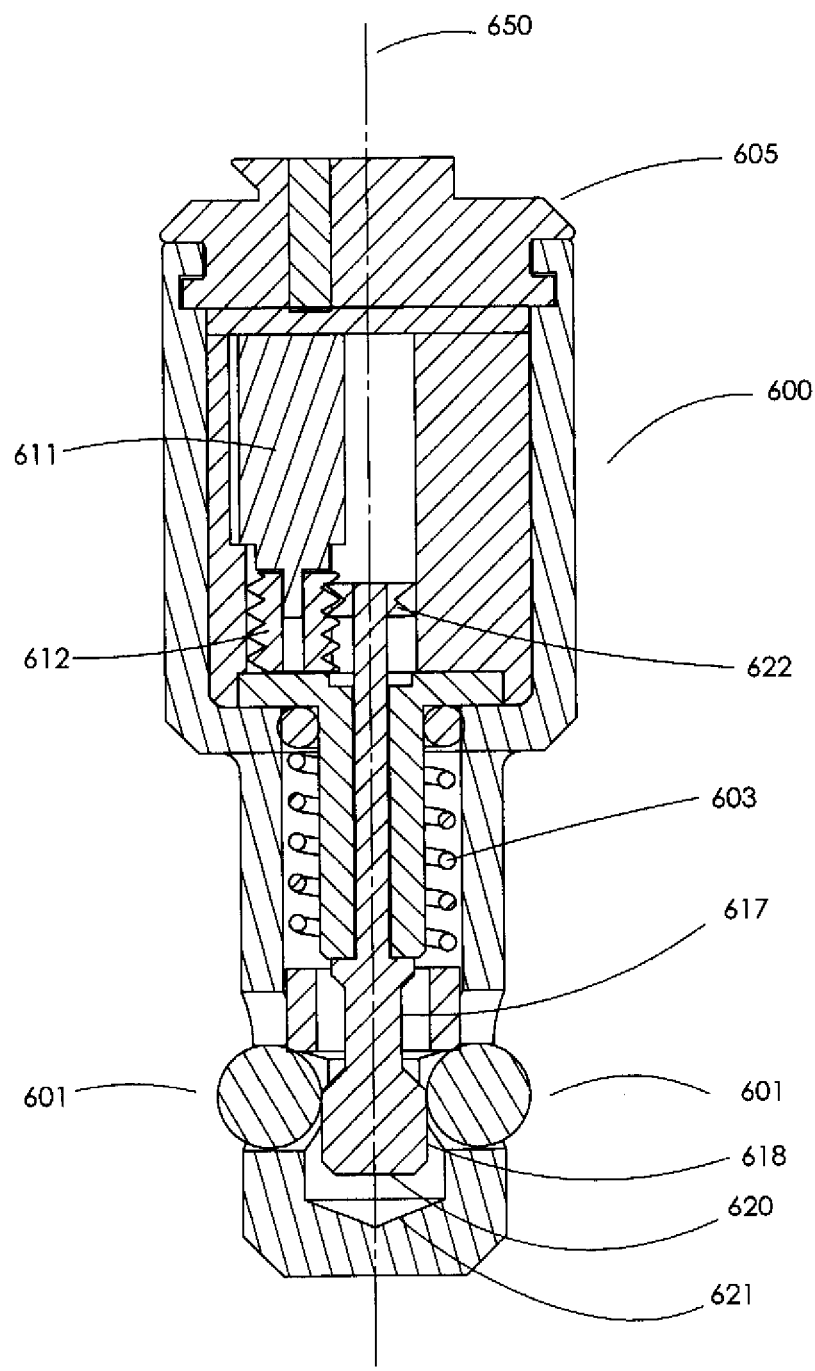
FIG. 33 is an elevational view, in cross section, showing a barrel lock with screw drive in an unlocked position drive in accord with one possible embodiment of the invention.

In the current embodiment the retaining member linear driver 604 moves axially along the longitudinal axis 650 to drive the retaining members 601 into either locked or unlocked position as shown in FIG. 32 and FIG. 33 respectively.

The movement of the retaining member linear driver 604 along the longitudinal axis 650 is achieved thru the driven member 613 which is driven by the driver screw 612 which in turn is driven by the motor 611646. The driver screw 612 attached to the motor is stationary along the axis parallel to the longitudinal axis 650. The radial movement in the driver screw 612 causes the driven member 613 to either move up or down due to its engagement with the threads on the driver screw 612.

The retaining member linear driver 604 movement along the longitudinal axis 650 is constrained to ensure the lock is fully locked or unlocked. In the current embodiment, the locked position is shown in FIG. 33 where the retaining member linear driver 604 is constrained by the locking stop 619 which makes contact with the alignment member 615 to ensure the locked position where retaining members 601 are engaged with the locking surface 618 of the retaining member linear driver 604. Similarly, the unlocked position is shown in FIG. 32 where the retaining member linear driver 604 is constrained by the unlocking stop 620 which makes contact with the bottom surface 621 of the body 600 to ensure an unlocked position where the retaining members 601 are adjacent to the recessed surface 617 of the retaining member linear driver 604.

In the current embodiment it can be seen that the driven member 613 has a uniform groove 622 along its diameter instead of a thread to prevent unintentional rotational motion of retaining member linear driver 604 instead of desired linear motion along the longitudinal axis 650.

In an alternate embodiment, the driven member feature can be incorporated as an internal thread or external in the retaining member linear driver 604 to interact with the driver screw 612.

Figure 11:
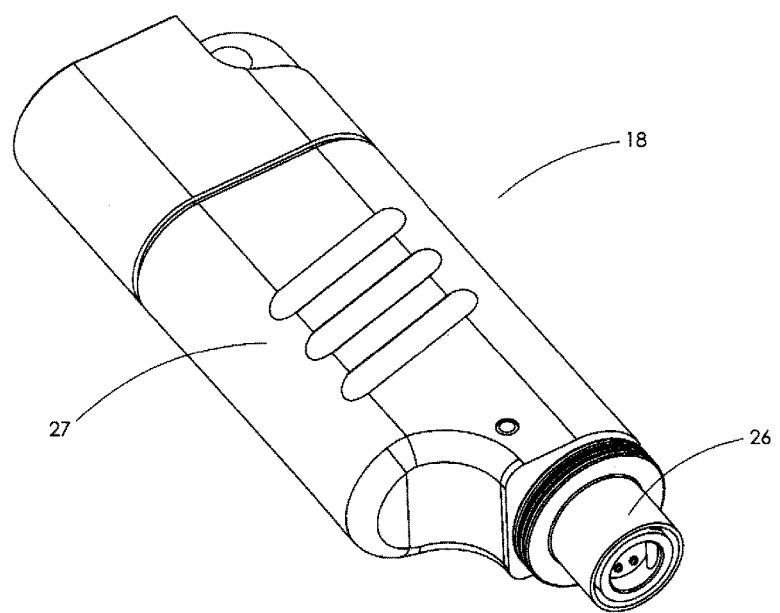
FIG. 11 is a perspective view of an electronic key in accord with one possible embodiment of the present invention.
Figure 12:
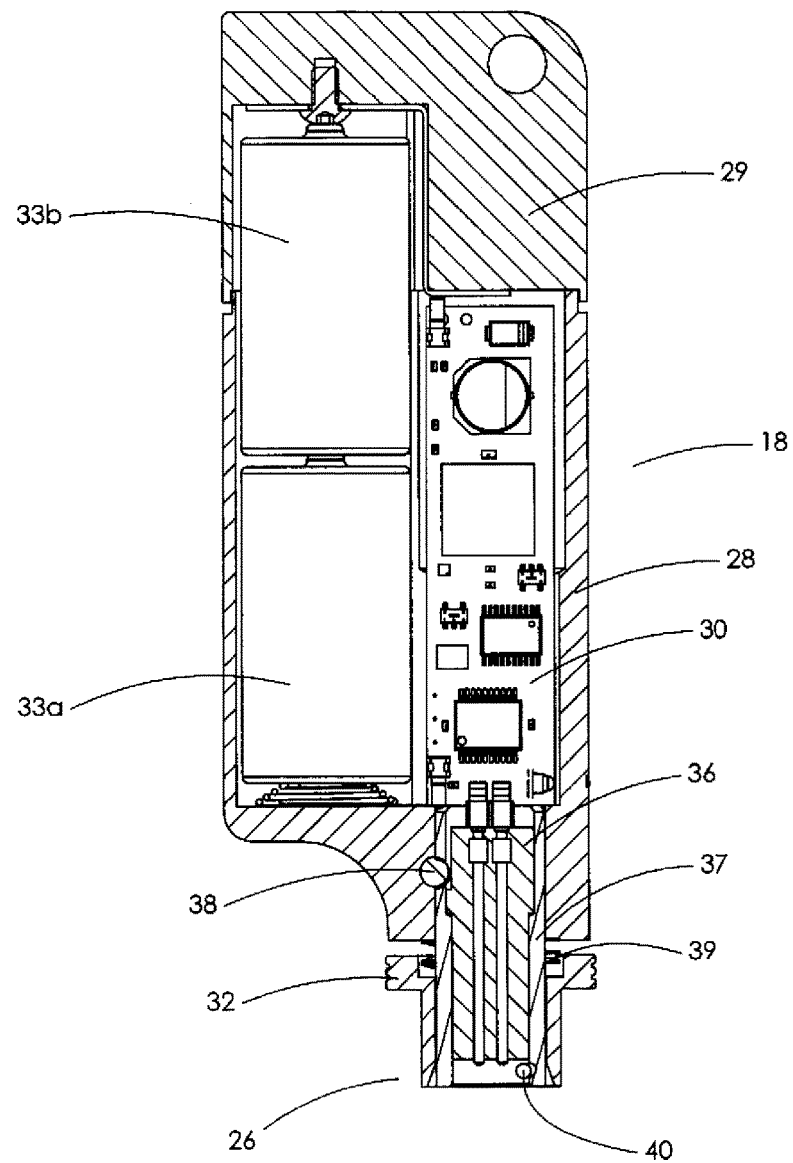
FIG. 12 is an elevational view, in section, of an electronic key in accord with one possible embodiment of the present invention.

Referring to FIG. 11 showing an example embodiment key 18. The key has a key body portion 27 and a lock engaging portion 26. FIG. 12 shows a cross-sectional view of an example embodiment key 18. The key body portion 27 has a lower body portion 28 and an upper body portion 29 which are held together by screws 31a and 31b as shown in FIG. 5. When assembled the upper body portion and lower body portion contain key control circuit 30, power supply 33a and 33b which in the current embodiment are two batteries connected in series. Batteries 33a and 33b are in electrical contact with key control circuit 30 and provide power through standard battery contacts. This power is for the key control circuit operation as well as power that is supplied to the barrel lock when it is operated. While the exemplary embodiments presented herein of the lock are is powered by the key with no battery in the lock, alternate embodiments may include a battery, and/or power from the locking hardware such as the utility box.

Referring to FIGS. 12 and 13, the lock engaging portion 26 comprises collar portion 32, which is mounted on tubular portion 37 and is free to slide. Spring 39 bears against the collar portion and forces it into contact with pin 40 which retains the collar portion on tubular portion 37. Additional aspects of the function of these elements will be described below. Retaining pin 38 is inserted into hole 41 in lower body portion 28 and interacts with groove 42 in tubular portion 37 to retain it. Insulator 36 is positioned coaxially inside tubular portion 37 and supports electrical contact pins 20a, 20b, 20c, and 20d and insulates them from each other. The electrical contact pins 20a, 20b, 20c, and 20d make contact with pins 35 on key control circuit 30 and transmit signals and power from the key control circuit to the lock.

Referring to FIGS. 13,19, 36a, 36b, 36c1, 36c2, and 36c3, moveable pin key 880 grips lock end cap 882 by inserting moveable pin 886 into end cap groove 883. The lock has a radial direction generally perpendicular to its longitudinal axis and comprises an interface for the key comprising a recess (in this embodiment, a groove 883) formed generally in the radial direction for gripping of the lock by the key. In the present embodiment the recess is formed inward toward the longitudinal axis. In other embodiments the groove is formed outward, away from the longitudinal axis, such as the groove 834 shown in FIG. 38b. In still further embodiments the groove is continuous while in even further embodiments the groove is discontinuous. Moveable pin 886 is urged into and held in position by pin driver ramp 887 that translates along axis and presses against end one and two of moveable pin 886.

Figure 36A:
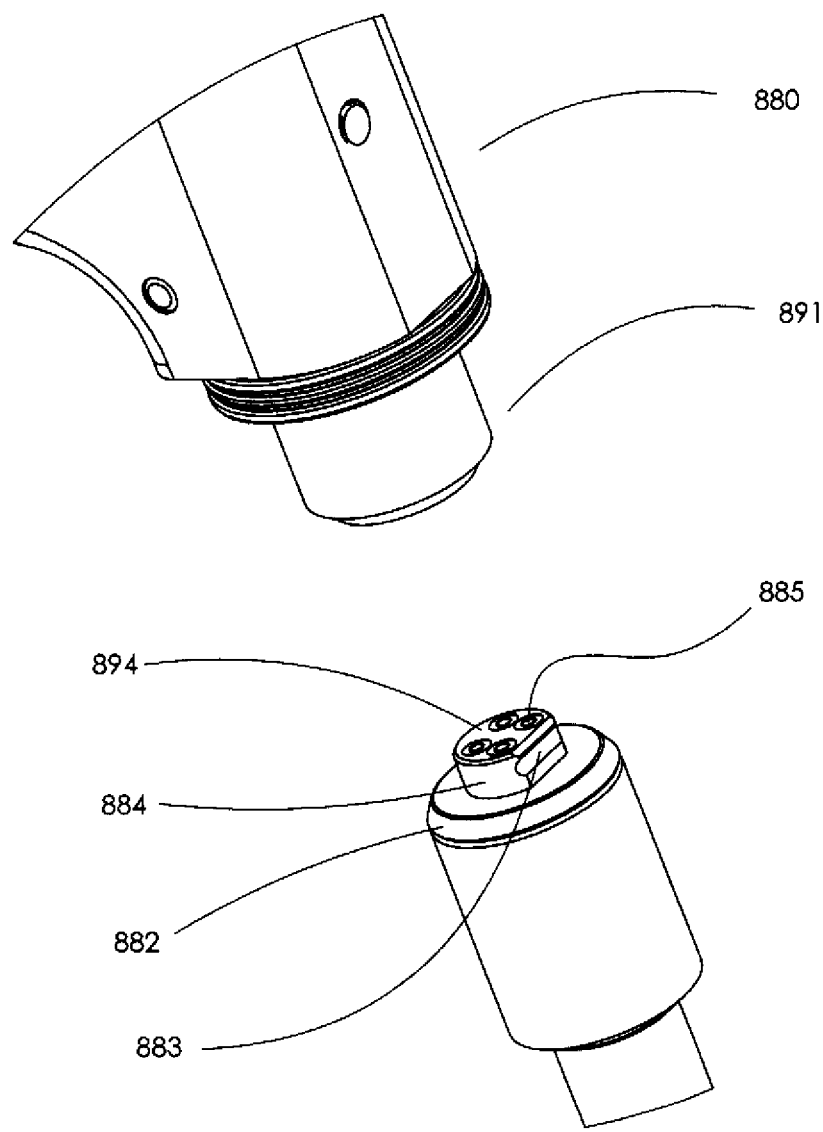
FIG. 36a is a perspective view of a moveable bar interface of key and lock in accord with one possible embodiment of the invention.
Figure 36B:
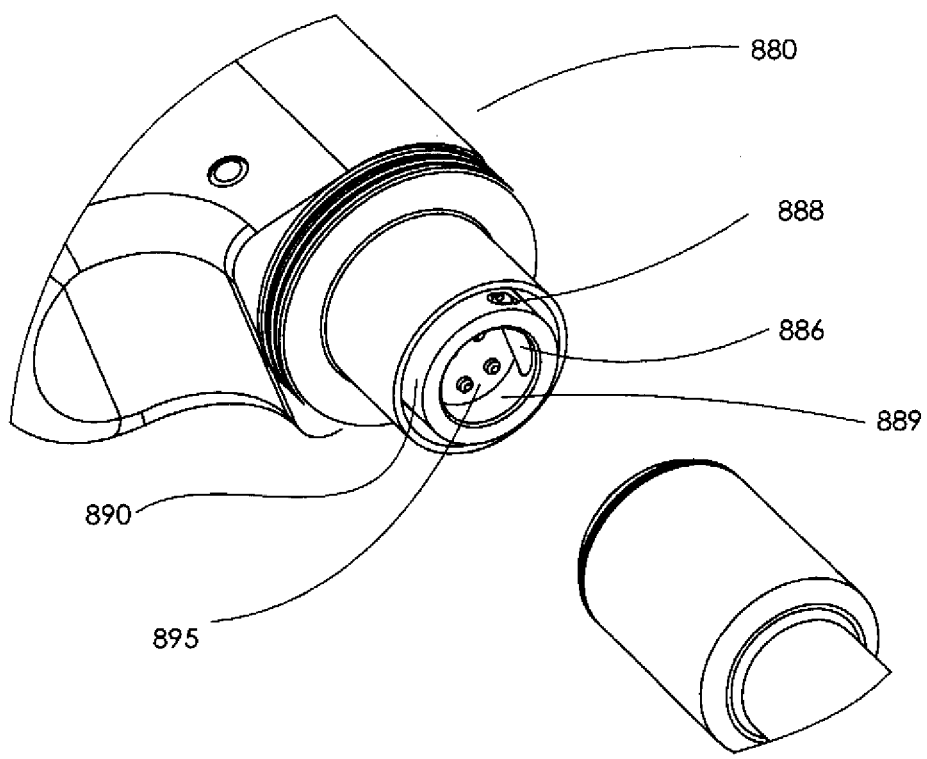
FIG. 36b is a perspective view of a moveable bar interface of key and lock in accord with one possible embodiment of the invention.

The process of inserting and gripping the lock end cap 882 begins as shown in FIG. 36c1 (see also FIGS. 36a and 36c2 and 36c3) with cylindrical protrusion 884 entering into the key tubular alignment recess 889 which defines axis 881 to accomplish alignment along axis 881. By lightly forcing the key further on the end cap 882, the first and second ends of the moveable pin 886 bears on the pin driver ramp 887 causing the key collar 891 to retract away from the end cap as the moveable pin translate within the tracking slot 888. The user rotates the key about the axis 881 to find alignment of lock alignment ramp 893 with moveable pin 886 which can be felt by providing light pressure of key against lock and when alignment is found key slides toward end cap 882 as shown in FIG. 36c2 and stops when end cap stop surface 894 and key stop surface 895 come into contact as shown in FIG. 36c3 and the tracking slot 888 and end cap groove 883 are then positioned so that the moveable pin 886 can enter the end cap groove 883. The collar which is urged forward by a biasing spring 39 cams the moveable pin 886 ends one and two against pin driver ramp 887 and thus pushing the moveable pin 886 into the end cap groove 883. Key contact pins 892 and lock contact pins 885 are in positional alignment and compressive contact to ensure good performance. The key has a firm grip on lock for pulling lock out of locking hardware. To disengage, the user simply pulls the collar 891 away from lock end cap 882 and as it translates along the axis 881, the moveable pin is freed to move in tracking slot 888 to disengage and release lock.

Figure 37A:
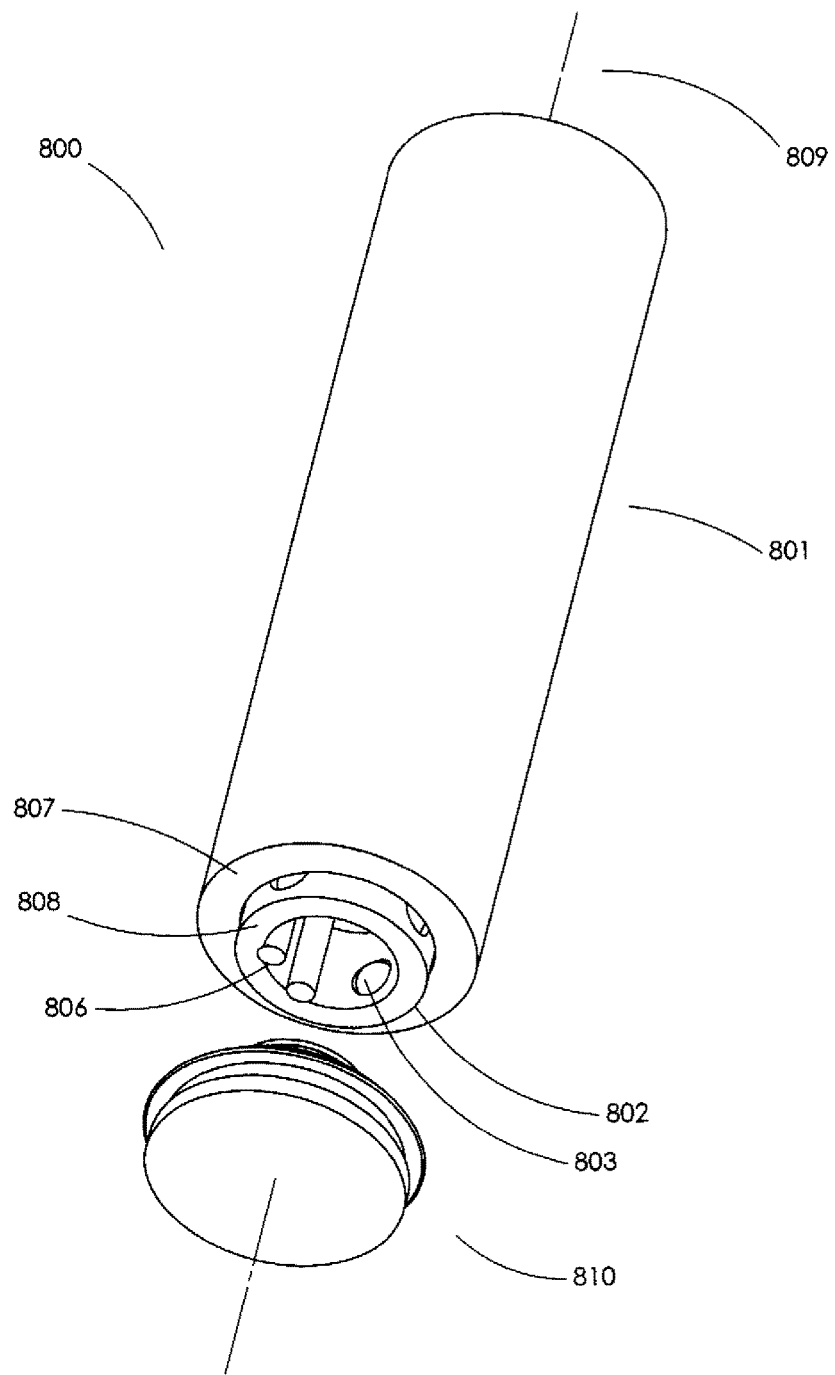
FIG. 37a is an isometric view of the ball gripper key and end cap prior to engagement in accord with one possible embodiment of the invention.
Figure 37B:
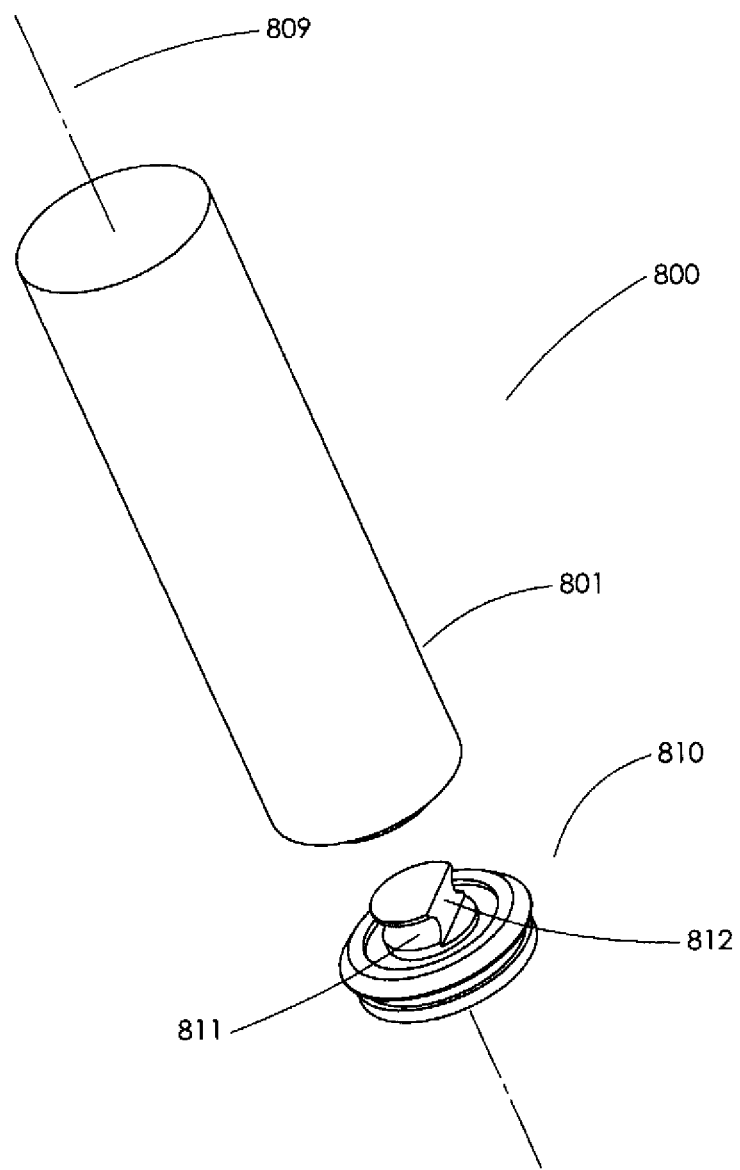
FIG. 37b is an isometric view of the ball gripper key and end cap prior to engagement in accord with one possible embodiment of the invention.

As shown in FIG. 37a and FIG. 37b, one possible embodiment includes a ball gripper key 800 and an end cap 810. In the current embodiment the ball gripper key 800 utilizes ball grippers 803 to interact with a groove 811 in the end cap 810.

The ball gripper key 800 includes an outer driver sleeve 801, inner sleeve 802, ball grippers 803 and alignment pins 806. The ball grippers 803 move radially with respect to the axis 809. The outer driver sleeve 801 and the inner sleeve 802 move relative to each other along the axis 809.

Figure 37C:
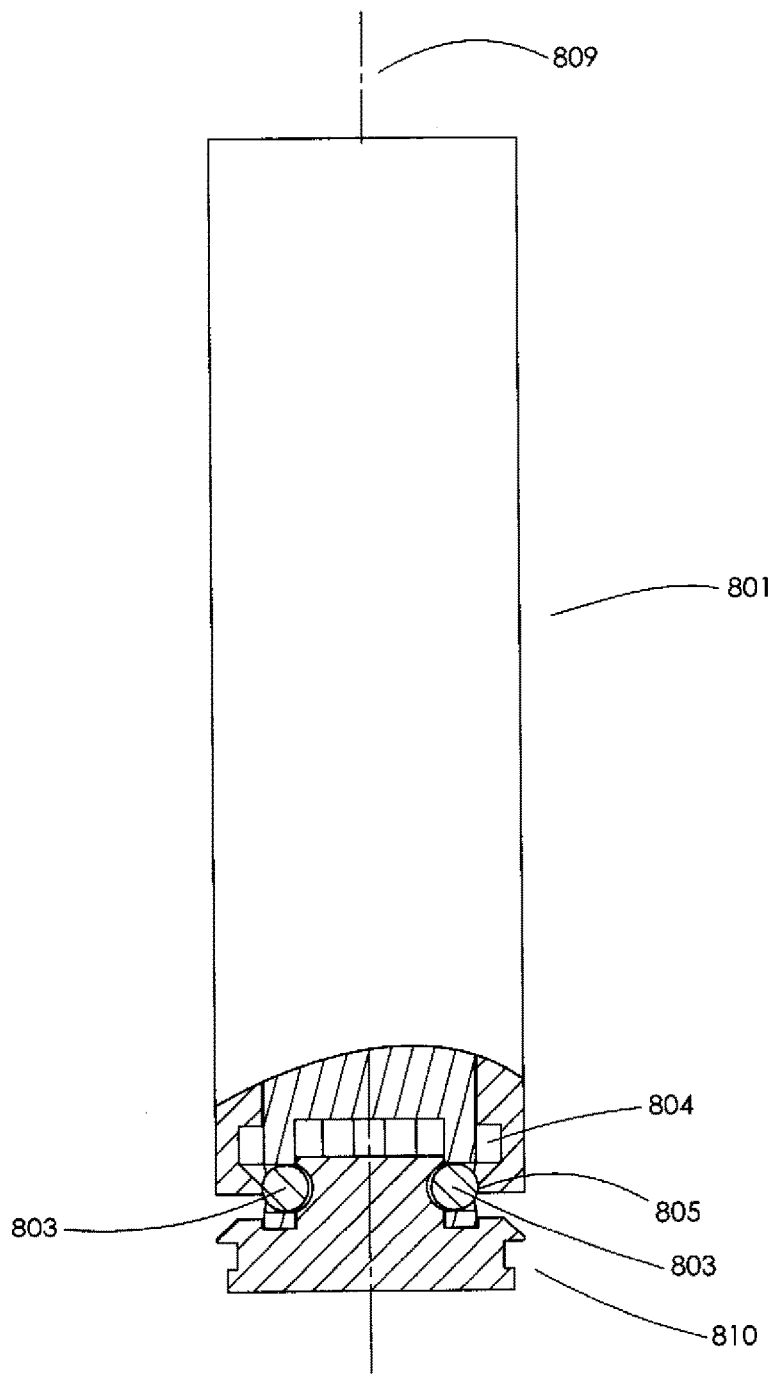
FIG. 37c is an elevational view, with a break out section view, showing ball gripper key and end cap engagement in accord with one possible embodiment of the invention.

The position of the ball grippers 803 in the inner sleeve 802 is controlled by the drive surface 805 (FIG. 37c) and undercut 804 in the outer driver sleeve 801. When the outer driver sleeve disengage surface 807 and the inner sleeve disengage surface 808 are coplanar the ball grippers shift into the outer driver sleeve undercut 804 in the outer driver sleeve 801 and let the key mate with the end cap 810. Upon retraction of the outer driver sleeve 801 along the axis 809 as shown in the FIG. 37c, the outer driver sleeve drive surface 805 shifts the ball grippers to interface with the groove 811 in the end cap 810 to grip it. The alignment pins 806 in the inner sleeve 808 mate with the alignment surface 812 in the end cap 810 to maintain any necessary orientation. In an alternate embodiment the key can be designed to mate with an internal groove in the end cap.

Figure 38A:
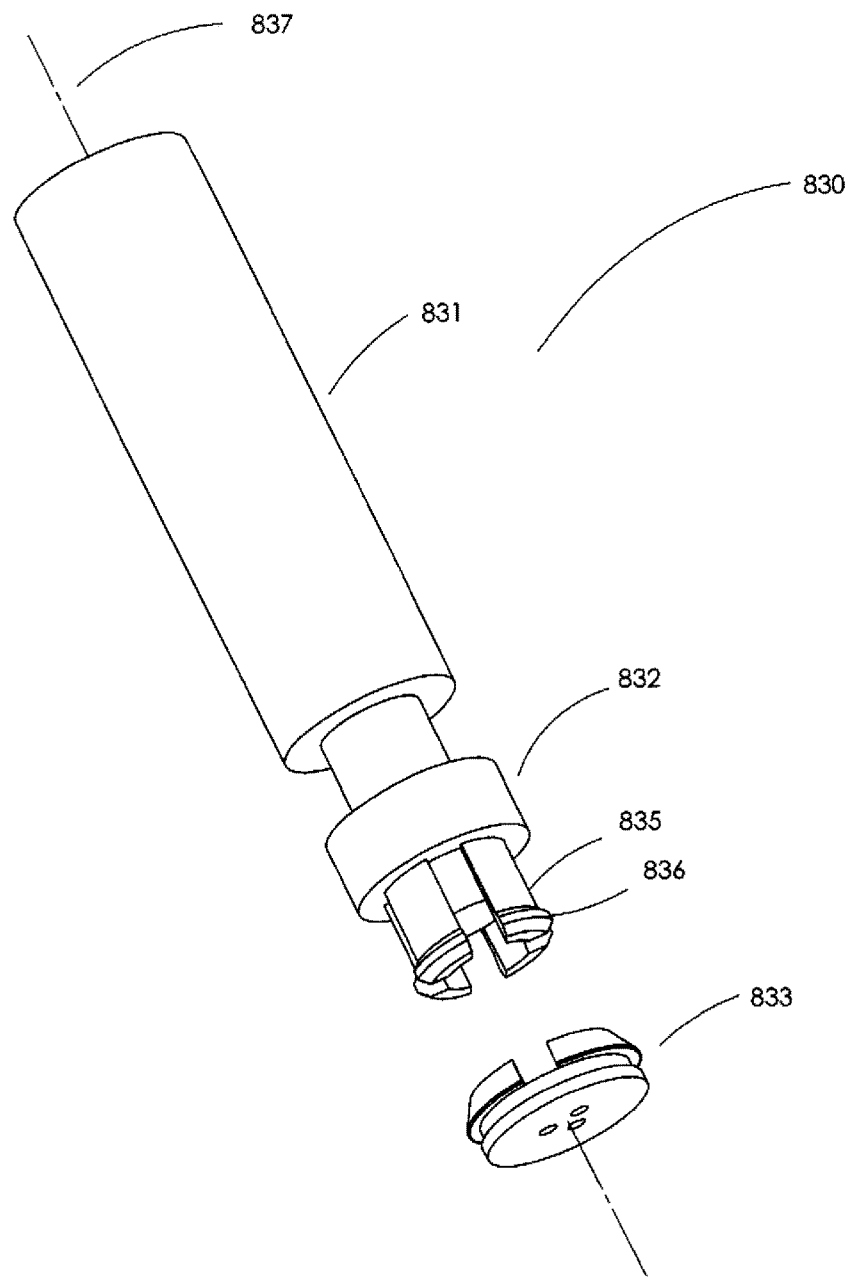
FIG. 38a is an isometric view of a male collet key and the end cap prior to engagement in accord with one possible embodiment of the invention.
Figure 38B:
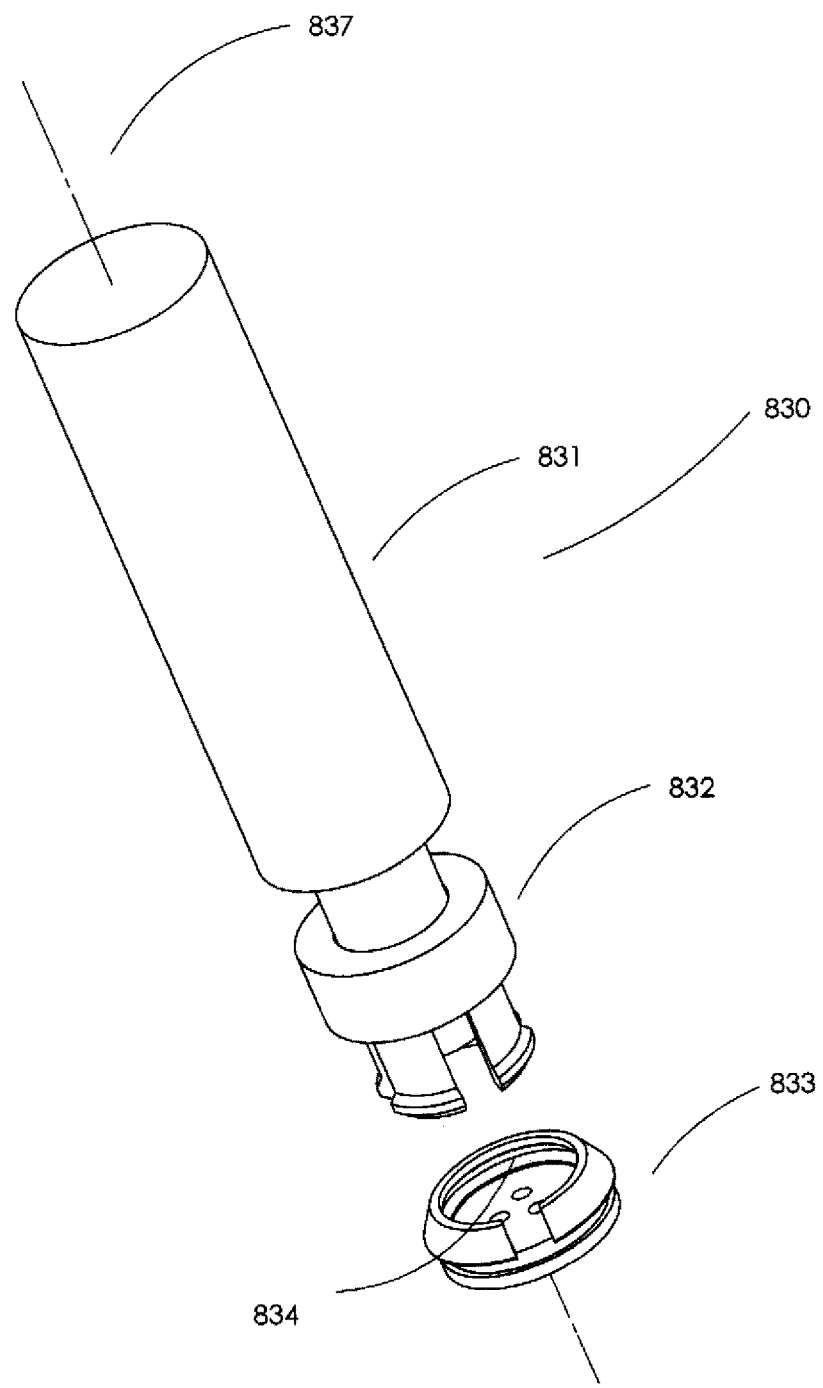
FIG. 38b is an isometric view of a male collet key and the end cap prior to engagement in accord with one possible embodiment of the invention.

As shown in FIG. 38a and FIG. 38b, an embodiment can include a male collet key 830 and an end cap 833. This key embodiment utilizes collets to grip the end cap 833. Male collet key 830 includes a driving member 831 and a collet member 832. The collet fingers 835 move radially with respect to the axis 837. The driving member 831 and the collet member 832 move relative to each other along the axis 837.

Figure 38C:
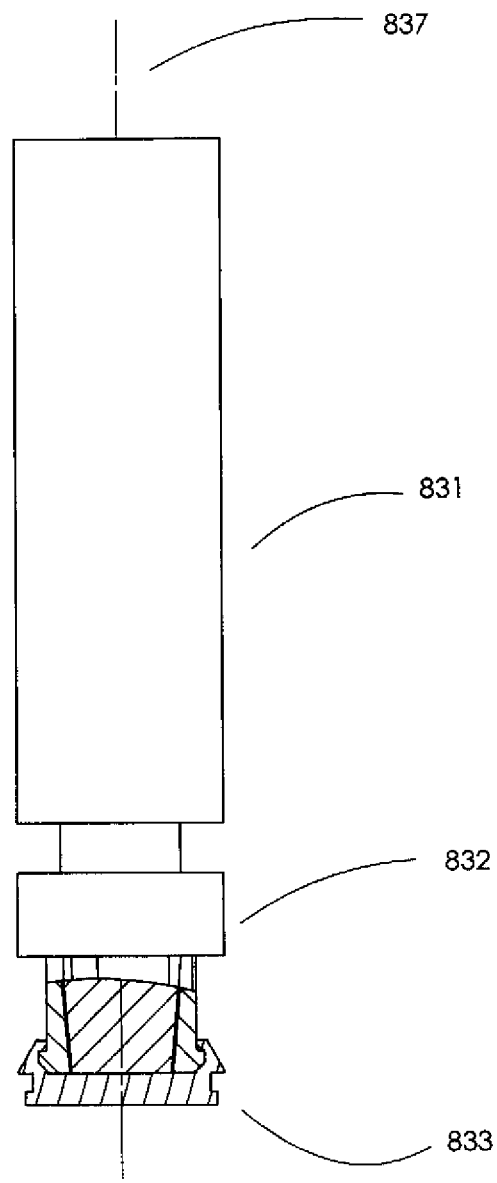
FIG. 38c is an elevational view, with a break out section view, showing a male collet key and end cap engagement in accord with one possible embodiment of the invention.

As shown in FIG. 38a and FIG. 38b, in the disengaged position the driving member 831 is recessed back in the collet member 832. This accommodates the radial displacement of the collet fingers 835. The radial displacement of the collet fingers 835 enables the engagement of the collet engagement surface 836 with the end cap groove 834. As shown in the FIG. 38c, the driving member 831 moves axially into the collet member 832 restricting the movement of the collet fingers 835 radially to prevent the disengagement with the end cap 833 and thus grip it.

Figure 39A:
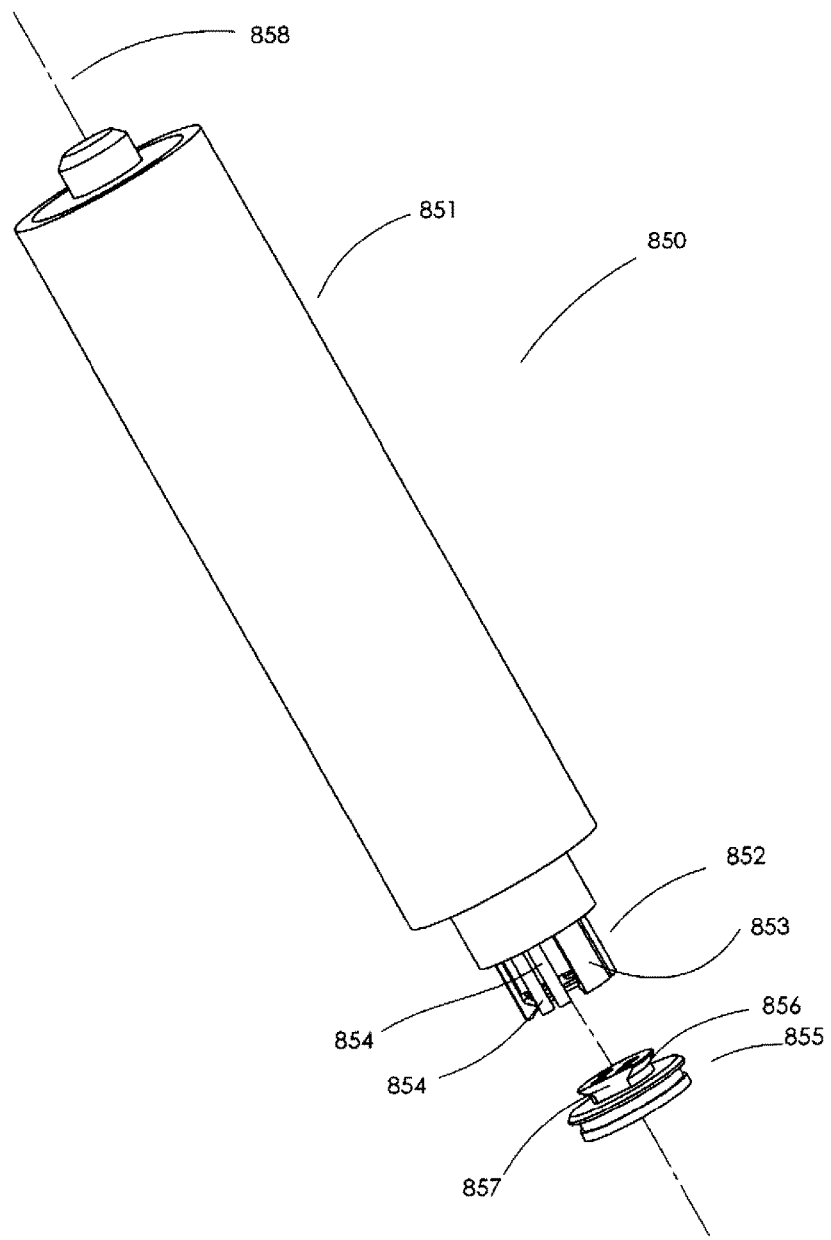
FIG. 39a is an isometric view of a female collet key and the end cap prior to engagement in accord with one possible embodiment of the invention.
Figure 39B:
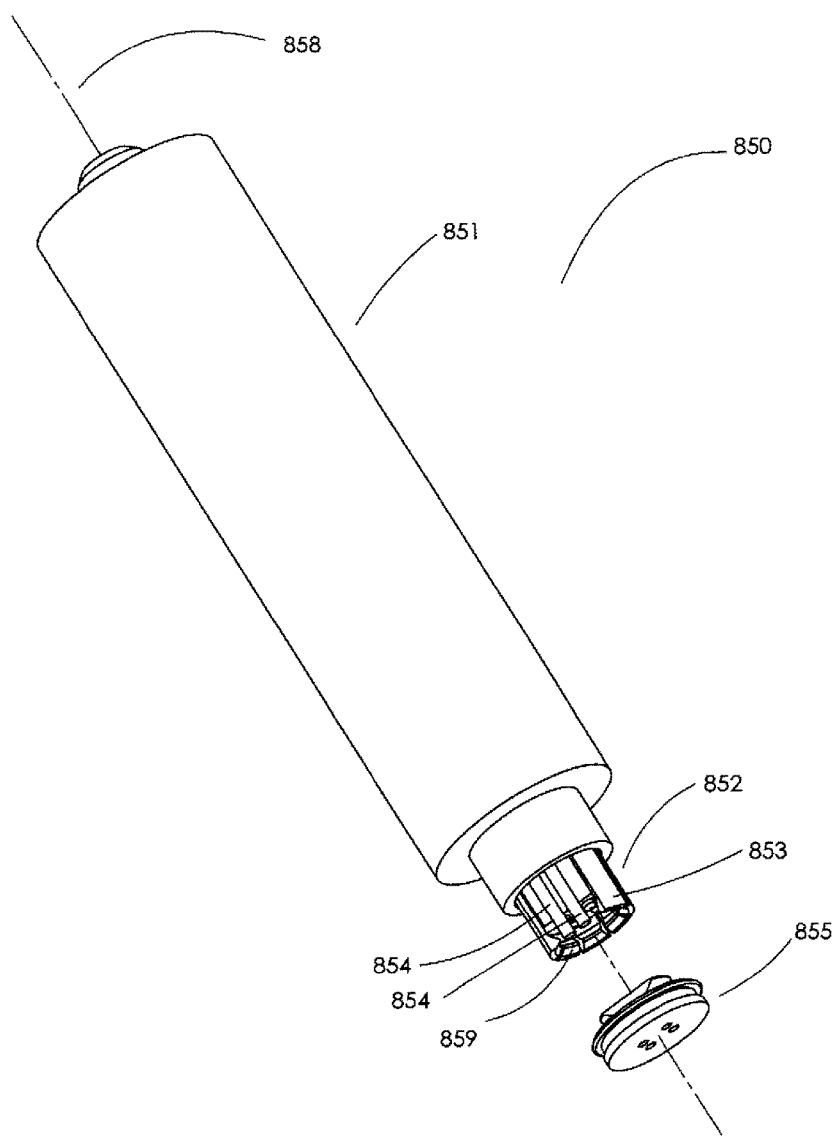
FIG. 39b is an isometric view of the female collet key and the end cap prior to engagement in accord with one possible embodiment of the invention.

As shown in FIG. 39a and FIG. 39b, yet another embodiment includes a female collet key 850 and an end cap 855. This key embodiment utilizes collets to grip the end cap 855. Female collet key 850 includes a constraining member 851 and a collet member 852. The collet fingers 853 move radially with respect to the axis 858. The constraining member 851 and the collet member 852 move relative to each other along the axis 858.

Figure 39C:
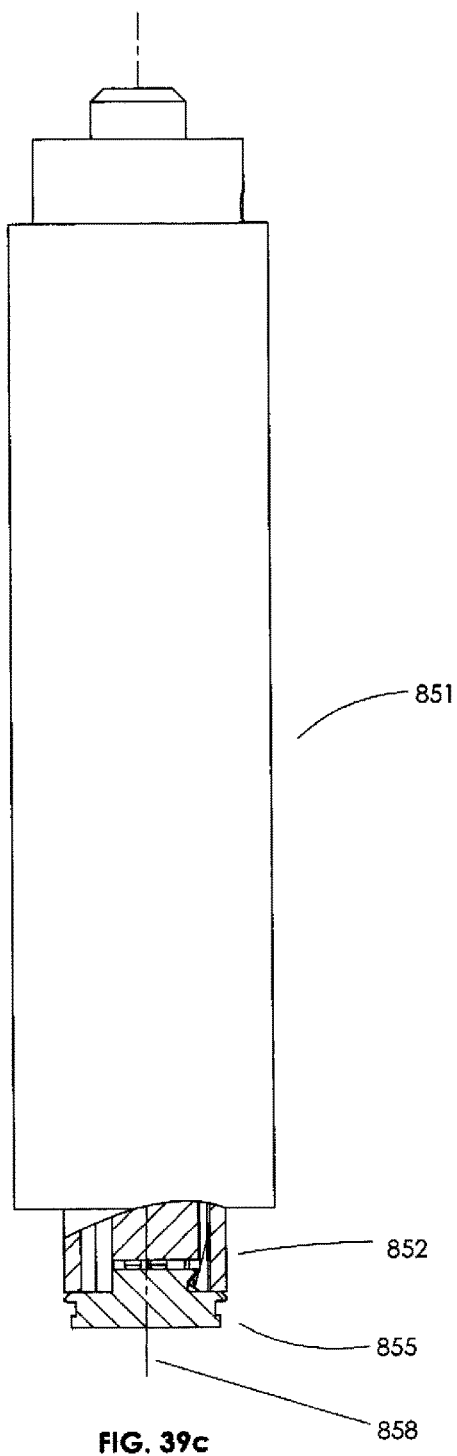
FIG. 39c is an elevational view, with a break out section view, showing a female collet key and end cap engagement in accord with one possible embodiment of the invention.

As shown in FIG. 39a and FIG. 39b, in the disengaged position the constraining member 851 is recessed back axially from the distal end of the collet member 852. This accommodates the radial displacement of the collet fingers 853. The radial displacement of the collet fingers 853 enables the engagement of the collet engagement surface 859 with the groove 856 of the end cap 855. As shown in the FIG. 39c, the constraining member 851 envelopes the collet member 852 in engaged position restricting the movement of the collet fingers 853 radially to prevent the disengagement with the end cap 855 and thus grip it. The alignment pins 854 in the collet member mate with the alignment surface 857 in the end cap 855 to maintain any necessary orientation.

Figure 40A:
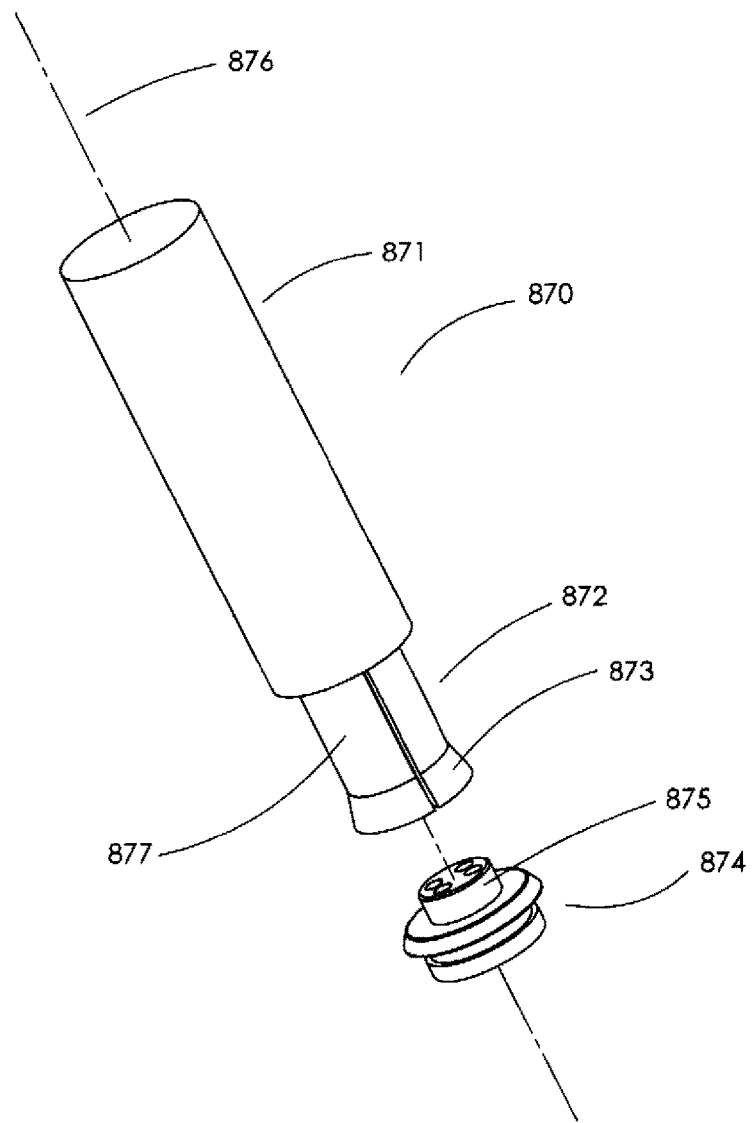
FIG. 40a is an isometric view of a friction gripping key and the end cap prior to engagement in accord with one possible embodiment of the invention.
Figure 40B:
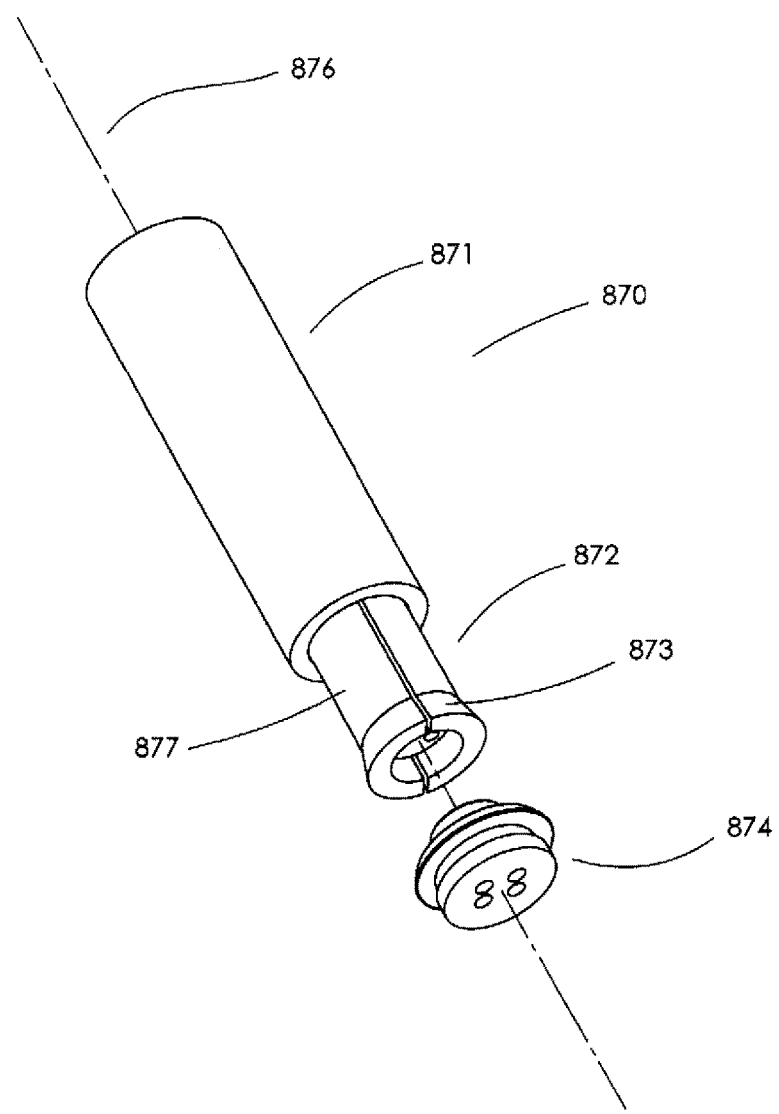
FIG. 40b is an isometric view of a friction gripping key and the end cap prior to engagement in accord with one possible embodiment of the invention.

As shown in FIG. 40a and FIG. 40b, the current embodiment includes a friction gripping key 870 and an end cap 874. The current key embodiment utilizes friction to grip the end cap 874.

The friction gripping key 870 includes a driver 871 and a gripper 872. The driver 871 and the gripper 872 move relative to each other along the axis 876. The gripping fingers 877 move radially with respect to the axis 876 which enables the opportunity of gripping the end cap 874 using friction.

Figure 40C:
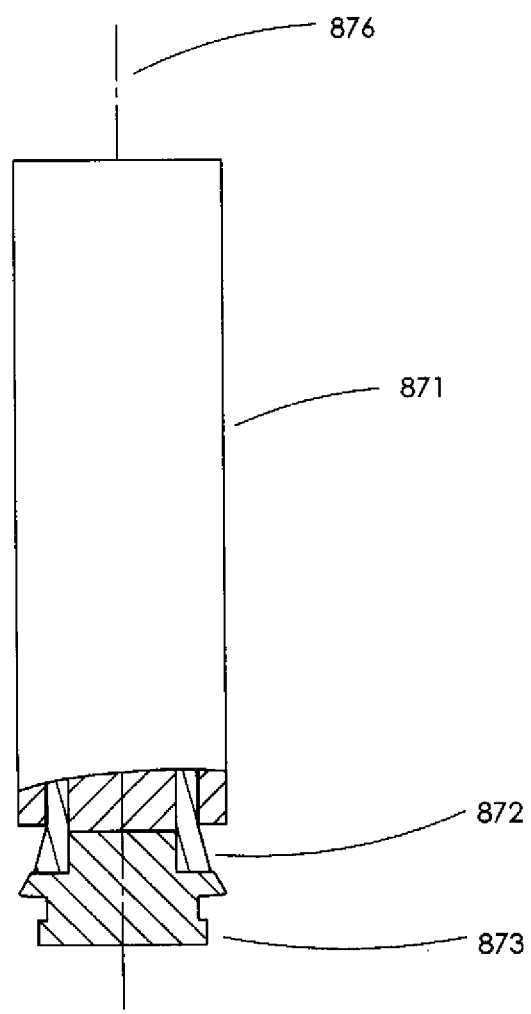
FIG. 40c is a break out section view of the friction gripping key and end cap engagement in accord with one possible embodiment of the invention.

As shown in FIG. 40a and FIG. 40b, in the disengaged position the driver 871 is recessed back around the gripper 872. As shown in FIG. 40c, in the engaged position the driver 871 moves relative to the gripper 872 and rides over the gripper taper 873 causing the gripping fingers 877 to move radially inward to make a frictional contact with the end cap gripping surface 875 and thus grip the end cap 874.

In an alternate embodiment, magnetic force can be used to grip the end cap. The gripper component of the key can be a magnetic material such as rare earth magnet and the end cap can be made out of a ferrous material such as low carbon steel. Since low carbon steel is attracted to magnetic field it aids in the gripping of the end cap.

All the above key gripping component embodiments are generally made out of tough materials such as stainless steel or tool steel unless stated otherwise.

Figure 41:
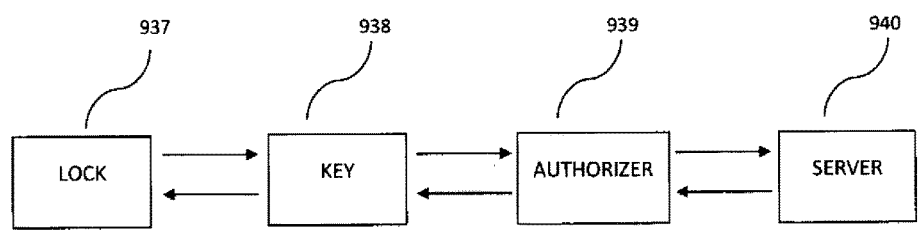
FIG. 41 shows a schematic of a system communications system in accord with one possible embodiment of the invention.

FIG. 41 shows a block diagram of an example embodiment of the communication between a lock 937, key 938, authorizer 939 and server 940. All devices communicate bi-directionally using a request/response message binary protocol. Messages have a header and body. The header allows for validation of the message integrity and requesting retransmission of a message. The body contains a payload that varies depending on the purpose of the request or response.

Referring to FIG. 4, the example embodiment authorizer 23 is a means of communicating with an example embodiment key 18, a user interface 25 and a means of communicating with a server such as an Ethernet port.

Authorizer port 24 is constructed to mate with key 18 in the same manner as it mates with lock 1 as described in detail herein. Contact pins of key 20a, 20b, 20c and 20d (see FIG. 13) align and contact with authorizer contact pins 34a, 34b, 34c and 34d in authorizer port 24 to enable communication with server 940.

Referring to FIG. 41 example authorizer 939 and server 940 communicate messages (as noted below) over the Internet using the HTTP/1.1 protocol as specified by RFC 2616. The body of the HTTP message contains encrypted messages conforming to the binary communication protocol.

The authorizer 939 comprises the functions: gathering user identification data through a human interface 25, transmitting identifying data, encapsulating and relaying of data from the key 18 to the server 940, and presenting feedback from the server to the user through a human interface 25.

Figure 35A:
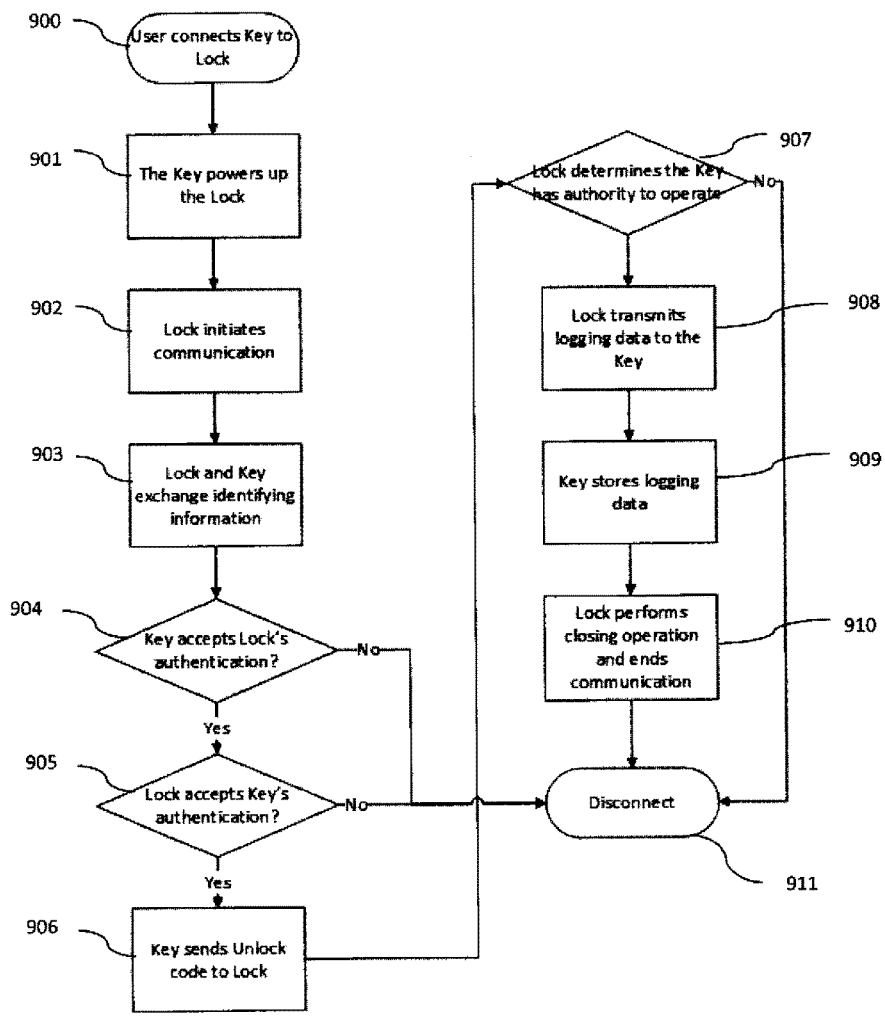
FIG. 35a is a flow chart for interaction of an electronic key with an electronic lock in accord with one possible embodiment of the present invention.
Figure 35B:
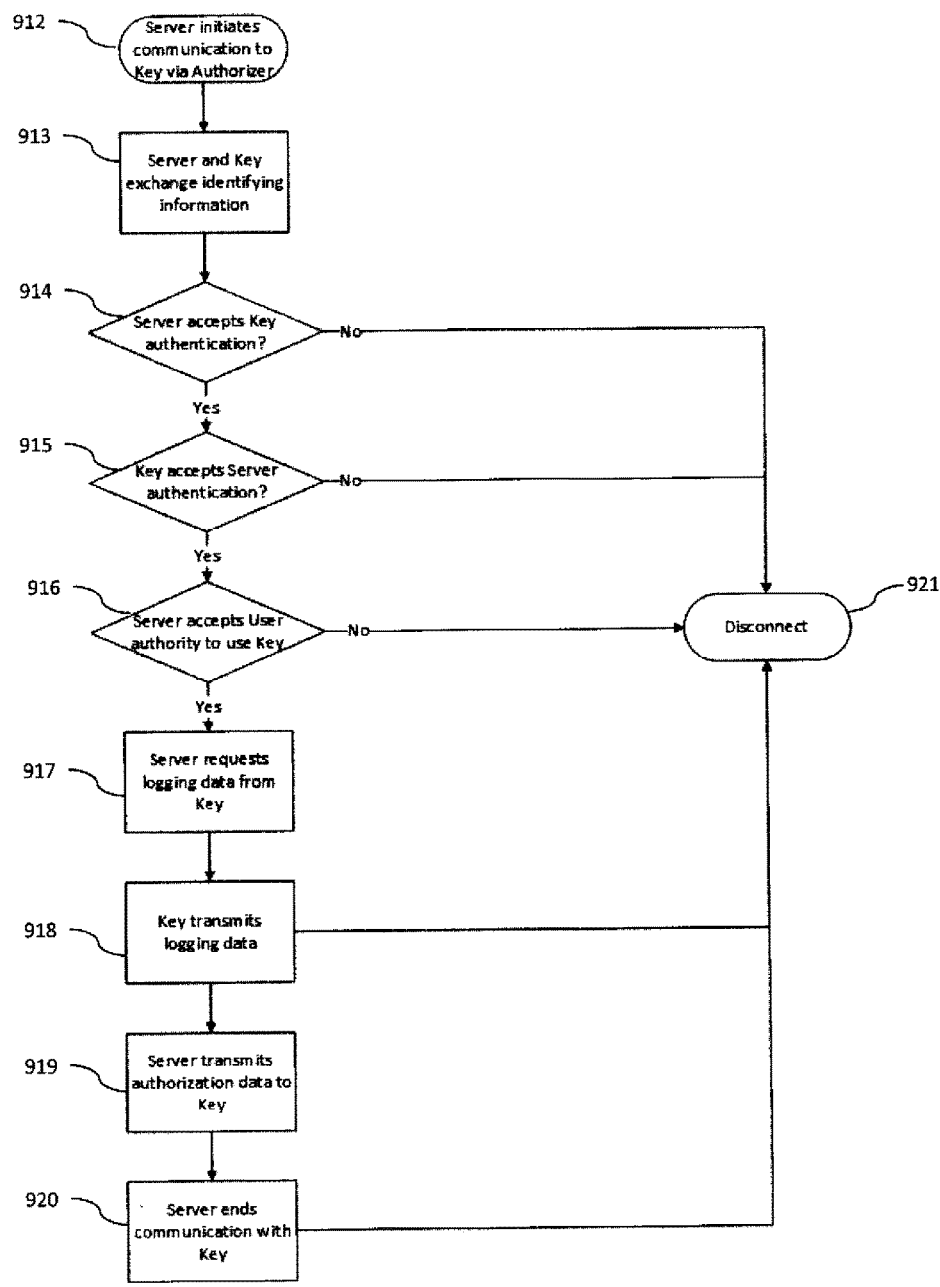
FIG. 35b is a flow chart for interaction of an electronic key with an authorizer and server in accord with one possible embodiment of the present invention.
Figure 35C:
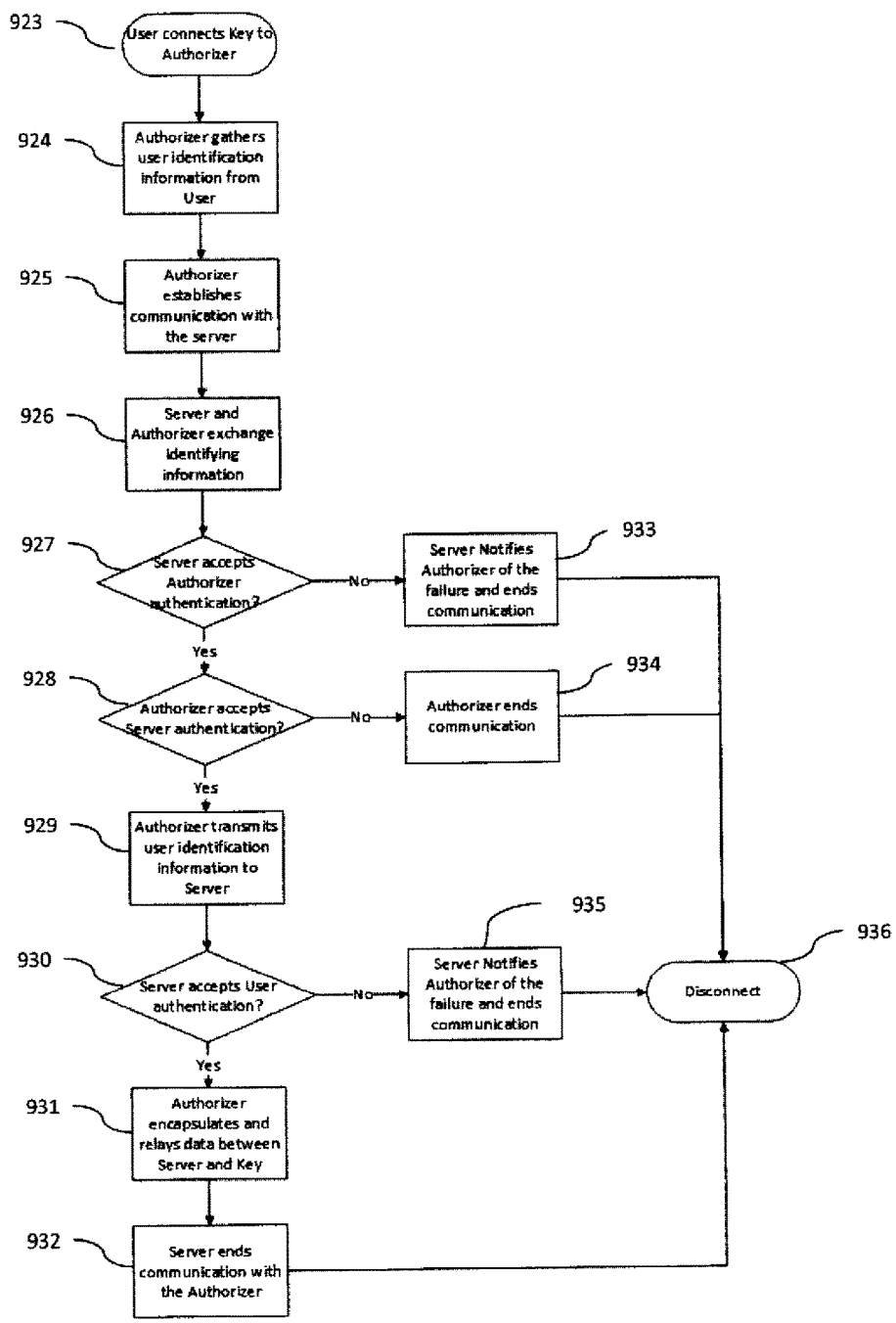
FIG. 35c is a flow chart for interaction of an authorizer and server in accord with one possible embodiment of the present invention.

Referring now to FIG. 35c, the authorizer and Server communication is as follows. A user connects a key 18 to an authorizer 23 as shown in FIG. 5 and the authorizer establishes communication with the key. This step is illustrated in FIG. 35c at 923. Then the Authorizer gathers user identification information 924 from user via a human interface. The authorizer initiates communication to the server 925 by sending its authentication information 926. If the server rejects the authorizer, it notifies the authorizer and ends communication 933. Otherwise, the server sends its authentication information to the authorizer. If the authorizer rejects the server, it ends communication 934. Otherwise, the authorizer transmits the user identification information to server 929. If the server rejects the user, it notifies the authorizer 935 and ends communication 936. Otherwise, the server notifies the authorizer of acceptance. Then the authorizer encapsulates and relays data between the server and key 931 until it received a message from the server to end communication 932. Then it ends communication 936.

Referring to FIG. 35a showing a schematic of an example embodiment key and lock communication sequence. The key and lock communication involves the functions: mutual authentication of the lock and key 904 and 905, transmitting identifying data 903, verifying the key's authority to operate a lock 907, transmitting logging data 908 gathered by the lock to the key, and transmitting operating commands from the key to the lock 906.

The key and lock communication is as follows. The key powers up the lock 901. The lock initiates communication by sending its authentication information 902. If the key rejects the lock 904, it ends communication 911. Otherwise, the key sends its authentication information to the lock 903 and the lock records information about the key and the time and date of the communication. If the lock rejects the key 904, it ends communication 911. Otherwise, the lock communicates confirmation to the key and the key transmits the unlock code to the lock 906. Next, the lock determines if the key has the authority to operate it 907. If it does not have authority, the lock ends communication 911. If the key has authority, the key requests logging data from the lock and the lock sends logging data to the key 908. The key stores the logging data 909 and sends the unlock code to the lock. If the lock rejects the unlock code, it notifies the key and ends communication. Otherwise, the lock activates and opens. When the lock's activation is complete, it notifies the key and ends communication.

Referring to FIG. 35b showing a schematic of an example embodiment key and authorizer communication sequence. The key and authorizer communication involves the functions: mutual authentication of the key and authorizer, transmitting identifying data, and relaying data between the key and the server via the authorizer.

Figure 35D:
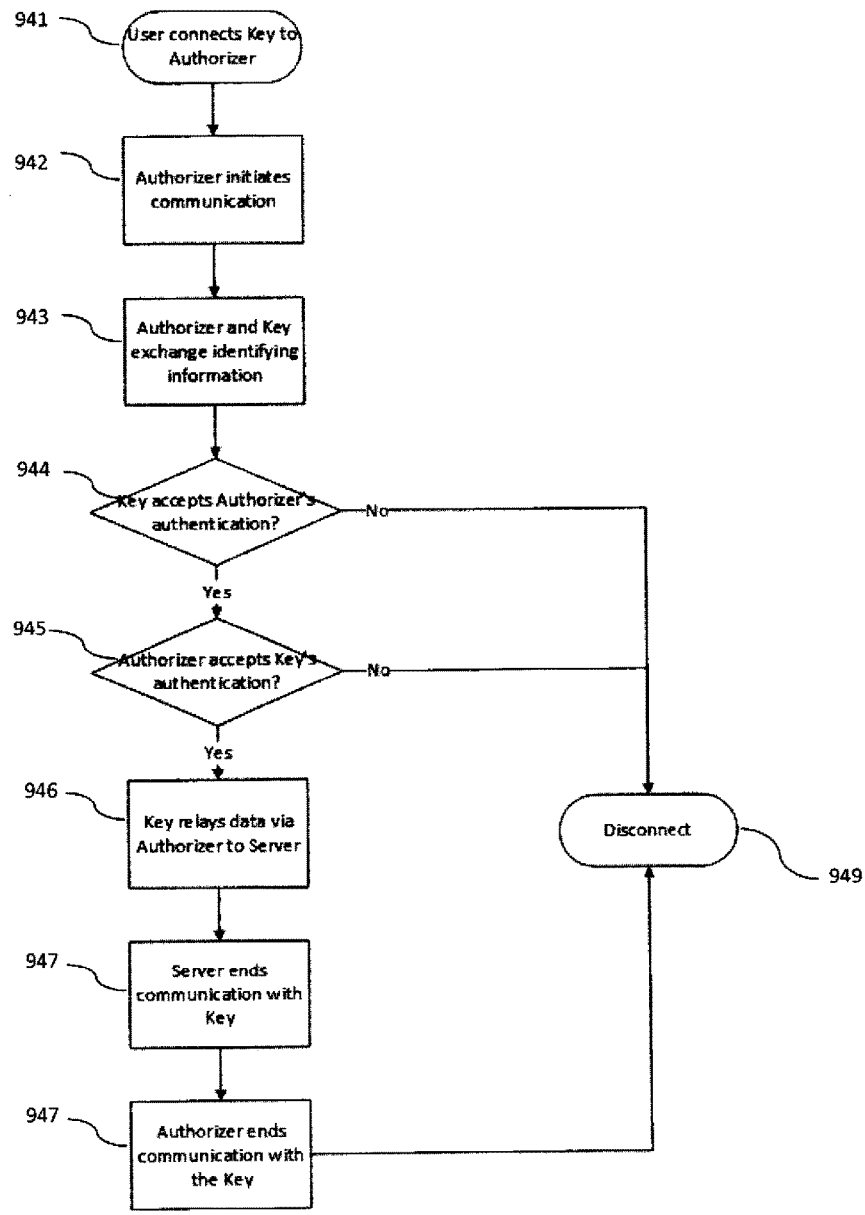
FIG. 35d is a flow chart for interaction of an electronic key with an authorizer and server in accord with one possible embodiment of the present invention.

Referring to FIG. 35d, the key and authorizer communication is as follows. A user connects a key 18 to an authorizer 23 as shown in FIG. 5 and the authorizer establishes communication with the key 941. The authorizer initiates communication by sending its authentication information 942. If the key rejects the authorizer, it ends communication. Otherwise, the key sends its authentication information 944. If the authorizer rejects the key, it ends communication. Otherwise, the authorizer communications acceptance to the key. Then the authorizer relays data between the server and key 946. After the key ends communication with the server, it ends communication with the authorizer 947 and 948.

Referring to FIG. 35c showing a schematic of an example embodiment key and server. The key and server communication involves the functions: mutual authentication of the key and server, transmitting identifying data, transmitting logging data from key to the server, and transmitting of authorization data from the server to the key.

Pertaining to the authorization data transmitted from the server to the key, the communication comprises of data required by the key to verify the key's authority to operate a lock, and limits to the key's usage. Limits to the key's usage include time of day, total operations, and time in service.

Referring now to FIG. 35b, the key and server communication is as follows. The key and server communicate via the authorizer 912. The server initiates communication by sending its authentication information 913. If the server rejects the key, it ends communication 914. If the key rejects the server, it ends communication 915. If the server rejects the user's authority to use the key, it ends communication 916. Otherwise, the server requests logging data from the key 917. The key transmits logging data to the server 918. The server stores the data, then sends the authorization data to the key 919. The key indicates success. Then the server closes communication 920.

Referring to FIG. 41, the server 940 is a central database that contains data pertaining to all locks, keys, and authorizers, a means of communicating with an authorizer 939, and a means of communicating with a key 938 via the authorizer 939.

In one example embodiment, the server communicates with the authorizer over the Internet. The server maybe a remote server, a local server, or any other device that is capable of communicating with the authorizer. Other example embodiments use infra-red communication between the authorizer and server while still other embodiments use a radio frequency communication link between the two devices. The foregoing description of the preferred embodiments of the invention has been presented for purposes of illustration and description only. It is not intended to be exhaustive nor to limit the invention to the precise form disclosed; and obviously many modifications and variations are possible in light of the above teaching. Such modifications and variations that may be apparent to a person skilled in the art are intended to be included within the scope of this invention as defined by the accompanying claims.

What is claimed is:

1. A barrel lock, comprising:
   a lock body comprising a head portion and a shank portion arranged along a longitudinal axis of the lock body, said head portion comprising a first radial extent that is larger than a second radial extent of said shank portion;
   an electrically controlled actuator disposed within said lock body, the electrically controlled actuator moveable between an unlocked position and a locked position;
   a control circuit disposed within said lock body and in electrical communication with the electrically controlled actuator;
   a movable retaining member that is radially extensible and retractable from said shank portion relative to said longitudinal axis;
   wherein:
   in response to receipt of a control signal from a key, said control circuit is configured to cause said electrically controlled actuator to move from the locked position to the unlocked position;
   said electrically controlled actuator maintaining at least partial radial extension of said movable retaining member when in the locked position and allowing radial retraction of said movable retaining member when in the unlocked position; and said head portion further comprises an end cap, said end cap comprising a key interface configured to couple with said key, said key interface comprising a protrusion along a longitudinal axis of the lock body and a recess that extends generally in a radial direction relative to said longitudinal axis of the lock body.

2. The barrel lock of claim 1, wherein said recess is configured to couple with said key.

3. The barrel lock of claim 2, wherein:

said end cap is configured to fit within a key recess formed within a collar of said key such that said key interface may be disposed within said key recess; and when said end cap is disposed within said key recess, said key interface couples with a moveable pin disposed within said key recess, said moveable pin being moveable relative to said key recess.

4. The barrel lock of claim 1, wherein said protrusion comprises an upper surface and a side defining a generally cylindrical shape, and said key interface comprises said recess formed in and extending about at least a portion of said side.

5. The barrel lock of claim 4, wherein said recess extends continuously around said protrusion.

6. The barrel lock of claim 1, wherein:

at least a portion of said end cap is configured to fit within a recess formed within a collar of said key such that said key interface is disposed within said recess; and when said key interface is disposed within said recess, said key interface couples with said key.

7. The barrel lock of claim 1, further comprising at least one electrical connection passing through said end cap, the at least one electrical connection being in electrical communication with the electrically controlled actuator.

8. The barrel lock of claim 1, further comprising locking hardware comprising an aperture for receiving the barrel lock, wherein the locking hardware is locked when the electrically controlled actuator is in the locked position.

9. The barrel lock of claim 1, wherein the electrically controlled actuator comprises a shape memory alloy.

10. The barrel lock of claim 9, and further comprising a shape memory alloy wire, wherein a fusible link is coupled to said shape memory alloy wire.

11. The barrel lock of claim 1, wherein the electrically controlled actuator comprises a solenoid.

12. The barrel lock of claim 1, wherein the electrically controlled actuator comprises a piezoelectric actuator.

13. The barrel lock of claim 1, wherein the electrically controlled actuator comprises a motor.

14. The barrel lock of claim 1, wherein the electrically controlled actuator comprises a screw.

15. The barrel lock of claim 14, wherein the screw is driven by an electric motor in communication with the control circuit.

16. The barrel lock of claim 1, wherein the electrically controlled actuator comprises a spur gear speed reducer.

17. The barrel lock of claim 1, wherein the electrically controlled actuator comprises a planetary gear speed reducer.

18. The barrel lock of claim 1, wherein the recess is formed in the end cap so as to foster gripping of the end cap by a key.

19. The barrel lock of claim 1, wherein the electrically controlled actuator is changed between the locked position to the unlocked position by rotating at least a part of the electrically controlled actuator relative to the retaining member.

20. The barrel lock of claim 1, wherein the control circuit is capable of receiving power from the key and of providing power to the actuator to change the electrically controlled actuator to the unlocked position.

21. A locking method, the method comprising:

providing a lock body comprising a head portion and a shank portion arranged along a longitudinal axis of the lock body, said head portion comprising a first radial extent that is larger than a second radial extent of said shank portion;

disposing an electrically controlled actuator within said lock body, said electrically controlled actuator being moveable between an unlocked position and a locked position;

disposing a control circuit within said lock body, said control circuit being in electrical communication with said electrically controlled actuator;

providing a movable retaining member that is radially extensible and retractable from said shank portion relative to said longitudinal axis, wherein in response to receipt of a control signal from a key, said control circuit is configured to cause said electrically controlled actuator to move from said locked position to said unlocked position, and wherein said electrically controlled actuator maintains at least partial radial extension of said movable retaining member when in the locked position and allows radial retraction of said movable retaining member when in the unlocked position;

providing said head portion further comprising an end cap, said end cap comprising a key interface configured to couple with said key, said key interface comprising a protrusion along a longitudinal axis of said lock body; and forming in said protrusion of said key interface a recess that extends generally in a radial direction relative to said longitudinal axis of said lock body.

* * * * *